United States Patent
Hashimoto et al.

(10) Patent No.: US 10,521,062 B2
(45) Date of Patent: Dec. 31, 2019

(54) FILM SENSOR MEMBER AND METHOD FOR MANUFACTURING SAME, CIRCULARLY POLARIZING PLATE AND METHOD FOR MANUFACTURING SAME, AND IMAGE DISPLAY DEVICE

(71) Applicant: ZEON CORPORATION, Chiyoda-ku, Tokyo (JP)

(72) Inventors: Hiromasa Hashimoto, Tokyo (JP); Kazuhiro Osato, Tokyo (JP); Takao Kobayashi, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 16/095,749

(22) PCT Filed: Apr. 21, 2017

(86) PCT No.: PCT/JP2017/016092
§ 371 (c)(1),
(2) Date: Oct. 23, 2018

(87) PCT Pub. No.: WO2017/188160
PCT Pub. Date: Nov. 2, 2017

(65) Prior Publication Data
US 2019/0310726 A1    Oct. 10, 2019

(30) Foreign Application Priority Data

Apr. 27, 2016    (JP) .................... 2016-089913

(51) Int. Cl.
*G06F 3/044*    (2006.01)
*G02B 5/30*    (2006.01)
(Continued)

(52) U.S. Cl.
CPC .............. *G06F 3/044* (2013.01); *G02B 5/30* (2013.01); *G02F 1/1333* (2013.01);
(Continued)

(58) Field of Classification Search
CPC . G06F 3/044; G06F 3/041; G09F 9/30; G09F 9/00; G02F 1/13363; G02F 1/1333;
(Continued)

(56) References Cited

U.S. PATENT DOCUMENTS 5,194,534 A    3/1993    Bell
5,296,519 A    3/1994    Otsuka
(Continued)

FOREIGN PATENT DOCUMENTS

JP    H05100114 A    4/1993
JP    H05345817 A    12/1993
(Continued)

OTHER PUBLICATIONS

Yugang Sun et al., "Polyol Synthesis of Uniform Silver Nanowires: A Plausible Growth Mechanism and the Supporting Evidence", Nano Letters, 2003, pp. 955-960, vol. 3, No. 7.
(Continued)

*Primary Examiner* — Jonathan A Boyd
(74) *Attorney, Agent, or Firm* — Kenja IP Law PC

(57) ABSTRACT

A film sensor member for disposing on a visually recognizing side of a linear polarizer in an image display device including the linear polarizer, the member including a transparent electroconductive layer, a λ/4 plate, and a λ/2 plate in this order from the visually recognizing side, wherein the λ/4 plate is formed of a first thermoplastic resin containing an amorphous polymer having a glass transition temperature of 150° C. or higher or a crystallizable polymer having a melting point of 250° C. or higher, the λ/2 plate includes, in this order, a first outer layer formed of a second thermo-
(Continued)

plastic resin, an intermediate layer formed of a third thermoplastic resin containing an ultraviolet absorber, and a second outer layer formed of a fourth thermoplastic resin, and the λ/2 plate has an NZ factor of 1.1 to 3.0.

13 Claims, 4 Drawing Sheets

(51) Int. Cl.
G02F 1/1333 (2006.01)
H01L 27/32 (2006.01)
H01L 51/50 (2006.01)
G06F 3/041 (2006.01)
H05B 33/02 (2006.01)
G02F 1/13363 (2006.01)
G09F 9/00 (2006.01)

(52) U.S. Cl.
CPC ...... G02F 1/13338 (2013.01); G02F 1/13363 (2013.01); G06F 3/041 (2013.01); G09F 9/00 (2013.01); H01L 27/323 (2013.01); H01L 51/50 (2013.01); H05B 33/02 (2013.01)

(58) Field of Classification Search
CPC ..... G02F 1/13338; H05B 33/02; H01L 51/50; H01L 27/323; G02B 5/30
See application file for complete search history.

(56) References Cited

U.S. PATENT DOCUMENTS

| | | | |
|---|---|---|---|
| 5,401,438 A | 3/1995 | Otsuka | |
| 5,523,027 A | 6/1996 | Otsuka | |
| 6,043,355 A | 3/2000 | Yashiro et al. | |
| 6,115,095 A | 9/2000 | Suzuki et al. | |
| 6,361,838 B1 * | 3/2002 | Miyatake | C09K 19/3852 |
| | | | 428/1.3 |
| 7,030,860 B1 | 4/2006 | Hsu et al. | |
| 9,158,143 B2 | 10/2015 | Chen et al. | |
| 2002/0015314 A1 * | 2/2002 | Umemoto | G02B 6/0038 |
| | | | 362/561 |
| 2003/0067574 A1 | 4/2003 | Sasaki et al. | |
| 2004/0212767 A1 | 10/2004 | Sasaki et al. | |
| 2005/0151896 A1 * | 7/2005 | Hara | G02B 5/3016 |
| | | | 349/96 |
| 2008/0204633 A1 | 8/2008 | Jeon et al. | |
| 2008/0309635 A1 | 12/2008 | Matsuo | |
| 2009/0052028 A1 | 2/2009 | Umemoto et al. | |
| 2009/0091551 A1 | 4/2009 | Hotelling et al. | |
| 2010/0182252 A1 | 7/2010 | Jeong et al. | |
| 2010/0309167 A1 | 12/2010 | Nam | |
| 2011/0267561 A1 | 11/2011 | Nemoto et al. | |
| 2014/0132860 A1 | 5/2014 | Hotelling et al. | |
| 2014/0354304 A1 | 12/2014 | Omote et al. | |
| 2016/0154157 A1 * | 6/2016 | Cho | G02B 1/11 |
| | | | 359/489.07 |
| 2016/0216808 A1 | 7/2016 | Hotelling et al. | |

FOREIGN PATENT DOCUMENTS

| | | |
|---|---|---|
| JP | H09127885 A | 5/1997 |
| JP | H1068816 A | 3/1998 |
| JP | 2846091 B2 | 1/1999 |
| JP | H11133408 A | 5/1999 |
| JP | 3286905 B2 | 5/2002 |
| JP | 3366697 B2 | 1/2003 |
| JP | 2003511799 A | 3/2003 |
| JP | 2003114325 A | 4/2003 |
| JP | 2003331654 A | 11/2003 |
| JP | 2005181615 A | 7/2005 |
| JP | 2006285208 A | 10/2006 |
| JP | 2007004120 A | 1/2007 |
| JP | 2008517344 A | 5/2008 |
| JP | 2008310550 A | 12/2008 |
| JP | 4403257 B2 | 1/2010 |
| JP | 2010164938 A | 7/2010 |
| JP | 2010541109 A | 12/2010 |
| JP | 2011511357 A | 4/2011 |
| JP | 2011118137 A | 6/2011 |
| JP | 2011175601 A | 9/2011 |
| JP | 2012018634 A | 1/2012 |
| JP | 2013152690 A | 8/2013 |
| JP | 2015031753 A | 2/2015 |
| WO | 2010131387 A1 | 11/2010 |

OTHER PUBLICATIONS

Yugang Sun et al., "Uniform Silver Nanowires Synthesis by Reducing AgNO3 with Ethylene Glycol in the Presence of Seeds and Poly(Vinyl Pyrrolidone)", Chemistry of Materials, 2002, pp. 4736-4745, vol. 14, No. 11.

Oct. 30, 2018, International Preliminary Report on Patentability issued in the International Patent Application No. PCT/JP2017/016092.

* cited by examiner

FILM SENSOR MEMBER AND METHOD FOR MANUFACTURING SAME, CIRCULARLY POLARIZING PLATE AND METHOD FOR MANUFACTURING SAME, AND IMAGE DISPLAY DEVICE

FIELD

The present invention relates to: a film sensor member and a method for producing the same; a circularly polarizing plate and a method for producing the same; and an image display device including the circularly polarizing plate.

BACKGROUND

A touch panel provided as an input device to an image display device usually has a film sensor member including a transparent substrate and a transparent electroconductive layer formed on this substrate (Patent Literatures 1 and 2). Known examples of the system for a touch panel include a capacitive system, an optical system, an ultrasonic system, an electromagnetic induction system, and a resistive film system. Among these, a capacitive touch panel, which picks up the change in capacitance between a fingertip and a transparent electroconductive layer to perform input, is presently becoming the mainstream of a touch panel, along with a resistive film touch panel. A glass substrate has been widely used as the substrate of the film sensor member of the capacitive touch panel. However, a resin film is recently considered as a candidate substrate in view of the thickness and flexibility of the substrate.

An image display device generally includes an optical film such as a $\lambda/4$ plate and a $\lambda/2$ plate. Various studies have been conducted on such an optical film (see Patent Literatures 3 to 8).

CITATION LIST

Patent Literature

Patent Literature 1: Japanese Patent Application Laid-Open No. 2013-152690 A
Patent Literature 2: U.S. Pat. No. 9,158,143
Patent Literature 3: International Publication No. 2010/131387
Patent Literature 4: Japanese Patent Application Laid-Open No. Hei. 05-100114 A
Patent Literature 5: Japanese Patent Application Laid-Open No. 2003-114325 A
Patent Literature 6: Japanese Patent Application Laid-Open No. Hei. 10-68816 A
Patent Literature 7: Japanese Patent Application Laid-Open No. 2005-181615 A
Patent Literature 8: Japanese Patent Application Laid-Open No. 2015-31753 A

SUMMARY

Technical Problem

An image of an image display device is sometimes displayed by linearly polarized light. For example, since a liquid crystal display device includes a liquid crystal cell and a linear polarizer, an image of the liquid crystal display device may be displayed by linearly polarized light having passing through the linear polarizer. As another example, a circularly polarizing plate is sometimes provided on a screen of an organic electroluminescent display device (hereinafter, sometimes appropriately referred to as an "organic EL display device") in order to suppress the reflection of external light. An image of such an organic EL display device including the circularly polarizing plate may be displayed by linearly polarized light having passed through a linear polarizer that the circularly polarizing plate has.

The image displayed by linearly polarized light as described above sometimes becomes dark and cannot be visually recognized when viewed through polarized sunglasses. Specifically, when the vibration direction of the linearly polarized light for displaying an image is parallel to the polarized light absorption axis of the polarized sunglasses, the linearly polarized light cannot pass through the polarized sunglasses. Accordingly, the image cannot be visually recognized. The vibration direction of linearly polarized light herein means the vibration direction of the electric field of linearly polarized light.

To address this concern, the present inventors attempted to dispose a $\lambda/4$ plate on the visual recognition side of the linear polarizer of the image display device so that the image can be visually recognized. The linearly polarized light having passed through the linear polarizer is converted into circularly polarized light by the $\lambda/4$ plate. Since part of this circularly polarized light can pass through polarized sunglasses, the image can be visually recognized through the polarized sunglasses.

For widening the wavelength range of the circularly polarized light capable of passing through polarized sunglasses to enhance the visual recognizability of an image, it is desirable that a member capable of converting linearly polarized light into circularly polarized light in a wide wavelength band is used as the $\lambda/4$ plate. Therefore, the present inventors prepared a broadband $\lambda/4$ plate including a combination of a $\lambda/4$ plate and a $\lambda/2$ plate, and mounted this broadband $\lambda/4$ plate to an image display device, in an attempt to enhance the visual recognizability of the image through polarized sunglasses.

However, when the display surface of the image display device was viewed through polarized sunglasses in a tilt direction, images in all azimuth directions sometimes changed in color tone depending on whether polarized sunglasses were worn. Furthermore, when the display surface of the image display device was viewed in a tilt direction through polarized sunglasses and the brightness of the image decreased, the degree of the decrease in brightness sometimes differed depending on the azimuth. Consequently, in prior art, the color tone and brightness of images in all azimuth directions viewed without worn polarized sunglasses in the tilt direction relative to the display surface were sometimes different from the color tone and brightness of images in all azimuth directions viewed through polarized sunglasses in the tilt direction relative to the display surface. Thus, since the color tone and brightness of an image fluctuate depending on the azimuth in which the display surface is viewed when an image is viewed in a tilt direction relative to the display surface through worn polarized sunglasses, there has been a difficulty in obtaining uniformity in the color tone and brightness of images in all azimuth directions.

The present inventor also attempted to use the aforementioned broadband $\lambda/4$ plate as a substrate of a film sensor member for touch panels and form a transparent electroconductive layer on the broadband $\lambda/4$ plate. In forming the transparent electroconductive layer, the substrate is sometimes placed in a high temperature environment. However, since a broadband $\lambda/4$ plate in prior art was low in heat resistance, the broadband λ/4 plate sometimes had deformation such as wrinkles and curls during the formation of the transparent electroconductive layer.

Furthermore, the present inventor attempted to produce a circularly polarizing plate by bonding a linear polarizer to the film sensor member including the prior art broadband λ/4 plate and the transparent electroconductive layer. In general, the bonding is performed with a UV curable adhesive. However, when a circularly polarizing plate is produced in this manner, the adhesiveness of the transparent electroconductive layer sometimes decreased by the irradiation with ultraviolet light for curing the UV curable adhesive.

The present invention has been devised in view of the aforementioned problem. An object of the present invention is to provide: a film sensor member which can achieve a circularly polarizing plate including a transparent electroconductive layer having excellent adhesiveness, can achieve an image display device capable of suppressing the fluctuation in the color tone and brightness of an image in all azimuth directions due to whether or not worn polarized sunglasses are present when a display surface is viewed in a tilt direction, and is excellent in heat resistance, and a method for producing the film sensor member; a circularly polarizing plate which includes a film sensor member having excellent heat resistance, can achieve an image display device capable of suppressing the fluctuation in the color tone and brightness of an image in all azimuth directions depending on the presence or absence of worn polarized sunglasses when a display surface is viewed in a tilt direction, and includes a transparent electroconductive layer having excellent adhesiveness, and a method for producing the circularly polarizing plate; and an image display device which includes a circularly polarizing plate including a film sensor member having excellent heat resistance and a transparent electroconductive layer having excellent adhesiveness, and can suppress the fluctuation in the color tone and brightness of an image in all azimuth directions depending on the presence or absence of worn polarized sunglasses when a display surface is viewed in a tilt direction.

Solution to Problem

The present invention is as follows.
(1) A film sensor member for disposing on a visually recognizing side of a linear polarizer in an image display device including the linear polarizer, the member comprising a transparent electroconductive layer, a λ/4 plate, and a λ/2 plate in this order from the visually recognizing side, wherein
the λ/4 plate is formed of a first thermoplastic resin containing an amorphous polymer having a glass transition temperature of 150° C. or higher or a crystallizable polymer having a melting point of 250° C. or higher,
the λ/2 plate includes, in this order, a first outer layer formed of a second thermoplastic resin, an intermediate layer formed of a third thermoplastic resin containing an ultraviolet absorber, and a second outer layer formed of a fourth thermoplastic resin, and
the λ/2 plate has an NZ factor of 1.1 to 3.0.
(2) The film sensor member according to (1), wherein
the film sensor member has a long-length shape,
an angle formed by a slow axis of the λ/4 plate with respect to a lengthwise direction of the film sensor member is 75°±5°,
an angle formed by a slow axis of the λ/2 plate with respect to the lengthwise direction of the film sensor member is 15°±5°,
an intersection angle formed between the slow axis of the λ/4 plate and the slow axis of the λ/2 plate is 55° to 65°.
(3) The film sensor member according to (1) or (2), wherein a light transmittance of the film sensor member at a wavelength of 380 nm is 5% or less.
(4) The film sensor member according to any one of (1) to (3), wherein a ratio of "thickness of the intermediate layer"/"thickness of the λ/2 plate" is ⅓ to 80/82.
(5) The film sensor member according to any one of (1) to (4), wherein the first thermoplastic resin, the second thermoplastic resin, the third thermoplastic resin, and the fourth thermoplastic resin contain an alicyclic structure-containing polymer.
(6) The film sensor member according to any one of (1) to (5), comprising a hard coat layer disposed on at least one surface of the λ/4 plate.
(7) The film sensor member according to any one of (1) to (6), wherein the λ/4 plate and the λ/2 plate are an obliquely stretched film.
(8) The film sensor member according to any one of (1) to (7), wherein the λ/2 plate is a sequentially biaxially stretched film.
(9) A method for producing the film sensor member according to any one of (1) to (8), comprising the steps of:
forming the transparent electroconductive layer on one side of the λ/4 plate; and
bonding the λ/2 plate on the other side of the λ/4 plate with a UV curable adhesive.
(10) A circularly polarizing plate comprising a linear polarizer and a film sensor member, wherein
the film sensor member includes a λ/2 plate, a λ/4 plate, and a transparent electroconductive layer in this order from the linear polarizer side,
the λ/4 plate is formed of a first thermoplastic resin containing an amorphous polymer having a glass transition temperature of 150° C. or higher or a crystallizable polymer having a melting point of 250° C. or higher,
the λ/2 plate includes, in this order, a first outer layer formed of a second thermoplastic resin, an intermediate layer formed of a third thermoplastic resin containing an ultraviolet absorber, and a second outer layer formed of a fourth thermoplastic resin, and
the λ/2 plate has an NZ factor of 1.1 to 3.0.
(11) A method for producing the circularly polarizing plate according to (10), comprising the steps of:
bonding the linear polarizer and the film sensor member with a UV curable adhesive; and
irradiating the UV curable adhesive with ultraviolet light through the linear polarizer.
(12) An image display device comprising an image display element, and the circularly polarizing plate according to (10) disposed on a visually recognizing side of the image display element.
(13) The image display device according to (12), wherein the image display element is a liquid crystal cell or an organic electroluminescent element.

Advantageous Effects of Invention

According to the present invention, there can be provided a film sensor member which can achieve a circularly polarizing plate including a transparent electroconductive layer being excellent in adhesiveness, can achieve an image display device capable of suppressing the fluctuation in the color tone and brightness of an image in all azimuth directions depending on the presence or absence of worn polarized sunglasses when a display surface is viewed in a tilt direction, and is excellent in heat resistance, and a method for producing the film sensor member; a circularly polarizing plate which includes a film sensor member having excellent heat resistance, can achieve an image display device capable of suppressing the fluctuation in the color tone and brightness of an image in all azimuth directions depending on the presence or absence of worn polarized sunglasses when a display surface is viewed in a tilt direction, and includes a transparent electroconductive layer having excellent adhesiveness, and a method for producing the circularly polarizing plate; and an image display device which includes a circularly polarizing plate including a film sensor member having excellent heat resistance and a transparent electroconductive layer having excellent adhesiveness, and can suppress the fluctuation in the color tone and brightness of an image in all azimuth directions depending on the presence or absence of worn polarized sunglasses when a display surface is viewed in a tilt direction.

DESCRIPTION OF EMBODIMENTS

Figure 1:
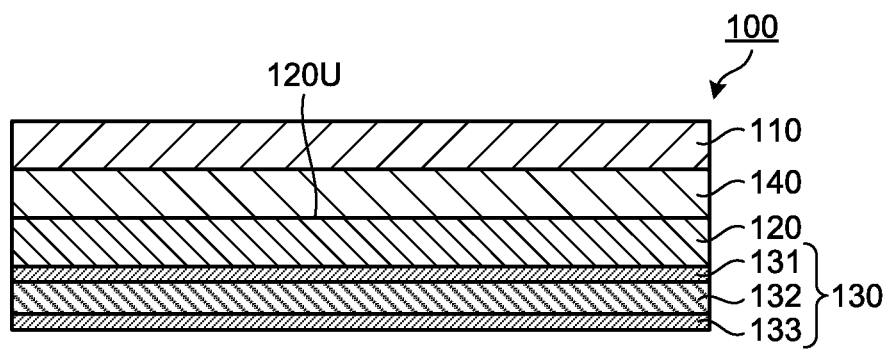
FIG. 1 is a cross-sectional view schematically illustrating a film sensor member according to an embodiment of the present invention.

Hereinafter, the present invention will be described in detail with reference to embodiments and examples. However, the present invention is not limited to the following embodiments and examples, and may be freely modified for implementation without departing from the scope of claims of the present invention and the scope of their equivalents.

In the following description, a "long-length" shape refers to a shape with the length that is 5 times or more the width, and preferably a shape with the length that is 10 times or more the width, and specifically refers to a film shape having a length that allows a film to be wound up into a rolled shape for storage or transportation. The upper limit of the length of the long-length shape may be, but not particularly limited to, for example 100,000 times or less the width.

In the following description, an in-plane retardation Re of a film is a value represented by $Re=(n_x-n_y)\times d$, unless otherwise specified. A retardation Rth in the thickness direction of a film is a value represented by $Rth=\{(n_x+n_y)/2-n_z\}$, unless otherwise specified. An NZ factor of a film is a value represented by $(n_x-n_z)/(n_x-n_y)$ and may be calculated by $0.5+Rth/Re$, unless otherwise specified. Herein, $n_x$ represents a refractive index in a direction in which the maximum refractive index is given among directions perpendicular to the thickness direction of the film (in-plane directions), $n_y$ represents a refractive index in a direction, among the above-mentioned in-plane directions of the film, orthogonal to the direction giving $n_x$, $n_z$ represents a refractive index in the thickness direction of the film, and d represents the thickness of the film. The measurement wavelength of the retardation is 590 nm unless otherwise specified.

In the following description, a resin having a positive intrinsic birefringence value means a resin in which a refractive index in the stretching direction is larger than that in the direction orthogonal thereto, unless otherwise specified. A resin having a negative intrinsic birefringence value means a resin in which a refractive index in the stretching direction is smaller than that in the direction orthogonal thereto, unless otherwise specified. The intrinsic birefringence value may be calculated from a dielectric constant distribution.

In the following description, a slow axis of a film represents a slow axis in a surface of the film, unless otherwise specified.

In the following description, an oblique direction of a long-length film is an in-plane direction of the film that is neither parallel nor perpendicular to the widthwise direction of the film, unless otherwise specified.

In the following description, a front direction of a certain surface means a normal direction of the surface, and specifically refers to a direction of a polar angle of 0° and an azimuth angle of 0° of the surface, unless otherwise specified.

In the following description, a tilt direction relative to a certain surface means a direction that is neither parallel nor perpendicular to the surface, and specifically refers to a direction in which the polar angle of the surface is in a range of greater than 0° and smaller than 90°, unless otherwise specified.

In the following description, a direction of an element being "parallel", "perpendicular", and "orthogonal" may allow an error within the range of not impairing the advantageous effects of the present invention, for example, within a range of ±5°, unless otherwise specified.

In the following description, "polarizing plate", "λ/2 plate", "λ/4 plate", and "positive C plate" include not only a rigid member but also a flexible member such as a resin film, unless otherwise specified.

In the following description, an angle formed by an optical axis (polarized light absorption axis, polarized light transmission axis, slow axis, etc.) of each film in a member including a plurality of films represents an angle when the film is viewed in the thickness direction, unless otherwise specified.

[1. Summary of Film Sensor Member]

FIG. 1 is a cross-sectional view schematically illustrating a film sensor member 100 according to an embodiment of the present invention.

As illustrated in FIG. 1, the film sensor member 100 according to an embodiment of the present invention includes a transparent electroconductive layer 110, a λ/4 plate 120, and a λ/2 plate 130 in this order. The film sensor member 100 is usually a member provided on the visually recognizing side of a linear polarizer in an image display device including the linear polarizer. When provided in an image display device, the film sensor member 100 is provided to include the transparent electroconductive layer 110, the λ/4 plate 120, and the λ/2 plate 130 in this order from the visually recognizing side.

The λ/4 plate 120 is a member formed of a first thermoplastic resin containing an amorphous polymer having a glass transition temperature in a specific range or a crystallizable polymer having a melting point in a specific range.

The λ/2 plate 130 is a member having a multilayer structure that has an NZ factor in a specific range and includes a first outer layer 131 formed of a second thermoplastic resin, an intermediate layer 132 formed of a third thermoplastic resin containing an ultraviolet absorber, and a second outer layer 133 formed of a fourth thermoplastic resin, which are disposed in this order.

The film sensor member 100 further includes an optional layer in combination with the transparent electroconductive layer 110, the λ/4 plate 120, and the λ/2 plate 130. For example, the film sensor member 100 may include a hard coat layer 140 provided on at least one surface 120U of the λ/4 plate 120, or may include hard coat layers on both surfaces of the λ/4 plate 120. The transparent electroconductive layer 110 may be provided on one surface provided with the hard coat layer 140 of λ/4 plate 120 or on both surfaces provided with the hard coat layer 140.

[2. Transparent Electroconductive Layer]

The transparent electroconductive layer is a layer having high transparency and low surface resistivity. The transparent electroconductive layer may function as an electroconductive layer of an electrode, a wiring, or the like of a touch panel when the film sensor member is provided to an image display device.

As the transparent electroconductive layer, for example, a layer containing at least one electroconductive material selected from the group consisting of an electroconductive metal oxide, an electroconductive nanowire, a metal mesh, and an electroconductive polymer may be used.

Examples of the electroconductive metal oxide may include indium tin oxide (ITO), indium zinc oxide (IZO), zinc oxide (ZnO), indium tungsten oxide (IWO), indium titanium oxide (ITiO), aluminum zinc oxide (AZO), gallium zinc oxide (GZO), zinc-based special oxide (XZO), and indium gallium zinc oxide (IGZO). Among these, ITO is particularly preferable from the viewpoint of light transmittance and durability. As these oxides, one type thereof may be solely used, and two or more types thereof may also be used in combination at any ratio.

The transparent electroconductive layer containing an electroconductive metal oxide may be formed by a film formation method such as an evaporation method, a sputtering method, an ion plating method, an ion beam assisted evaporation method, an arc discharge plasma evaporation method, a thermal CVD method, a plasma CVD method, a plating method, or a combination thereof. Among these methods, an evaporation method and a sputtering method are preferable, and a sputtering method is particularly preferable. In the sputtering method, since a transparent electroconductive layer having a uniform thickness can be formed, generation of a locally thin portion in the transparent electroconductive layer can be suppressed.

Electroconductive nanowires refer to an electroconductive substance in a needle-like or thread-like shape having a nanometer-size diameter. The shape of the electroconductive nanowires may be linear or curved. When such electroconductive nanowires form spaces therebetween to have a mesh-like shape, a favorable electrical conduction path can be formed even with a small amount of electroconductive nanowires, thereby achieving a transparent electroconductive layer having a small electric resistance. In addition, when the electroconductive wires have a mesh-like shape, openings are formed in the spaces of the mesh, thereby achieving a transparent electroconductive layer having high light transmittance. Furthermore, with the transparent electroconductive layer containing electroconductive nanowires, a film sensor member having excellent bending resistance can be obtained.

The ratio (aspect ratio: L/d) between the thickness d and the length L of the nanowires is preferably 10 to 100,000, more preferably 50 to 100,000, and particularly preferably 100 to 10,000. The electroconductive nanowires having such a large aspect ratio favorably intersect with each other to express high electroconductivity with a small amount of electroconductive nanowires. As a result, a film sensor member having excellent transparency can be obtained. The "thickness of the electroconductive nanowires" herein means a diameter for electroconductive nanowires having a circular cross section, a minor diameter for electroconductive nanowires having an oval cross section, and the longest diagonal for electroconductive nanowires having a polygonal cross section. The thickness and length of the electroconductive nanowires may be measured with a scanning electron microscope or a transmission electron microscope.

The thickness of the electroconductive nanowires is preferably less than 500 nm, more preferably less than 200 nm, further preferably 10 nm to 100 nm, and particularly preferably 10 nm to 50 nm. When the thickness falls within the range, the transparency of the transparent electroconductive layer can be enhanced.

The length of the electroconductive nanowires is preferably 2.5 μm to 1,000 μm, more preferably 10 μm to 500 μm, and particularly preferably 20 μm to 100 μm. When the length falls within the range, the electroconductivity of the transparent electroconductive layer can be enhanced.

Examples of the electroconductive nanowire may include metal nanowires composed of metal, and electroconductive nanowires containing carbon nanotubes.

As the metal contained in the metal nanowires, a metal having high electroconductivity is preferable. Examples of suitable metals may include gold, platinum, silver, and copper. Among these, silver, copper and gold are particularly preferable, and silver is more preferable. A material in which the aforementioned metal is subjected to a plating treatment (for example, a gold plating treatment) may be used. As these materials, one type thereof may be solely used, and two or more types thereof may also be used in combination at any ratio.

The method for producing the metal nanowires may be any optional appropriate method. Examples of the method may include: a method of reducing silver nitrate in a solution; and a method of applying electric voltages or currents from a tip of a probe onto the surface of a precursor, and drawing metal nanowires at the tip of the probe to continuously form the metal nanowires. In the method of reducing silver nitrate in a solution, silver nanowires may be synthesized by liquid-phase reduction of a silver salt such as silver nitrate in the presence of polyol such as ethylene glycol, and polyvinyl pyrrolidone. Silver nanowires having a homogeneous size can be mass-produced in accordance with, for example, the method described in Xia, Y. et al., Chem. Mater. (2002), 14, 4736-4745 and Xia, Y. et al., Nano letters (2003)3(7), 955-960.

Examples of the carbon nanotube used may include so-called multi-walled carbon nanotubes, double-walled carbon nanotubes, and single-walled carbon nanotubes having a diameter of 0.3 nm to 100 nm and a length of about 0.1 µm to 20 µm. Among these, single-walled or double-walled carbon nanotubes having a diameter of 10 nm or less and a length of 1 µm to 10 µm are preferable from the viewpoint of high electroconductivity. It is preferable that the aggregate of carbon nanotubes does not contain impurities such as amorphous carbon and a metal catalyst. As the method for producing the carbon nanotube, any suitable method may be adopted. Preferably, carbon nanotubes produced by an arc discharge method are used. Carbon nanotubes produced by the arc discharge method are preferable because they have excellent crystallizability.

The transparent electroconductive layer containing the electroconductive nanowires may be produced by dispersing the electroconductive nanowires in a solvent and coating and drying the resulting electroconductive nanowire dispersion liquid.

Examples of the solvent contained in the electroconductive nanowire dispersion liquid may include water, an alcohol-based solvent, a ketone-based solvent, an ether-based solvent, a hydrocarbon-based solvent, and an aromatic-based solvent. Among these, water is preferably used from the viewpoint of reducing the environmental load. As these solvents, one type thereof may be solely used, and two or more types thereof may also be used in combination at any ratio.

The concentration of the electroconductive nanowires in the electroconductive nanowire dispersion liquid is preferably 0.1% by weight to 1% by weight. When the concentration falls within the range, a transparent electroconductive layer excellent in electroconductivity and transparency can be formed.

The electroconductive nanowire dispersion liquid may contain an optional component in combination with the electroconductive nanowires and the solvent. Examples of the optional component may include a corrosion inhibitor for inhibiting corrosion of the electroconductive nanowires, a surfactant for inhibiting aggregation of the electroconductive nanowires, and a binder polymer for retaining the electroconductive nanowires in the transparent electroconductive layer. As these optional components, one type thereof may be solely used, and two or more types thereof may also be used in combination at any ratio.

Examples of the coating method of the electroconductive nanowire dispersion liquid may include a spray coating method, a bar coating method, a roll coating method, a die coating method, an ink jet coating method, a screen coating method, a dip coating method, a slot die coating method, a relief printing method, an intaglio printing method, and a gravure printing method. As the drying method, any suitable drying method (for example, natural drying, blow drying, and heat drying) may be adopted. For example, in the case of heat drying, the drying temperature may be 100° C. to 200° C., and the drying time may be 1 minute to 10 minutes.

The ratio of the electroconductive nanowires in the transparent electroconductive layer is preferably 80% by weight to 100% by weight, and more preferably 85% by weight to 99% by weight, relative to the total weight of the transparent electroconductive layer. When the ratio falls within the range, a transparent electroconductive layer having excellent electroconductivity and light transmittance can be obtained.

The metal mesh is a metal thin wire formed in a lattice shape. As the metal included in the metal mesh, a metal having high electroconductivity is preferable. Examples of suitable metals may include gold, platinum, silver, and copper. Silver, copper and gold are particularly preferable, and silver is more preferable. As these metals, one type thereof may be solely used, and two or more types thereof may also be used in combination at any ratio.

The transparent electroconductive layer containing the metal mesh may be formed, for example, by coating a composition for forming a transparent electroconductive layer containing a silver salt, and forming metal fine lines in a specific lattice pattern by exposure processing and development processing. The transparent electroconductive layer containing the metal mesh may also be formed by printing a composition for forming a transparent electroconductive layer containing fine metal particles in a specific pattern. For details of such a transparent electroconductive layer and the forming method thereof, reference may be made to Japanese Patent Application Laid-Open No. 2012-18634 A and Japanese Patent Application Laid-Open No. 2003-331654 A.

Examples of the electroconductive polymer may include a polythiophene-based polymer, a polyacetylene-based polymer, a polyparaphenylene-based polymer, a polyaniline-based polymer, a polyparaphenylene vinylene-based polymer, a polypyrrole-based polymer, a polyphenylene-based polymer, and a polyester-based polymer modified with an acrylic-based polymer. Among these, a polythiophene-based polymer, a polyacetylene-based polymer, a polyparaphenylene-based polymer, a polyaniline-based polymer, a polyparaphenylene vinylene-based polymer, and a polypyrrole-based polymer are preferable.

Among these, a polythiophene-based polymer is particularly preferable. When such a polythiophene-based polymer is used, a transparent electroconductive layer having excellent transparency and chemical stability can be obtained. Specific examples of the polythiophene-based polymer may include polythiophene; poly(3-$C_{1-8}$ alkyl-thiophene) such as poly(3-hexylthiophene); poly(3,4-(cyclo)alkylenedioxythiophene) such as poly(3,4-ethylenedioxythiophene), poly(3,4-propylenedioxythiophene), and poly[3,4-(1,2-cyclohexylene)dioxythiophene]; and polythienylenevinylene.

As the aforementioned electroconductive polymers, one type thereof may be solely used, and two or more types thereof may also be used in combination at any ratio.

The electroconductive polymer is preferably polymerized in the presence of an anionic polymer. For example, the polythiophene-based polymer is preferably oxidatively polymerized in the presence of an anionic polymer. Examples of the anionic polymer may include polymers having a carboxyl group, a sulfonic acid group, or a salt thereof. Preferably, an anionic polymer having a sulfonic acid group, such as polystyrenesulfonic acid, may be used.

The transparent electroconductive layer containing the electroconductive polymer may be formed, for example, by coating and drying an electroconductive composition containing the electroconductive polymer. For a transparent electroconductive layer containing an electroconductive polymer, reference may be made to Japanese Patent Application Laid-Open No. 2011-175601 A.

When the transparent electroconductive layers are provided to both surfaces of the λ/4 plate, the transparent electroconductive layers may be formed on each surface, or may be simultaneously formed on both surfaces. The transparent electroconductive layers to be provided to both surfaces may be different in thickness, but are preferably the same in order to prevent deformation such as wrinkles and curls of the λ/4 plate.

The transparent electroconductive layer may be formed entirely in the in-plane direction of the film sensor member, or may be patterned into a specific pattern. As the shape of the pattern of the transparent electroconductive layer, a pattern that favorably works as a touch panel (for example, a capacitance type touch panel) is preferable. Examples of the patterns may include those described in Japanese Translation of PCT Patent Application Publication No. 2011-511357 A, Japanese Patent Application Laid-Open No. 2010-164938 A, Japanese Patent Application Laid-Open No. 2008-310550 A, Japanese Translation of PCT Patent Application Publication No. 2003-511799, and Japanese Translation of PCT Patent Application Publication No. 2010-541109.

The surface resistance value of the transparent electroconductive layer is preferably 2000Ω/square or less, more preferably 1500Ω/square or less, and particularly preferably 1000Ω/square or less. When the surface resistance value of the transparent electroconductive layer is low, a high-performance touch panel can be achieved using the film sensor member. The lower limit of the surface resistance value of the transparent electroconductive layer is not particularly limited, but is preferably 100Ω/square or more, more preferably 200Ω/square or more, and particularly preferably 300Ω/square for facilitating the production.

The total light transmittance of the transparent electroconductive layer is preferably 85% or more, more preferably 90% or more, and further more preferably 95% or more. The light transmittance may be measured in accordance with JIS K0115 using a spectrophotometer (ultraviolet-visible-near-infrared spectrophotometer "V-570" manufactured by JASCO Corporation).

The thickness of the transparent electroconductive layer is preferably 0.01 μm to 10 μm, more preferably 0.05 μm to 3 μm, and particularly preferably 0.1 μm to 1 μm.

[3. λ/4 Plate]

[3.1. Composition of λ/4 Plate]

The λ/4 plate is formed of a first thermoplastic resin containing an amorphous polymer having a glass transition temperature in a specific range or a crystallizable polymer having a melting point in a specific range. The crystallizable polymer herein refers to a polymer having a melting point that can be observed by a differential scanning calorimeter (DSC). Such a crystallizable polymer usually has molecular chains regularly arranged with long-range order. An amorphous polymer refers to a polymer having no melting point observable by a differential scanning calorimeter (DSC). Such an amorphous polymer usually does not have molecular chains with long-range order like crystal.

The specific glass transition temperature of the amorphous polymer is usually 150° C. or higher, preferably 155° C. or higher, and more preferably 160° C. or higher, and is preferably 185° C. or lower, more preferably 180° C. or lower, and particularly preferably 175° C. or lower. When the glass transition temperature of the amorphous polymer is equal to or higher than the lower limit value of the aforementioned range, heat resistance of the λ/4 plate can be improved, so that the heat resistance of the film sensor member can be improved. Therefore, even when the transparent electroconductive layer is formed on the λ/4 plate in a high-temperature environment, occurrence of deformation such as wrinkles and curls can be suppressed. When the glass transition temperature of the amorphous polymer is equal to or lower than the upper limit value of the aforementioned range, the first thermoplastic resin can be easily molded and stretched, so that the λ/4 plate can be easily produced.

The specific melting point of the crystallizable polymer is usually 250° C. or higher, preferably 255° C. or higher, and more preferably 260° C. or higher, and is preferably 290° C. or lower, more preferably 280° C. or lower, and particularly preferably 270° C. or lower. When the melting point of the crystallizable polymer is equal to or higher than the lower limit value of the aforementioned range, the heat resistance of the λ/4 plate can be improved, so that the heat resistance of the film sensor member can be improved. Therefore, even when the transparent electroconductive layer is formed on the λ/4 plate in a high-temperature environment, occurrence of deformation such as wrinkles and curls can be suppressed. When the melting point of the crystallizable polymer is equal to or lower than the upper limit value of the aforementioned range, the first thermoplastic resin can be easily molded and stretched, so that the λ/4 plate can be easily produced.

(3.1.1. Amorphous Polymer)

Examples of the amorphous polymer may include a polyolefin such as polyethylene and polypropylene; a polyester such as polyethylene terephthalate and polybutylene terephthalate; a polyarylene sulfide such as polyphenylene sulfide; a polyvinyl alcohol; a polycarbonate; a polyarylate; a cellulose ester polymer, a polyethersulfone; a polysulfone; a polyallylsulfone; a polyvinyl chloride; an alicyclic structure-containing polymer such as a norbornene polymer; and a rod-like liquid crystal polymer. As these polymers, one type thereof may be solely used, and two or more types thereof may also be used in combination at any ratio. The polymer may be a homopolymer or a copolymer. Among these, an alicyclic structure-containing polymer is preferable because of their excellent mechanical properties, heat resistance, transparency, low hygroscopicity, size stability, and light weight properties.

The alicyclic structure-containing polymer is a polymer of which a structural unit contains an alicyclic structure. The alicyclic structure-containing polymer may have an alicyclic structure in a main chain, an alicyclic structure in a side chain, or an alicyclic structure in a main chain and a side chain. Among these, a polymer containing an alicyclic structure in its main chain is preferable from the viewpoint of mechanical strength and heat resistance.

Examples of the alicyclic structure may include a saturated alicyclic hydrocarbon (cycloalkane) structure, and an unsaturated alicyclic hydrocarbon (cycloalkene, cycloalkyne) structure. Among these, a cycloalkane structure and a cycloalkene structure are preferable from the viewpoint of mechanical strength and heat resistance. A cycloalkane structure is particularly preferable among these.

The number of carbon atoms constituting the alicyclic structure is preferably 4 or more, and more preferably 5 or more, and is preferably 30 or less, more preferably 20 or less, and particularly preferably 15 or less, per alicyclic structure. When the number of carbon atoms constituting the alicyclic structure falls within this range, mechanical strength, heat resistance, and moldability of the resin containing the alicyclic structure-containing polymer are highly balanced.

The ratio of the structural unit having an alicyclic structure in the amorphous alicyclic structure-containing polymer is preferably 55% by weight or more, more preferably 70% by weight or more, and particularly preferably 90% by weight or more. When the ratio of the structural unit having an alicyclic structure in the alicyclic structure-containing polymer falls within this range, the resin containing the alicyclic structure-containing polymer has good transparency and heat resistance.

Examples of the amorphous alicyclic structure-containing polymer may include a norbornene-based polymer, a monocyclic olefin-based polymer, a cyclic conjugated diene-based polymer, a vinyl alicyclic hydrocarbon polymer, and hydrogenated products thereof. Among these, a norbornene-based polymer is more preferable because of good transparency and moldability.

Examples of the norbornene-based polymer may include a ring-opening polymer of a monomer having a norbornene structure and a hydrogenated product thereof; and an addition polymer of a monomer having a norbornene structure and a hydrogenated product thereof. Examples of the ring-opening polymer of a monomer having a norbornene structure may include a ring-opening homopolymer of one type of monomer having a norbornene structure, a ring-opening copolymer of two or more types of monomers having a norbornene structure, and a ring-opening copolymer of a monomer having a norbornene structure and an optional monomer copolymerizable therewith. Further, examples of the addition polymer of a monomer having a norbornene structure may include an addition homopolymer of one type of monomer having a norbornene structure, an addition copolymer of two or more types of monomers having a norbornene structure, and an addition copolymer of a monomer having a norbornene structure and an optional monomer copolymerizable therewith. Among these, a hydrogenated product of a ring-opening polymer of a monomer having a norbornene structure is particularly suitable from the viewpoint of moldability, heat resistance, low hygroscopicity, size stability, and light weight properties.

Examples of the monomer having a norbornene structure may include bicyclo[2.2.1]hept-2-ene (common name: norbornene), tricyclo[4.3.0.1$^{2,5}$]deca-3,7-diene (common name: dicyclopentadiene), 7,8-benzotricyclo[4.3.0.1$^{2,5}$]dec-3-ene (common name: methanotetrahydrofluorene), tetracyclo[4.4.0.1$^{2,5}$.1$^{7,10}$]dodec-3-ene (common name: tetracyclododecene), and derivatives of these compounds (for example, those with a substituent on the ring). Examples of the substituent may include an alkyl group, an alkylene group, and a polar group. These substituents may be the same as or different from each other, and a plurality of these substituents may be bonded to the ring. As the monomer having a norbornene structure, one type thereof may be solely used, and two or more types thereof may also be used in combination at any ratio.

Examples of the type of the polar group may include a heteroatom, and an atomic group having a heteroatom. Examples of the heteroatom may include an oxygen atom, a nitrogen atom, a sulfur atom, a silicon atom, and a halogen atom. Specific examples of the polar group may include a carboxyl group, a carbonyloxycarbonyl group, an epoxy group, a hydroxyl group, an oxy group, an ester group, a silanol group, a silyl group, an amino group, a nitrile group, and a sulfonic acid group.

Examples of the monomer that is ring-opening copolymerizable with the monomer having a norbornene structure may include monocyclic olefins such as cyclohexene, cycloheptene, and cyclooctene, and derivatives thereof; and cyclic conjugated dienes such as cyclohexadiene and cycloheptadiene, and derivatives thereof. As the monomer that is ring-opening copolymerizable with the monomer having a norbornene structure, one type thereof may be solely used, and two or more types thereof may also be used in combination at any ratio.

The ring-opening polymer of the monomer having a norbornene structure may be produced, for example, by polymerizing or copolymerizing the monomer in the presence of a ring-opening polymerization catalyst.

Examples of the monomer that is addition copolymerizable with the monomer having a norbornene structure may include α-olefins of 2 to 20 carbon atoms such as ethylene, propylene, and 1-butene, and derivatives thereof; cycloolefins such as cyclobutene, cyclopentene, and cyclohexene, and derivatives thereof; and non-conjugated dienes such as 1,4-hexadiene, 4-methyl-1,4-hexadiene, and 5-methyl-1,4-hexadiene. Among these, α-olefin is preferable, and ethylene is more preferable. As the monomer that is addition copolymerizable with the monomer having a norbornene structure, one type thereof may be solely used, and two or more types thereof may also be used in combination at any ratio.

The addition polymer of the monomer having a norbornene structure may be produced, for example, by polymerizing or copolymerizing the monomer in the presence of an addition polymerization catalyst.

The above-mentioned hydrogenated products of the ring-opening polymer and the addition polymer may be produced, for example, by hydrogenating an unsaturated carbon-carbon bond, preferably 90% or more thereof, in a solution of the ring-opening polymer and the addition polymer in the presence of a hydrogenation catalyst containing a transition metal such as nickel, palladium, or the like.

Among the norbornene-based polymers, it is preferable that the polymer has an X: bicyclo[3.3.0]octane-2,4-diyl-ethylene structure and a Y: tricyclo[4.3.0.1$^{2,5}$]decane-7,9-diyl-ethylene structure as structural units, and that the amount of these structural units is 90% by weight or more relative to the entire structural unit of the norbornene-based polymer, and the content ratio of X and Y is 100:0 to 40:60 by weight ratio of X:Y. By using such a polymer, the layer containing the norbornene-based polymer can be made to have excellent stability of optical properties without size change over a long period of time.

Examples of the commercially available product of the alicyclic structure-containing polymer may include ZEONEX and ZEONOR (norbornene-based resin) manufactured by ZEON Corporation; SUMILIGHT FS-1700 manufactured by Sumitomo Bakelite Co., Ltd.; ARTON (modified norbornene-based resin) manufactured by JSR Corporation; APEL (cyclic olefin copolymer) manufactured by Mitsui Chemicals, Inc.; Topas (cyclic olefin copolymer) manufactured by Ticona; and OPTOREZ OZ-1000 series (alicyclic acrylic resin) manufactured by Hitachi Chemical Co., Ltd.

The weight-average molecular weight (Mw) of the amorphous polymer is preferably 10,000 or more, more preferably 15,000 or more, and particularly preferably 20,000 or more, and is preferably 100,000 or less, more preferably 80,000 or less, and particularly preferably 50,000 or less. When the weight-average molecular weight falls within this range, mechanical strength and molding processability of the resin are highly balanced.

The molecular weight distribution (Mw/Mn) of the amorphous polymer is preferably 1.2 or more, more preferably 1.5 or more, and particularly preferably 1.8 or more, and is preferably 3.5 or less, more preferably 3.0 or less, and particularly preferably 2.7 or less. Herein, Mn represents the number-average molecular weight. When the molecular weight distribution is equal to or more than the lower limit value of the aforementioned range, the productivity of the polymer can be increased and the production cost can be suppressed. When the molecular weight distribution is equal to or less than the upper limit value thereof, the amount of the low molecular weight component becomes small, and the relaxation at the time of high temperature exposure can be suppressed, whereby the stability of the member containing the polymer can be enhanced.

Herein, the weight-average molecular weight (Mw) and the number-average molecular weight (Mn) may be measured as a polyisoprene- or polystyrene-equivalent weight-average molecular weight measured by gel permeation chromatography using cyclohexane as a solvent. When the sample is not dissolved in cyclohexane, toluene may be used as the solvent in the gel permeation chromatography.

The ratio of the amorphous polymer in the first thermoplastic resin is preferably 50% by weight to 100% by weight, and more preferably 70% by weight to 100% by weight, and particularly preferably 90% by weight to 100% by weight. When the ratio of the amorphous polymer falls within the aforementioned range, the λ/4 plate can have sufficient heat resistance and transparency.

(3.1.2. Crystallizable Polymer)

Examples of the crystallizable polymer may include a crystallizable alicyclic structure-containing polymer and a crystallizable polystyrene-based polymer (see Japanese Patent Application Laid-Open No. 2011-118137 A). Among these, a crystallizable alicyclic structure-containing polymer is preferable because it is excellent in transparency, low hygroscopicity, size stability, and light weight properties.

As described above, the alicyclic structure-containing polymer is a polymer having an alicyclic structure in the molecule thereof. Thus, the alicyclic structure-containing polymer includes a polymer that is obtainable by a polymerization reaction using a cyclic olefin as a monomer or a hydrogenated product thereof. The alicyclic structure the crystallizable alicyclic structure-containing polymer contains may be the same as the alicyclic structure the amorphous alicyclic structure-containing polymer contains.

In the crystallizable alicyclic structure-containing polymer, the ratio of the structural unit having an alicyclic structure relative to all structural units is preferably 30% by weight or more, more preferably 50% by weight or more, and particularly preferably 70% by weight or more. When the ratio of the structural unit having an alicyclic structure in the crystallizable alicyclic structure-containing polymer is increased as described above, heat resistance can be enhanced.

The rest of the alicyclic structure-containing polymer other than the structural unit having an alicyclic structure is not especially limited, and may be appropriately selected depending on the purposes of use.

Examples of the crystallizable alicyclic structure-containing polymer may include the following polymer (α) to polymer (δ). Among these, it is preferable that the crystallizable alicyclic structure-containing polymer is a polymer (β) since a resin having excellent heat resistance is easily obtained.

Polymer (α): a ring-opening polymer of a cyclic olefin monomer, having crystallizability Polymer (β): a hydrogenated product of the polymer (a), having crystallizability Polymer (γ): an addition polymer of a cyclic olefin monomer, having crystallizability Polymer (δ): a hydrogenated product of the polymer (γ), having crystallizability Specifically, the crystallizable alicyclic structure-containing polymer is more preferably a ring-opening polymer of dicyclopentadiene having crystallizability or a hydrogenated product of the ring-opening polymer of dicyclopentadiene having crystallizability, and particularly preferably a hydrogenated product of the ring-opening polymer of dicyclopentadiene having crystallizability. Herein, the ring-opening polymer of dicyclopentadiene means a polymer in which the ratio of a structural unit derived from dicyclopentadiene relative to all structural units is usually 50% by weight or more, preferably 70% by weight or more, more preferably 90% by weight or more, and further preferably 100% by weight.

Hereinafter, methods for producing the polymers (α) and (β) will be described.

The cyclic olefin monomer available in production of the polymers (α) and (β) is a compound which has a ring structure formed of carbon atoms and includes a carbon-carbon double bond in the ring. Examples of the cyclic olefin monomer may include a norbornene-based monomer. When the polymer (α) is a copolymer, a monocyclic olefin may be used as the cyclic olefin monomer.

The norbornene-based monomer is a monomer containing a norbornene ring. Examples of the norbornene-based monomer may include a bicyclic monomer such as bicyclo[2.2.1]hept-2-ene (common name: norbornene) and 5-ethylidene-bicyclo[2.2.1]hept-2-ene (common name: ethylidene norbornene) and derivatives thereof (for example, those with a substituent on the ring); a tricyclic monomer such as tricyclo[4.3.0.1$^{2,5}$]deca-3,7-diene (common name: dicyclopentadiene) and derivatives thereof; and a tetracyclic monomer such as 7,8-benzotricyclo[4.3.0.1$^{2,5}$]dec-3-ene (common name: methanotetrahydrofluorene: also referred to as 1,4-methano-1,4,4a,9a-tetrahydrofluorene) and derivatives thereof, tetracyclo[4.4.0.1$^{2,5}$.1$^{7,10}$]dodec-3-ene (common name: tetracyclododecene), and 8-ethylidenetetracyclo[4.4.0.1$^{2,5}$.1$^{7,10}$]-3-dodecene and derivatives thereof.

Examples of the substituent in the aforementioned monomer may include: an alkyl group such as a methyl group and an ethyl group; an alkenyl group such as a vinyl group; an alkylidene group such as propane-2-ylidene; an aryl group such as a phenyl group; a hydroxy group; an acid anhydride group; a carboxyl group; and an alkoxycarbonyl group such as a methoxycarbonyl group. As the aforementioned substituent, one type thereof may be solely used, and two or more types thereof may also be used in combination at any ratio.

Examples of the monocyclic olefin may include cyclic monoolefins such as cyclobutene, cyclopentene, methylcyclopentene, cyclohexene, methylcyclohexene, cycloheptene, and cyclooctene; and cyclic diolefins such as cyclohexadiene, methylcyclohexadiene, cyclooctadiene, methylcyclooctadiene, and phenylcyclooctadiene.

As the cyclic olefin monomer, one type thereof may be solely used, and two or more types thereof may also be used in combination at any ratio. When two or more types of the cyclic olefin monomers are used, the polymer (α) may be a block copolymer or a random copolymer.

Some of the cyclic olefin monomers may allow presence of endo- and exo-stereoisomers. As the cyclic olefin monomer, any of the endo- and exo-isomers may be used. One of the endo- and exo-isomers may be solely used, and an isomer mixture containing the endo- and exo-isomers at any ratio may also be used. In particular, it is preferable that the ratio of one of the endo- and exo-isomers is at a high level because crystallizability of the alicyclic structure-containing polymer is thereby enhanced and a resin having excellent heat resistance can thereby be easily obtained. For example, the ratio of the endo- or exo-isomer is preferably 80% or more, more preferably 90% or more, and further preferably 95% or more. It is preferable that the ratio of the endo-isomer is high because it can be easily synthesized.

In synthesis of the polymer (α), a ring-opening polymerization catalyst is usually used. As the ring-opening polymerization catalyst, one type thereof may be solely used, and two or more types thereof may also be used in combination at any ratio. It is preferable that such a ring-opening polymerization catalyst for synthesis of the polymer (α) is a ring-opening polymerization catalyst that may cause ring-opening polymerization of the cyclic olefin monomer to produce a ring-opening polymer having syndiotactic stereo-regularity. Preferable examples of the ring-opening polymerization catalyst may include ring-opening polymerization catalysts including a metal compound represented by the following formula (1):

$$M(NR^{1i})X^{i}_{4-a}(OR^{2i})_a \cdot L_b \qquad (1)$$

(In the formula (1),

M is a metal atom selected from the group consisting of the Group 6 transition metal atoms in the periodic table, $R^{1i}$ is a phenyl group optionally having a substituent at least one of 3-, 4-, and 5-positions, or a group represented by —$CH_2R^{3i}$ (wherein $R^{3i}$ is a group selected from the group consisting of a hydrogen atom, an alkyl group optionally having a substituent, and an aryl group optionally having a substituent), $R^{2i}$ is a group selected from the group consisting of an alkyl group optionally having a substituent and an aryl group optionally having a substituent, $X^i$ is a group selected from the group consisting of a halogen atom, an alkyl group optionally having a substituent, an aryl group optionally having a substituent, and an alkylsilyl group, L is a neutral electron donor ligand, a is a number of 0 or 1, and b is an integer of 0 to 2.)

In the formula (1), M is a metal atom selected from the group consisting of the Group 6 transition metal atoms in the periodic table. M is preferably chromium, molybdenum, or tungsten, more preferably molybdenum or tungsten, and particularly preferably tungsten.

In the formula (1), $R^{1i}$ is a phenyl group optionally having a substituent at least one of the 3-, 4-, and 5-positions, or a group represented by —$CH_2R^{3i}$.

The number of carbon atoms of the phenyl group optionally having a substituent at least one of the 3-, 4-, and 5-positions of $R^{1i}$ is preferably 6 to 20, and more preferably 6 to 15. Examples of the substituent may include an alkyl group such as a methyl group and an ethyl group; a halogen atom such as a fluorine atom, a chlorine atom, and a bromine atom; and an alkoxy group such as a methoxy group, an ethoxy group, and an isopropoxy group. As the substituent, one type thereof may be solely used, and two or more types thereof may also be used in combination at any ratio. In $R^{1i}$, the substituents present at least two of the 3-, 4-, and 5-positions may be bonded to each other, to form a ring structure.

Examples of the phenyl group optionally having a substituent at least one of the 3-, 4-, and 5-positions may include an unsubstituted phenyl group; a monosubstituted phenyl group such as a 4-methylphenyl group, a 4-chlorophenyl group, a 3-methoxyphenyl group, a 4-cyclohexylphenyl group, and a 4-methoxyphenyl group; a disubstituted phenyl group such as a 3,5-dimethylphenyl group, a 3,5-dichlorophenyl group, a 3,4-dimethylphenyl group, and a 3,5-dimethoxyphenyl group; a trisubstituted phenyl group such as a 3,4,5-trimethylphenyl group, and a 3,4,5-trichlorophenyl group; and a 2-naphthyl group optionally having a substituent such as a 2-naphthyl group, a 3-methyl-2-naphthyl group, and a 4-methyl-2-naphthyl group.

In the group represented by —$CH_2R^{31}$ of $R^{11}$, $R^{31}$ is a group selected from the group consisting of a hydrogen atom, an alkyl group optionally having a substituent, and an aryl group optionally having a substituent.

The number of carbon atoms in the alkyl group optionally having a substituent of $R^{3i}$ is preferably 1 to 20, and more preferably 1 to 10. This alkyl group may be either linear or branched. Examples of the substituent may include a phenyl group optionally having a substituent such as a phenyl group and a 4-methylphenyl group; and an alkoxyl group such as a methoxy group and an ethoxy group. As the substituent, one type thereof may be solely used, and two or more types thereof may also be used in combination at any ratio.

Examples of the alkyl group optionally having a substituent of $R^{3i}$ may include a methyl group, an ethyl group, a propyl group, an isopropyl group, a butyl group, an isobutyl group, a t-butyl group, a pentyl group, a neopentyl group, a benzyl group, and a neophyl group.

The number of carbon atoms in the aryl group optionally having a substituent of $R^{31}$ is preferably 6 to 20, and more preferably 6 to 15. Examples of the substituent may include an alkyl group such as a methyl group and an ethyl group; a halogen atom such as a fluorine atom, a chlorine atom, and a bromine atom; and an alkoxy group such as a methoxy group, an ethoxy group, and an isopropoxy group. As the substituent, one type thereof may be solely used, and two or more types thereof may also be used in combination at any ratio.

Examples of the aryl group optionally having a substituent of $R^{3i}$ may include a phenyl group, a 1-naphthyl group, a 2-naphthyl group, a 4-methylphenyl group, and a 2,6-dimethylphenyl group.

Among these, the group represented by $R^{3i}$ is preferably an alkyl group of 1 to 20 carbon atoms.

In the formula (1), $R^{2i}$ is a group selected from the group consisting of an alkyl group optionally having a substituent and an aryl group optionally having a substituent. As the alkyl group optionally having a substituent and the aryl group optionally having a substituent of $R^{2i}$, a group selected from groups shown as the alkyl groups optionally having a substituent and the aryl groups optionally having a substituent, respectively, of $R^{3i}$ may be optionally used.

In the formula (1), $X^i$ is a group selected from the group consisting of a halogen atom, an alkyl group optionally having a substituent, an aryl group optionally having a substituent, and an alkylsilyl group.

Examples of the halogen atom of $X^i$ may include a chlorine atom, a bromine atom, and an iodine atom.

As the alkyl group optionally having a substituent and the aryl group optionally having a substituent of $X^i$, a group selected from groups shown as the alkyl groups optionally having a substituent and the aryl groups optionally having a substituent, respectively, of $R^{3i}$ may be optionally used.

Examples of the alkylsilyl group of $X^i$ may include a trimethylsilyl group, a triethylsilyl group, and a t-butyldimethylsilyl group.

When the metal compound represented by the formula (1) has two or more $X^i$'s in one molecule, the $X^i$'s may be the same as or different from each other. Further, the two or more $X^i$'s may be bonded to each other to form a ring structure.

In the formula (1), L is a neutral electron donor ligand.

Examples of the neutral electron donor ligand of L may include an electron donor compound containing an atom of the Group 14 or 15 in the periodic table. Specific examples thereof may include phosphines such as trimethylphosphine, triisopropylphosphine, tricyclohexylphosphine, and triphenylphosphine; ethers such as diethyl ether, dibutyl ether, 1,2-dimethoxyethane, and tetrahydrofuran; and amines such as trimethylamine, triethylamine, pyridine, and lutidine. Among these, ethers are preferable. When the metal compound represented by the formula (1) has two or more L's in one molecule, the L's may be the same as or different from each other.

The metal compound represented by the formula (1) is preferably a tungsten compound having a phenylimido group. That is, a metal compound represented by the formula (1) wherein M is a tungsten atom and $R^{1i}$ is a phenyl group is preferable. In particular, a tetrachlorotungsten phenylimide(tetrahydrofuran) complex is more preferable.

The method for producing the metal compound represented by the formula (1) is not particularly limited. For example, as described in Japanese Patent Application Laid-Open No. Hei. 5-345817 A, the metal compound represented by the formula (1) may be produced by mixing an oxyhalogenated product of a Group 6 transition metal; a phenyl isocyanate optionally having a substituent at at least one of the 3-, 4-, and 5-positions or a monosubstituted methyl isocyanate; a neutral electron donor ligand (L); and if necessary, an alcohol, a metal alkoxide, and a metal aryloxide.

In the aforementioned production method, the metal compound represented by the formula (1) is usually obtained in a state where the compound is contained in a reaction liquid. After production of the metal compound, the aforementioned reaction liquid as it is may be used as a catalyst liquid for the ring-opening polymerization reaction. Alternatively, the metal compound may be isolated from the reaction liquid and purified by a purification treatment such as crystallization, and the resulting metal compound may be used for the ring-opening polymerization reaction.

As the ring-opening polymerization catalyst, the metal compound represented by the formula (1) may be solely used. Alternatively, the metal compound represented by the formula (1) may be used in combination with another component. For example, the metal compound represented by the formula (1) may be used in combination with an organometallic reductant, to improve polymerization activity.

Examples of the organometallic reductant may include organometallic compounds of Groups 1, 2, 12, 13, and 14 in the periodic table, having a hydrocarbon group of 1 to 20 carbon atoms. Examples of such organometallic compounds may include an organolithium such as methyllithium, n-butyllithium, and phenyllithium; an organomagnesium such as butylethylmagnesium, butyloctylmagnesium, dihexylmagnesium, ethylmagnesium chloride, n-butylmagnesium chloride, and allylmagnesium bromide; an organozinc such as dimethylzinc, diethylzinc, and diphenylzinc; an organoaluminum such as trimethylaluminum, triethylaluminum, triisobutylaluminum, diethylaluminum chloride, ethylaluminum sesquichloride, ethylaluminum dichloride, diethylaluminum ethoxide, diisobutylaluminum isobutoxide, ethylaluminum diethoxide, and isobutylaluminum diisobutoxide; and an organotin such as tetramethyltin, tetra(n-butyl)tin, and tetraphenyltin. Among these, an organoaluminum and an organotin are preferable. As the organometallic reductant, one type thereof may be solely used, and two or more types thereof may also be used in combination at any ratio.

The ring-opening polymerization reaction is usually performed in an organic solvent. As the organic solvent, an organic solvent that allows the ring-opening polymer and a hydrogenated product thereof to be dissolved or dispersed under specific conditions and does not inhibit the ring-opening polymerization reaction and a hydrogenation reaction may be used. Examples of such an organic solvent may include an aliphatic hydrocarbon solvent such as pentane, hexane, and heptane; an alicyclic hydrocarbon solvent such as cyclopentane, cyclohexane, methylcyclohexane, dimethylcyclohexane, trimethylcyclohexane, ethylcyclohexane, diethylcyclohexane, decahydronaphthalene, bicycloheptane, tricyclodecane, hexahydroindene, and cyclooctane; an aromatic hydrocarbon solvent such as benzene, toluene, and xylene; a halogenated aliphatic hydrocarbon solvent such as dichloromethane, chloroform, and 1,2-dichloroethane; a halogenated aromatic hydrocarbon solvent such as chlorobenzene, and dichlorobenzene; a nitrogen-containing hydrocarbon solvent such as nitromethane, nitrobenzene, and acetonitrile; an ether solvent such as diethyl ether, and tetrahydrofuran; and mixed solvents obtained by a combination thereof. Among these organic solvents, an aromatic hydrocarbon solvent, an aliphatic hydrocarbon solvent, an alicyclic hydrocarbon solvent, and an ether solvent are preferable.

The ring-opening polymerization reaction may be initiated, for example, by mixing the cyclic olefin monomer, the metal compound represented by the formula (1), and if necessary, the organometallic reductant. The order of mixing these components is not particularly limited. For example, a solution containing the metal compound represented by the formula (1) and the organometallic reductant may be mixed in a solution containing the cyclic olefin monomer. Alternatively, a solution containing the cyclic olefin monomer and the metal compound represented by the formula (1) may be mixed in a solution containing the organometallic reductant. Further, a solution containing the metal compound represented by the formula (1) may be mixed in a solution containing the cyclic olefin monomer and the organometallic reductant. When the respective components are mixed, the total amount of each of the components may be mixed at once, or the components may be mixed in a plurality of batches. The components may also be continuously mixed over a relatively long period of time (for example, 1 or more minutes).

The concentration of the cyclic olefin monomer in the reaction liquid at the time of starting the ring-opening polymerization reaction is preferably 1% by weight or more, more preferably 2% by weight or more, and particularly preferably 3% by weight or more, and is preferably 50% by weight or less, more preferably 45% by weight or less, and particularly preferably 40% by weight or less. When the concentration of the cyclic olefin monomer is equal to or more than the lower limit value of the aforementioned range, productivity can be enhanced. When the concentration thereof is equal to or less than the upper limit value, viscosity of the reaction liquid after the ring-opening polymerization reaction can be decreased. Therefore, the subsequent hydrogenation reaction can be facilitated.

The amount of the metal compound represented by the formula (1) used in the ring-opening polymerization reaction is desirably set so that the molar ratio of "metal compound: cyclic olefin monomer" falls within a specific range. Specifically, the aforementioned molar ratio is preferably 1:100 to 1:2,000,000, more preferably 1:500 to 1,000,000, and particularly preferably 1:1,000 to 1:500,000.

When the amount of the metal compound is equal to or more than the lower limit value of the aforementioned range, sufficient polymerization activity can be obtained. When the amount thereof is equal to or less than the upper limit value, the metal compound can be easily removed after the reaction.

The amount of the organometallic reductant is preferably 0.1 mol or more, more preferably 0.2 mol or more, and particularly preferably 0.5 mol or more, and is preferably 100 mol or less, more preferably 50 mol or less, and particularly preferably 20 mol or less, relative to 1 mol of the metal compound represented by the formula (1). When the amount of the organometallic reductant is equal to or more than the lower limit value of the aforementioned range, polymerization activity can be sufficiently enhanced.

When the amount thereof is equal to or less than the upper limit value, occurrence of a side reaction can be suppressed.

The polymerization reaction system of the polymer ($\alpha$) may contain an activity adjuster. When the activity adjuster is used, the ring-opening polymerization catalyst can be stabilized, the reaction speed of the ring-opening polymerization reaction can be adjusted, and the molecular weight distribution of the polymer can be adjusted.

As the activity adjuster, an organic compound having a functional group may be used. Examples of the activity adjuster may include an oxygen-containing compound, a nitrogen-containing compound, and a phosphorus-containing organic compound.

Examples of the oxygen-containing compound may include: ethers such as diethyl ether, diisopropyl ether, dibutyl ether, anisole, furan, and tetrahydrofuran; ketones such as acetone, benzophenone, and cyclohexanone; and esters such as ethyl acetate.

Examples of the nitrogen-containing compound may include: nitriles such as acetonitrile and benzonitrile; amines such as triethylamine, triisopropylamine, quinuclidine, and N,N-diethylaniline; and pyridines such as pyridine, 2,4-lutidine, 2,6-lutidine, and 2-t-butylpyridine.

Examples of the phosphorous-containing compound may include: phosphines such as triphenyl phosphine, tricyclohexyl phosphine, triphenyl phosphate, and trimethyl phosphate; and phosphine oxides such as triphenyl phosphine oxide.

As the activity adjuster, one type thereof may be solely used, and two or more types thereof may also be used in combination at any ratio.

The amount of the activity adjuster in the polymerization reaction system of the polymer ($\alpha$) is preferably 0.01 mol % to 100 mol % relative to 100 mol % of the metal compound represented by the formula (1).

In order to adjust the molecular weight of the polymer ($\alpha$), the polymerization reaction system of the polymer ($\alpha$) may contain a molecular weight adjuster. Examples of the molecular weight adjuster may include: $\alpha$-olefins such as 1-butene, 1-pentene, 1-hexene, and 1-octene; aromatic vinyl compounds such as styrene and vinyltoluene; an oxygen-containing vinyl compound such as ethyl vinyl ether, isobutyl vinyl ether, allyl glycidyl ether, allyl acetate, allyl alcohol, and glycidyl methacrylate; a halogen-containing vinyl compound such as allyl chloride; a nitrogen-containing vinyl compound such as acrylamide; non-conjugated dienes such as 1,4-pentadiene, 1,4-hexadiene, 1,5-hexadiene, 1,6-heptadiene, 2-methyl-1,4-pentadiene, and 2,5-dimethyl-1,5-hexadiene; and conjugated dienes such as 1,3-butadiene, 2-methyl-1,3-butadiene, 2,3-dimethyl-1,3-butadiene, 1,3-pentadiene, and 1,3-hexadiene.

As the molecular weight adjuster, one type thereof may be solely used, and two or more types thereof may also be used in combination at any ratio.

The amount of the molecular weight adjuster in the polymerization reaction system for polymerizing the polymer ($\alpha$) may be appropriately determined depending on an intended molecular weight. The specific amount of the molecular weight adjuster is preferably in a range of 0.1 mol % to 50 mol % relative to the cyclic olefin monomer.

The polymerization temperature is preferably −78° C. or higher, and more preferably −30° C. or higher, and is preferably +200° C. or lower, and more preferably +180° C. or lower.

The polymerization time may be dependent on reaction scale. The specific polymerization time is preferably in a range of 1 minute to 1,000 hours.

By the aforementioned production method, the polymer ($\alpha$) may be obtained. By hydrogenating this polymer ($\alpha$), the polymer ($\beta$) may be produced.

For example, the polymer ($\alpha$) may be hydrogenated by supplying hydrogen into the reaction system containing the polymer ($\alpha$) in the presence of a hydrogenation catalyst in accordance with an ordinary method. When reaction conditions in this hydrogenation reaction are appropriately set, the tacticity of the hydrogenated product is not usually altered by the hydrogenation reaction.

As the hydrogenation catalyst, a homogeneous catalyst or a heterogeneous catalyst that is publicly known as a hydrogenation catalyst for an olefin compound may be used.

Examples of the homogeneous catalyst may include a catalyst including a combination of a transition metal compound and an alkali metal compound such as cobalt acetate/triethylaluminum, nickel acetylacetonate/triisobutylaluminum, titanocene dichloride/n-butyllithium, zirconocene dichloride/sec-butyllithium, and tetrabutoxy titanate/dimethylmagnesium; and a noble metal complex catalyst such as dichlorobis(triphenylphosphine)palladium, chlorohydridecarbonyltris(triphenylphosphine)ruthenium, chlorohydridecarbonylbis(tricyclohexylphosphine)ruthenium, bis(tricyclohexylphosphine)benzylidyne ruthenium (IV) dichloride, and chlorotris(triphenylphosphine)rhodium.

Examples of the heterogeneous catalyst may include a metal catalyst such as nickel, palladium, platinum, rhodium, and ruthenium; and a solid catalyst in which the aforementioned metal is supported on a carrier such as carbon, silica, diatomaceous earth, alumina, or titanium oxide such as nickel/silica, nickel/diatomaceous earth, nickel/alumina, palladium/carbon, palladium/silica, palladium/diatomaceous earth, and palladium/alumina.

As the hydrogenation catalyst, one type thereof may be solely used, and two or more types thereof may also be used in combination at any ratio.

The hydrogenation reaction is usually performed in an inert organic solvent. Examples of the inert organic solvent may include: an aromatic hydrocarbon solvent such as benzene and toluene; an aliphatic hydrocarbon solvent such as pentane and hexane; an alicyclic hydrocarbon solvent such as cyclohexane and decahydronaphthalene; and an ether solvent such as tetrahydrofuran and ethylene glycol dimethyl ether. As the inert organic solvent, one type thereof may be solely used, and two or more types thereof may also be used in combination at any ratio. The inert organic solvent may be the same as or different from the organic solvent used in the ring-opening polymerization reaction. Furthermore, the hydrogenation catalyst may be mixed in the reaction liquid of the ring-opening polymerization reaction for performing the hydrogenation reaction.

The reaction conditions for the hydrogenation reaction usually vary depending on the hydrogenation catalyst used.

The reaction temperature of the hydrogenation reaction is preferably −20° C. or higher, more preferably −10° C. or higher, and particularly preferably 0° C. or higher, and is preferably +250° C. or lower, more preferably +220° C. or lower, and particularly preferably +200° C. or lower. When the reaction temperature is equal to or higher than the lower limit value of the aforementioned range, the reaction speed can be increased. When the reaction temperature is equal to or lower than the upper limit value, occurrence of a side reaction can be suppressed.

The hydrogen pressure is preferably 0.01 MPa or more, more preferably 0.05 MPa or more, and particularly preferably 0.1 MPa or more, and is preferably 20 MPa or less, more preferably 15 MPa or less, and particularly preferably 10 MPa or less. When the hydrogen pressure is equal to or more than the lower limit value of the aforementioned range, the reaction speed can be increased. When the hydrogen pressure is equal to or less than the upper limit value, a special apparatus such as a high pressure resistant reaction vessel is not required, and thereby facility costs can be reduced.

The reaction time of the hydrogenation reaction may be set to any time period during which a desired hydrogenation rate is achieved, and preferably 0.1 hour to 10 hours.

After the hydrogenation reaction, the polymer ($\beta$), which is the hydrogenated product of the polymer ($\alpha$), is usually collected in accordance with an ordinary method.

The hydrogenation rate (the ratio of the hydrogenated main-chain double bond) in the hydrogenation reaction is preferably 98% or more, and more preferably 99% or more. As the hydrogenation rate becomes higher, the heat resistance of the alicyclic structure-containing polymer can be made more favorable.

Herein, the hydrogenation rate of the polymer may be measured by a $^1$H-NMR measurement at 145° C. with o-dichlorobenzene-d$^4$ as a solvent.

Subsequently, the method for producing the polymer ($\gamma$) and the polymer ($\delta$) will be described.

The cyclic olefin monomer to be used for producing the polymers ($\gamma$) and ($\delta$) may be optionally selected from the range shown as the cyclic olefin monomers to be used for producing the polymer ($\alpha$) and the polymer ($\beta$). As the cyclic olefin monomer, one type thereof may be solely used, and two or more types thereof may also be used in combination at any ratio.

In the production of the polymer ($\gamma$), an optional monomer which is copolymerizable with a cyclic olefin monomer may be used as a monomer in combination with the cyclic olefin monomer. Examples of the optional monomer may include: $\alpha$-olefins of 2 to 20 carbon atoms such as ethylene, propylene, 1-butene, 1-pentene, and 1-hexene; an aromatic ring vinyl compound such as styrene and $\alpha$-methylstyrene; and non-conjugated dienes such as 1,4-hexadiene, 4-methyl-1, 4-hexadiene, 5-methyl-1,4-hexadiene, and 1,7-octadiene. Among these, an $\alpha$-olefin is preferable, and ethylene is more preferable. As the optional monomer, one type thereof may be solely used, and two or more types thereof may also be used in combination at any ratio.

The ratio between the cyclic olefin monomer and the optional monomer in terms of a weight ratio (cyclic olefin monomer:optional monomer) is preferably 30:70 to 99:1, more preferably 50:50 to 97:3, and particularly preferably 70:30 to 95:5.

When two or more types of the cyclic olefin monomers are used, or when the cyclic olefin monomer and the optional monomer are used in combination, the polymer ($\gamma$) may be a block copolymer, or a random copolymer.

For the synthesis of the polymer ($\gamma$), an addition polymerization catalyst is usually used. Examples of the addition polymerization catalyst may include a vanadium-based catalyst formed from a vanadium compound and an organoaluminum compound, a titanium-based catalyst formed from a titanium compound and an organoaluminum compound, and a zirconium-based catalyst formed from a zirconium complex and aluminoxane. As the addition polymerization catalyst, one type thereof may be solely used, and two or more types thereof may also be used in combination at any ratio.

The amount of the addition polymerization catalyst is preferably 0.000001 mol or more, and more preferably 0.00001 mol or more, and is preferably 0.1 mol or less, and more preferably 0.01 mol or less, relative to 1 mol of a monomer.

The addition polymerization of the cyclic olefin monomer is usually performed in an organic solvent. The organic solvent may be optionally selected from the range shown as the organic solvents to be used for the ring-opening polymerization of a cyclic olefin monomer. As the organic solvent, one type thereof may be solely used, and two or more types thereof may also be used in combination at any ratio.

The polymerization temperature in the polymerization for producing the polymer ($\gamma$) is preferably −50° C. or higher, more preferably −30° C. or higher, and particularly preferably −20° C. or higher, and is preferably 250° C. or lower, more preferably 200° C. or lower, and particularly preferably 150° C. or lower. The polymerization time is preferably 30 minutes or more, and more preferably 1 hour or more, and is preferably 20 hours or less, and more preferably 10 hours or less.

By the aforementioned production method, the polymer ($\gamma$) may be obtained. By hydrogenating this polymer ($\gamma$), the polymer ($\delta$) may be produced.

The hydrogenation of the polymer ($\gamma$) may be performed by a similar method to the method previously described as the method for hydrogenating the polymer ($\alpha$).

The crystallizable alicyclic structure-containing polymer preferably has a syndiotactic structure and more preferably has a high degree of syndiotactic stereoregularity. This can enhance the crystallizability of the alicyclic structure-containing polymer, so that hydrolysis resistance and chemical resistance can be improved. Furthermore, since the melting point thereof can be increased, heat resistance can be particularly improved. The degree of syndiotactic stereoregularity of the alicyclic structure-containing polymer may be represented by the ratio of the racemo diad of the alicyclic structure-containing polymer. The specific ratio of the racemo diad in the alicyclic structure-containing polymer is preferably 51% or more, more preferably 60% or more, and particularly preferably 70% or more.

The ratio of the racemo diad may be measured by a $^{13}$C-NMR spectrum analysis. Specifically, the measurement may be performed by the following method.

The $^{13}$C-NMR measurement of a polymer sample is performed at 200° C. with ortho-dichlorobenzene-d$^4$ as a solvent by an inverse-gated decoupling method. From the result of this $^{13}$C-NMR measurement, the ratio of the racemo diad of the polymer sample may be determined on the basis of the ratio of signal strength of a signal at 43.35 ppm derived from the meso diad and a signal at 43.43 ppm derived from the racemo diad with the peak at 127.5 ppm of ortho-dichlorobenzene-d$^4$ as a reference shift.

The weight-average molecular weight (Mw) of the crystallizable polymer is preferably 1,000 or more, and more preferably 2,000 or more, and is preferably 1,000,000 or less, and more preferably 500,000 or less. When the weight-average molecular weight falls within such a range, the balance between the molding processability and the heat resistance of the resin is excellent. In particular, when the crystallizable polymer is an alicyclic structure-containing polymer, such a tendency is remarkable.

The molecular weight distribution (Mw/Mn) of the crystallizable polymer is preferably 1.0 or more, and more preferably 1.5 or more, and is preferably 4.0 or less, and more preferably 3.5 or less. A crystallizable polymer having such a molecular weight distribution has excellent molding processability. In particular, when the crystallizable polymer is an alicyclic structure-containing polymer, such a tendency is remarkable.

The glass transition temperature of the crystallizable polymer is not particularly limited, but is usually 85° C. or higher, and usually 170° C. or lower.

The crystallization of the crystallizable polymer may not be developed before the film sensor member is produced, but it is preferable that the crystallization is developed sufficiently after the film sensor member is produced. The specific range of crystallinity of the crystallizable polymer contained in λ/4 plate which the film sensor member includes is preferably 10% or more, more preferably 15% or more, and particularly preferably 20% or more. When the crystallinity is equal to or more than the lower limit value of the aforementioned range, favorable properties such as high heat resistance, chemical resistance, and tensile elastic modulus can be imparted to the film sensor member. The upper limit of the crystallinity is not particularly limited, but is preferably 70% or less, more preferably 60% or less, and particularly preferably 50% or less from the viewpoint of transparency. The crystallinity of the polymer may be measured by an X-ray diffraction method.

The ratio of the crystallizable polymer in the first thermoplastic resin is preferably 50% by weight or more, more preferably 70% by weight or more, and particularly preferably 90% by weight or more. When the ratio of the crystallizable polymer is equal to or more than the lower limit value of the aforementioned range, heat resistance and tensile elastic modulus can be enhanced.

(3.1.3. Optional Component)

The first thermoplastic resin may contain an optional component in combination with the amorphous polymer and the crystallizable polymer described above.

For example, the first thermoplastic resin may contain, as an optional component, an additive which is capable of efficiently absorbing $CO_2$ laser light. A film such as the λ/4 plate, the λ/2 plate, and the film sensor member is sometimes cut into a desired shape, and bonded to the linear polarizer in a sheet piece shape to obtain a laminated film having an optional optical axis relationship. Furthermore, in some cases, the laminated film and a liquid crystal cell are bonded to prepare a panel, and spaces are provided by notching the four corners of the panel to perform the wiring of a display device without increasing the thickness. One of the methods for cutting the film at this time is the $CO_2$ laser cutting method. For efficiently performing the cutting by a $CO_2$ laser, the first thermoplastic resin may contain an additive which is capable of efficiently absorbing $CO_2$ laser light (for example, around a wavelength of 9.4 μm). Examples of the additive may include an ester compound such as a phosphoric acid ester compound, a carboxylic acid ester compound, a phthalic acid ester compound, and an adipic acid ester compound.

Examples of the optional components may include an antioxidant such as a phenolic antioxidant, a phosphorus antioxidant, and a sulfur antioxidant; a light stabilizer such as a hindered amine-based light stabilizer; a wax such as a petroleum wax, a Fischer-Tropsch wax, and a polyalkylene wax; a nucleating agent such as a sorbitol compound, a metal salt of an organophosphorous acid, a metal salt of an organocarboxylic acid, kaolin, and talc; a fluorescent brightener such as a diaminostilbene derivative, a coumarin derivative, an azole derivative (for example, a benzoxazole derivative, a benzotriazole derivative, a benzimidazole derivative, and a benzothiazole derivative), a carbazole derivative, a pyridine derivative, a naphthalic acid derivative, and an imidazolone derivative; an inorganic filler such as talc, silica, calcium carbonate, and glass fibers; a colorant such as a pigment and a dye; a dispersant, a heat stabilizer; a light stabilizer; a flame retardant; a flame retardant aid; an antistatic agent; an antioxidant; a plasticizer; a near-infrared absorber; a surfactant; a lubricant; and a filler.

As the optional component, one type thereof may be solely used, and two or more types thereof may also be used in combination at any ratio.

(3.1.4. Intrinsic Birefringence Value of First Thermoplastic Resin)

The first thermoplastic resin preferably has a positive intrinsic birefringence value. A resin having a positive intrinsic birefringence value means a resin in which the refractive index in the stretching direction is larger than the refractive index in the direction orthogonal thereto. The intrinsic birefringence value can be calculated from the dielectric constant distribution. When a resin having a positive intrinsic birefringence value is adopted as the first thermoplastic resin, it is possible to easily obtain a λ/4 plate having favorable properties such as a high orientation regulating force, a high strength, low costs, and a low thermal size change ratio.

[3.2. Properties of λ/4 Plate]

The in-plane retardation of the λ/4 plate may be appropriately set within a range in which the broadband λ/4 plate can be achieved by the combination of the λ/2 plate and the λ/4 plate. The specific in-plane retardation Re of the λ/4 plate is preferably 110 nm or more, and more preferably 118 nm or more, and is preferably 154 nm or less, more preferably 138 nm or less, and particularly preferably 128 nm or less. Since the λ/4 plate has such an in-plane retardation Re, the combination of the λ/2 plate and the λ/4 plate can function as a broadband λ/4 plate. Therefore, visibility when the image display device including the film sensor member is viewed with the polarized sunglasses worn can thereby be enhanced by widening the range of colors that can be visually recognized.

The NZ factor of the λ/4 plate is preferably 0.95 or more, more preferably 0.97 or more, and particularly preferably 0.99 or more, and is preferably 1.05 or less, more preferably 1.03 or less, and particularly preferably 1.01 or less. When the NZ factor of the λ/4 plate is close to 1.0 and the optical uniaxiallity of the λ/4 plate is high, the combination of the λ/2 plate and the λ/4 plate with the NZ factor falls within a specific range can favorably function as the broadband λ/4 plate.

The λ/4 plate may have a wavelength dispersion property such as a forward wavelength dispersion property, a flat wavelength dispersion property, and a reverse wavelength dispersion property. The forward wavelength dispersion property mean a wavelength dispersion property in which the retardation becomes larger as the wavelength becomes shorter. The reverse wavelength dispersion property mean a wavelength dispersion property in which the retardation becomes smaller as the wavelength becomes shorter. The flat wavelength dispersion property mean a wavelength dispersion property in which the retardation does not change depending on the wavelength.

Figure 2:
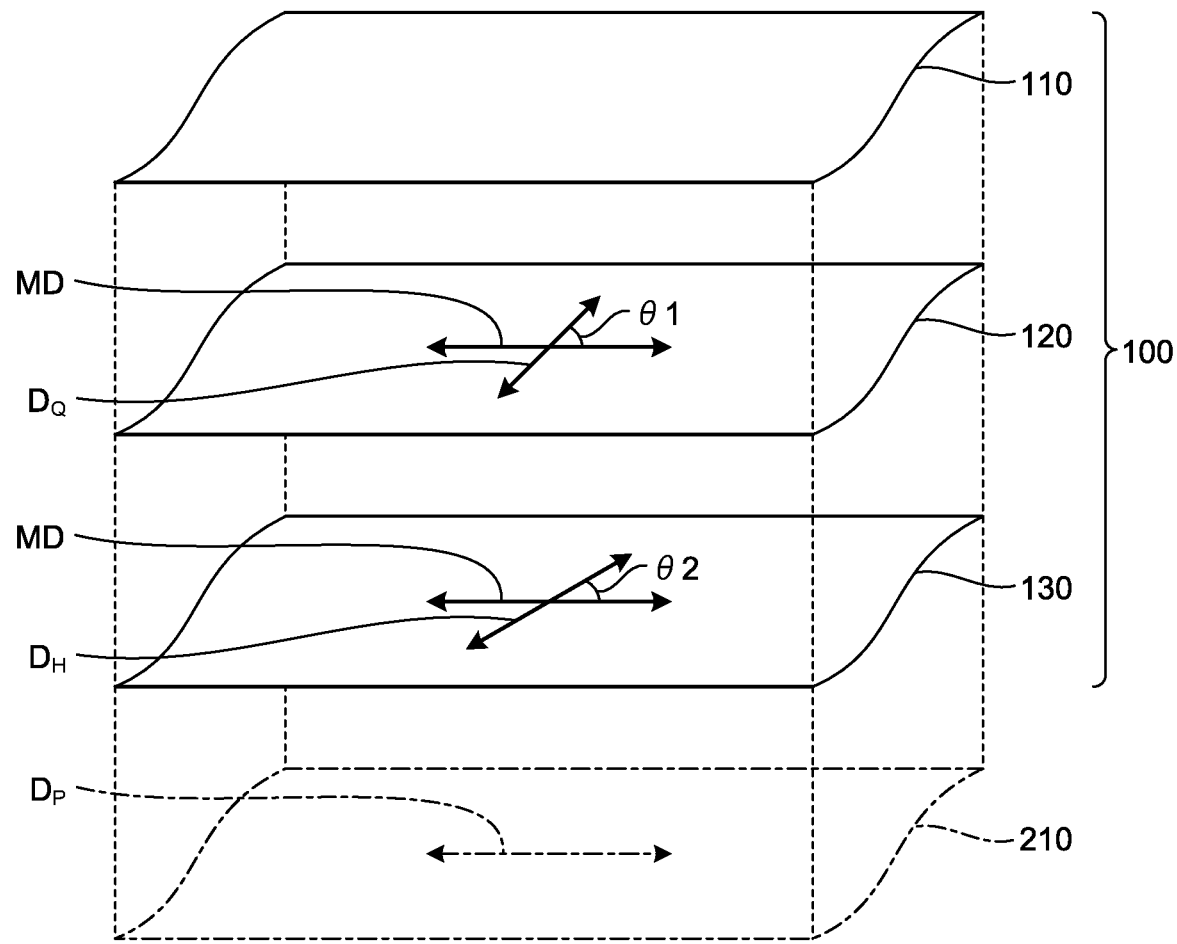
FIG. 2 is an exploded perspective view schematically illustrating a film sensor member as an example of the present invention.

FIG. 2 is an exploded perspective view schematically illustrating a film sensor member 100 as an example of the present invention. FIG. 2 also illustrates a linear polarizer 210, indicated by dot-and-dash line, to be bonded to the film sensor member 100 for producing a circularly polarizing plate.

When the film sensor member 100 has a long-length shape as exemplified in FIG. 2, an orientation angle θ1 formed by a slow axis $D_Q$ of the λ/4 plate 120 with respect to a lengthwise direction MD of the film sensor member 100 may be optionally set within a range in which the broadband λ/4 plate can be achieved by the combination of the λ/4 plate 120 and the λ/2 plate 130. The specific range of the orientation angle θ1 is preferably 75°±5°, more preferably 75°±3°, and particularly preferably 75°±1°.

In general, the long-length linear polarizer 210 has a polarized light absorption axis $D_P$ which is parallel to the lengthwise direction of the linear polarizer 210. In producing a long-length circularly polarizing plate with the long-length film sensor member 100 and the long-length linear polarizer 210, bonding is usually performed with the lengthwise direction MD of the film sensor member 100 and the lengthwise direction of the linear polarizer 210 aligned in parallel to each other. Therefore, in the produced circularly polarizing plate, the orientation angle θ1 of the λ/4 plate 120 may be the same as an angle formed by a slow axis $D_Q$ of the λ/4 plate 120 with respect to the polarized light absorption axis $D_P$ of the linear polarizer 210. In the circularly polarizing plate obtained in this manner, the film sensor member including the combination of the λ/4 plate 120 and the λ/2 plate 130 can serve as a broadband λ/4 plate, so that the linearly polarized light in a wide wavelength range having passed through the linear polarizer 210 can be stably converted into circularly polarized light. Thus, when the orientation angle θ1 of the λ/4 plate 120 falls within the aforementioned range, a circularly polarizing plate capable of functioning in a wide wavelength range can be produced by bonding the film sensor member 100 and the linear polarizer 210 by a roll-to-roll method.

The total light transmittance of the λ/4 plate is preferably 80% or more.

The haze of the λ/4 plate is preferably 5% or less, more preferably 3% or less, particularly preferably 1% or less, and ideally 0%. As the haze, an average value of haze values measured at five points by using a "turbidimeter NDH-300A" manufactured by Nippon Denshoku Industries Co., Ltd., in accordance with JIS K7361-1997 may be adopted.

The amount of volatile components contained in the λ/4 plate is preferably 0.1% by weight or less, more preferably 0.05% by weight or less, more preferably 0.02% by weight or less, and ideally zero. When the amount of the volatile components is reduced, the size stability of the λ/4 plate is improved, and a change in optical properties such as retardation with the lapse of time can be reduced.

The volatile component herein is a substance having a molecular weight of 200 or less and contained in a small amount in the film, and may include, for example, a residual monomer, a solvent, and the like. The amount of volatile components may be quantified by dissolving a film in chloroform and analyzing them by gas chromatography as the sum of substances with a molecular weight of 200 or less contained in the film.

The saturation water absorption ratio of the λ/4 plate is preferably 0.03% by weight or less, more preferably 0.02% by weight or less, particularly preferably 0.01% by weight or less, and ideally zero. When the saturation water absorption ratio of the λ/4 plate falls within the aforementioned range, a change in optical properties such as an in-plane retardation with time can be reduced.

Herein, the saturation water absorption ratio is a value expressed in percentage of an increased weight obtained by immersing a film test piece in water at 23° C. for 24 hours relative to the weight of the film test piece before the immersion.

The absolute value of the photoelastic coefficient of the λ/4 plate is preferably $2.0 \times 10^{-11}$ Pa$^{-1}$ or less, more preferably $1.0 \times 10^{-11}$ Pa$^{-1}$ or less, and particularly preferably $6.0 \times 10^{-11}$ Pa$^{-1}$. The photoelastic coefficient is a value indicating the stress dependence of birefringence generated when the plate is subjected to stress, and has a relationship in which the difference Δn between the refractive indices is obtained by the product of the stress σ and the photoelastic coefficient C (Δn=C·σ). Since the absolute value of the photoelastic coefficient is equal to or less than the aforementioned upper limit, favorable optical performance can be exerted even when an impact is given to the λ/4 plate or the plate is deformed in order to adapt to an image display device having a curved display surface.

The photoelastic coefficient may be measured by the following method.

The in-plane retardation of a film is measured under the conditions of a temperature of 20° C.±2° C. and a humidity of 60±5% while a load in a range of 50 g to 150 g is applied to the film. The measured in-plane retardation is divided by the thickness of the film to obtain a birefringence value Δn. The birefringence values Δn are measured while the load is varied. From the results, a load-Δn curve is created. Then, the slope of this load-Δn curve is measured as a photoelastic coefficient.

It is preferable that the absolute value of the thermal size change ratio in the plane of the film when the λ/4 plate is heated is a specific small value. Specifically, the absolute value of the thermal size change ratio in the plane of the film when the λ/4 plate is heated at 150° C. for 1 hour is preferably 1% or less, more preferably 0.5% or less, further more preferably 0.1% or less. Since the λ/4 plate usually shrinks in a high temperature environment, the thermal size change ratio usually has a negative value. With such a low absolute value of the thermal size change ratio, the occurrence of failures due to the formation of the transparent electroconductive layer can be suppressed, and thereby production of a high-quality film sensor member can be facilitated. Also, when the film sensor member is used as a constituent of an image display device, high durability and excellent optical properties can be exerted.

The thermal size change ratio of a film such as the λ/4 plate may be measured by the following method.

The film is cut out under the environment of a room temperature of 23° C. to obtain a sample film of 150 mm×150 mm size square. This sample film is heated in an oven at 150° C. for 60 minutes, and cooled to 23° C. (room temperature). After that, the lengths of the four edges and two diagonals of the sample film are measured.

On the basis of each of the measured lengths of the four edges, the thermal size change ratio is calculated according to the following formula (I). In formula (I), $L_A$ indicates the length [mm] of an edge of a sample film after heating.

$$\text{Thermal size change ratio (\%)} = [(L_A - 150)/150] \times 100 \quad \text{(I)}$$

Further, on the basis of the measured lengths of the two diagonals, the thermal size change ratio is calculated according to the following formula (II). In formula (II), $L_D$ indicates the length [mm] of a diagonal of a sample film after heating.

$$\text{Thermal size change ratio (\%)} = [(L_D - 212.13)/212.13] \times 100 \quad \text{(II)}$$

The maximum value among the six calculated values of the thermal size change ratio is adopted as the thermal size change ratio of the film. The thermal size change ratio obtained by such measurement can be substantially the maximum value of the thermal size change ratio values measured in all in-plane directions.

The birefringence value Δn of the λ/4 plate is preferably 0.0010 or more, and more preferably 0.003 or more. The upper limit of the birefringence value Δn is not particularly limited, but is usually 0.1 or less. When the birefringence value of the λ/4 plate is equal to or more than the aforementioned lower limit value, a film sensor member having desired optical properties and nevertheless having a thin thickness can be obtained.

[3.3. Thickness of λ/4 Plate]

The thickness of the λ/4 plate is preferably 10 μm or more, more preferably 13 μm or more, and particularly preferably 15 μm or more, and is preferably 60 μm or less, more preferably 58 μm or less, and particularly preferably 55 μm or less. When the thickness of the λ/4 plate is equal to or more than the lower limit value of the aforementioned range, desired retardation can be exhibited. When the thickness is equal to or less than the upper limit value of the aforementioned range, thinning can be achieved.

[3.4. Method for Producing λ/4 Plate]

The method for producing the λ/4 plate may be any method. The λ/4 plate may be produced as a stretched film by a production method including, for example, subjecting a long-length pre-stretch substrate formed of the first thermoplastic resin to stretching. In particular, it is preferable that the λ/4 plate is produced as an obliquely stretched film by a production method including subjecting a long-length pre-stretch substrate to oblique stretching one or more times. "Oblique stretching" herein means stretching a long-length film in an oblique direction. According to the production method including the oblique stretching, the λ/4 plate can be easily produced.

Hereinafter, an example of a preferable production method of the λ/4 plate will be described. The method for producing the λ/4 plate according to this example includes (a) a first step of preparing a long-length pre-stretch substrate formed of the first thermoplastic resin, and (b) a second step of stretching the long-length pre-stretch substrate to obtain the long-length λ/4 plate.

In the first step (a), a long-length pre-stretch substrate is prepared. The pre-stretch substrate may be produced, for example, by a melt molding method or a solution casting method. More specific examples of the melt molding method may include an extrusion molding method, a press molding method, an inflation molding method, an injection molding method, a blow molding method, and a stretch molding method. Among these methods, for obtaining a λ/4 plate having excellent mechanical strength, surface accuracy, and the like, an extrusion molding method, an inflation molding method, or a press molding method is preferable. Among these, an extrusion molding method is particularly preferable from the viewpoint of making it possible to produce the λ/4 plate efficiently and easily.

After preparing a long-length pre-stretch substrate in the first step (a), the second step (b) is performed in which the long-length pre-stretch substrate is stretched to obtain a λ/4 plate as a stretched film. In the second step (b), usually stretching is performed while the pre-stretch substrate is continuously conveyed in the lengthwise direction. In this case, the stretching direction may be the lengthwise direction or widthwise direction of the film, but it is preferable that the stretching direction is an oblique direction. The stretching may be free uniaxial stretching in which no restraining force is applied in a direction other than the stretching direction, or may be stretching in which a restraining force is also applied in directions other than the stretching direction. Herein, free uniaxial stretching refers to stretching in one direction and not applying a restraining force in a direction other than the stretched direction. The stretching may be performed using any stretching machine, such as a roll stretching machine, and a tenter stretching machine. Among these, when oblique stretching is performed, it is preferable to use a tenter stretching machine. The tenter stretching machine has a plurality of grippers capable of gripping respective ends in the film widthwise direction of the pre-stretch substrate, and can achieve stretching in an optional direction by stretching the pre-stretch substrate in a specific direction with the grippers.

The stretching ratio in the second step (b) is preferably 1.1 times or more, more preferably 1.15 times or more, further preferably 1.2 times or more, and particularly preferably 1.5 times or more, and is preferably 20 times or less, more preferably 10 times or less, further preferably 5.0 times or less, still further preferably 3.0 times or less, especially preferably 2.8 times or less, and particularly preferably 2.6 times or less. When the stretching ratio in the second step (b) is equal to or more than the lower limit value of the aforementioned range, the refractive index in the stretching direction can be increased. Further, when the stretching ratio is equal to or less than the upper limit value, the slow axis direction of the λ/4 plate can be easily controlled.

The stretching temperature in the second step (b) is preferably $Tg_1-30°$ C. or higher, more preferably $Tg_1-20°$ C. or higher, further preferably $Tg_1-10°$ C. or higher, still further preferably $Tg_1-5°$ C. or higher, especially preferably $Tg_1-2°$ C. or higher, and particularly preferably $Tg_1°$ C. or higher, and is preferably $Tg_1+60°$ C. or lower, more preferably $Tg_1+50°$ C. or lower, further preferably $Tg_1+40°$ C. or lower, still further preferably $Tg_1+35°$ C. or lower, and particularly preferably $Tg_1+30°$ C. or lower. "$Tg_1$" herein represents the glass transition temperature of the polymer contained in the first thermoplastic resin. When the stretching temperature in the second step (b) falls within the aforementioned range, molecules contained in the pre-stretch substrate can be reliably oriented, and therefore, a λ/4 plate having desired optical properties can be easily obtained.

The method for producing the λ/4 plate shown in the aforementioned example may be further changed and performed within a range in which a desired λ/4 plate can be obtained. Therefore, the method for producing the λ/4 plate may further include an optional step in combination with the above-described steps. For example, when the first thermoplastic resin contains a crystallizable polymer, the method for producing the λ/4 plate may include (c) a step of promoting crystallization of the crystallizable polymer after the second step (b) (crystallization promoting step). By promoting crystallization, a λ/4 plate having desired properties can be easily obtained.

The crystallization may be promoted by adjusting the temperature of the stretched film obtained in the second step (b) to a specific temperature. The temperature range at the time of promoting crystallization may be optionally set in a temperature range of the glass transition temperature $Tg_c$ of the crystallizable polymer or higher and the melting point Tm of the crystallizable polymer or lower. Among these, it is preferable to set the temperature range so as to increase the speed of crystallization, and specifically, it is preferably $Tg_c+20°$ C. or higher, and more preferably $Tg_c+30°$ C. or higher, and is preferably Tm−20° C. or lower, and more preferably Tm−40° C. or lower. When the temperature in promoting crystallization is equal to or higher than the lower limit value of the aforementioned range, crystallization can be effectively promoted. When the temperature is equal to or lower than the upper limit value, clouding of the λ/4 plate can be suppressed.

When the stretched film is brought to the above-mentioned temperature, heating of the stretched film is usually performed. As the heating device used at this time, a heating device that raises the ambient temperature of the stretched film is preferable. Specific examples of suitable heating devices may include an oven and a heating furnace. Heating by such a heating device does not require contact with the stretched film, so that uniform heating can be performed.

The promotion of crystallization is preferably performed in a state in which the stretched film is strained with its shape retained. Accordingly, the deformation due to the thermal shrinkage of the stretched film during the promotion of crystallization can be suppressed. Consequently, crystallization of the polymer in the stretched film can be promoted without impairing the smoothness of the stretched film. The state in which the stretched film is strained herein refers to a state in which tension is applied to the stretched film. However, this state in which the stretched film is strained does not include a state in which the stretched film is substantially stretched. Being substantially stretched means that the stretching ratio in any direction of the stretched film becomes usually 1.1 times or more.

In the case of holding the stretched film, the stretched film is held by an appropriate holder. The holder may be for continuously holding the stretched film or for intermittently holding the stretched film with intervals. For example, the stretched film may be intermittently held by holders disposed at specific intervals.

The stretched film may be brought into the strained state by, for example, holding two or more edges of the stretched film. Accordingly, the deformation due to the thermal shrinkage of the stretched film can be prevented in a region which is held and brought into the strained state. In order to prevent deformation in a wide area of the stretched film, the stretched film is preferably held at edges including two opposing edges so that the region between the held edges is brought into the strained state. For example, as to a rectangular stretched film having a sheet piece shape, deformation can be prevented on the entire surface of the stretched film in a sheet piece shape, by holding two opposing edges (for example, two long edges or two short edges) of the stretched film so that the region between the two edges is brought into the strained state. Alternatively, for example, as to a long-length stretched film, deformation is prevented on the entire surface of the long-length stretched film by holding two edges (that is, long edges) positioned on the ends in the widthwise direction of the stretched film so that the region between the two edges is brought into the strained state. As to the stretched film whose deformation is prevented in this manner, the occurrence of deformation such as wrinkles can be suppressed even when stress is generated in the film due to thermal shrinkage. In this case, for example, when the stretched film is held at edges including two edges orthogonal to the stretched direction (a direction having a larger stretching ratio for biaxial stretching) to provide tension in the stretched direction so that the stretched film is strained, deformation is particularly effectively suppressed.

It is preferable to hold the stretched film at as many edges as possible in order to effectively suppress the deformation due to the promotion of crystallization. Therefore, for example, a stretched film in a sheet piece shape is preferably held at all the edges. Specifically, for example, a rectangular stretched film having a sheet piece shape is preferably held at four edges.

The holder capable of holding the stretched film at edges is preferably a holder which does not cause any contact with the stretched film at a portion other than the edges of the stretched film. With such a holder, a λ/4 plate having further excellent smoothness can be obtained.

It is also preferable that the holder is capable of fixing the relative position between holders in the crystallization promoting step (c). With such holders, the relative position between holders does not move in the crystallization promoting step (c). Therefore, the substantial stretching and shrinking of the stretched film is easily suppressed.

An example of suitable holders may be, as holders for rectangular stretched films, grippers such as clips disposed along a frame at specific intervals for gripping the edges of the stretched film. An example of a holder for holding two edges on the ends in the widthwise direction of a long-length stretched film may be grippers provided to a tenter stretching machine for gripping the edges of the stretched film.

Although the long-length stretched film may be held at edges on the ends in the lengthwise direction of the stretched film (that is, short edges), it may be held at, instead of the aforementioned edges, both ends in the lengthwise direction of a treatment region of the stretched film which is adjusted at a specific temperature for promoting crystallization. For example, a holding device capable of holding the stretched film so that the film becomes in the strained state for inhibiting thermal shrinkage may be provided on both edges in the lengthwise direction of the treatment region of the stretched film. Examples of such a holding device may include a combination of two rolls and a combination of an extruder and a draw-off roll. When tension such as conveyance tension is added to the stretched film by these combinations, the thermal shrinkage of the stretched film can be suppressed in a treatment region in which crystallization is promoted. Therefore, when the aforementioned combinations are used as a holding device, the stretched film can be held while being conveyed in the lengthwise direction. Thus, the λ/4 plate can be efficiently produced.

Also, the crystallization promoting step (c) cancels the stress in the film which may cause a size change under a high temperature environment. Accordingly, a λ/4 plate having small thermal expansion and a small thermal size change ratio can be produced.

The treatment time during which a specific temperature for promoting the crystallization of the stretched film is maintained is preferably 1 second or more, and more preferably 5 seconds or more, and is preferably 30 minutes or less, and more preferably 10 minutes or less. When the treatment time is equal to or more than the lower limit value of the aforementioned range, crystallization of the polymer contained in the stretched film can sufficiently be developed to effectively enhance heat resistance of the λ/4 plate. When the treatment time is equal to or less than the upper limit value of the aforementioned range, clouding of the λ/4 plate can be suppressed.

When the first thermoplastic resin contains a crystallizable polymer, the method for producing the λ/4 plate may further include, after the second step (b), (d) a step of relaxing the strain of the stretched film while maintaining the stretched film flat (relaxation step). When the method for producing the λ/4 plate includes the crystallization promoting step (c), it is preferable to perform the relaxation step (d) is after the crystallization promoting step (c).

The relaxation of the strain of the stretched film refers to release of the stretched film from the state of being held and strained by a stretching machine or a holding device for stretching or promoting crystallization; the stretched film may be held by a holding device as long as the stretched film is not strained. When strain is relaxed in this manner, the stretched film becomes susceptible to thermal shrinkage. In the relaxation step (d), stress which may be generated in the λ/4 plate during heating is cancelled by causing thermal shrinkage to the stretched film. Accordingly, the thermal shrinkage of the λ/4 plate under a high temperature environment can be reduced. Thus, a λ/4 plate having excellent size stability under a high temperature environment can be obtained.

The relaxation of the strain of the stretched film may be performed at once, or may be continuously or stepwise performed over a period of time. However, to suppress the occurrence of deformation such as rippling and wrinkles of the obtained λ/4 plate, the relaxation of the strain is preferably performed continuously or stepwise.

The relaxation of the strain of the stretched film is performed while the stretched film is maintained flat. Herein, maintaining the stretched film flat refers to maintaining the shape of the stretched film to be a planar shape so that deformation such as rippling and wrinkles does not occur in the stretched film. Thereby the deformation such as rippling and wrinkles of the obtained λ/4 plate can be suppressed.

The treatment temperature of the stretched film during the relaxation of strain may be set within the temperature range of the glass transition temperature $Tg_c$ of the crystallizable polymer or higher and the melting point Tm of the crystallizable polymer or lower. The specific treatment temperature is preferably $Tg_c+20°$ C. or higher, and more preferably $Tg_c+30°$ C. or higher, and is preferably Tm−20° C. or lower, and more preferably Tm−40° C. or lower. When the relaxation step (d) is performed subsequently to the crystallization promoting step (c) without performing cooling therebetween, the treatment temperature of the stretched film during the relaxation step (d) is preferably the same as the temperature during the crystallization promoting step (c). Thereby the temperature unevenness of the stretched film in the relaxation step (d) can be suppressed, and the productivity of the λ/4 plate can be enhanced.

The treatment time during which the stretched film is maintained within the aforementioned temperature range in the relaxation step (d) is preferably 1 second or more, and more preferably 5 seconds or more, and is preferably 10 minutes or less. When the treatment time is equal to or more than the lower limit value of the aforementioned range, the size stability of the λ/4 plate under a high temperature environment can be effectively enhanced. When the treatment time is equal to or less than the upper limit value, the size stability of the λ/4 plate under a high temperature environment can be effectively enhanced, and the clouding of the λ/4 plate due to the development of crystallization in the relaxation step (d) can be suppressed.

When the strain of the stretched film having a sheet piece shape is relaxed in the relaxation step (d), there may be adopted, for example, a method of continuously or stepwise narrowing the distance between held portions while four edges of the stretched film are held. In this case, the distance between held portions may be simultaneously narrowed at the four edges of the stretched film. Alternatively, the distance between held portions may be narrowed at some of the edges, and after that at other edges. Further alternatively, the distance between held portions may be maintained without being narrowed at some of the edges. Further alternatively, the distance between held portions may be continuously or stepwise narrowed at some of the edges, and simultaneously narrowed at other edges.

When the strain of the long-length stretched film is relaxed in the relaxation step (d) as previously described, there may be adopted, for example, a method of using a tenter stretching machine to narrow the distance between guide rails capable of guiding grippers such as clips in the conveyance direction of the stretched film or to narrow the distance between neighboring grippers.

When the relaxation of the strain of the stretched film is performed by narrowing the distance between held portions while the stretched film is held as previously described, the degree to which the distance is narrowed may be set depending on the magnitude of the stress remaining in the stretched film. The specific degree to which the holding distance is narrowed in the relaxation step (d) is preferably 0.1 S or more, more preferably 0.5 S or more, and particularly preferably 0.7 S or more, and is preferably 1.2 S or less, more preferably 1.0 S or less, and particularly preferably 0.95 S or less. Herein, S (%) is the thermal shrinkage when the stretched film is not strained at a treatment temperature in the relaxation step (d). When the thermal shrinkage S is anisotropic such as in a case wherein the thermal shrinkage S differs between two directions orthogonal to each other, the degree to which the holding distance is narrowed may be set within the aforementioned range for each of the directions. Within such a range, the stress remaining in the λ/4 plate can be sufficiently removed, and the flatness can be maintained.

The thermal shrinkage S may be measured by the following method.

The stretched film is cut out under the environment of a room temperature of 23° C. to obtain a sample film of 150 mm×150 mm size square. This sample film is heated in an oven set at the same temperature as the treatment temperature in the relaxation step (d) for 60 minutes, and cooled to 23° C. (room temperature). After that, the lengths of two edges parallel to a direction in which the thermal shrinkage S of the sample film is to be obtained are measured.

On the basis of each of the measured lengths of the two edges, the thermal shrinkage S of the sample film is calculated according to the following formula (A). In the formula (A), $L_1$ indicates the length [mm] of one of the measured two edges of the sample film after heating, and $L_2$ indicates the length [mm] of the other.

$$\text{Thermal shrinkage } S(\%)=[(300-L_1-L_2)/300]\times100 \qquad (A)$$

The method for producing the λ/4 plate may further includes, for example, a step of stretching the pre-stretch substrate in an optional direction before being stretched in the aforementioned step, a step of trimming both ends of the produced λ/4 plate, a step of disposing a protective layer on the surface of the λ/4 plate, and a step of subjecting the surface of the λ/4 plate to a surface treatment such as a chemical treatment or a physical treatment.

[4. λ/2 Plate]

[4.1. Composition of λ/2 Plate]

The λ/2 plate includes, in this order, a first outer layer formed of a second thermoplastic resin, an intermediate layer formed of a third thermoplastic resin containing an ultraviolet absorber, and a second outer layer formed of a fourth thermoplastic resin. In the λ/2 plate, the first outer layer and the intermediate layer are usually in direct contact with each other without another layer interposed therebetween, and the intermediate layer and the second outer layer are usually in direct contact with each other without another layer interposed therebetween. Since the λ/2 plate includes the intermediate layer containing an ultraviolet absorber, ultraviolet light passing through the λ/2 plate can be attenuated. Therefore, when the surface of the film sensor member on the λ/2 plate side is irradiated with ultraviolet light, the energy of the ultraviolet light entering the λ/4 plate and the transparent electroconductive layer can be attenuated. Therefore, in the case of producing a circularly polarizing plate by bonding a linear polarizer to the λ/2 plate side surface of the film sensor member, even when the ultraviolet curable adhesive is irradiated with ultraviolet light through the linear polarizer, occurrence of material deterioration by the ultraviolet light in the layered portion from the λ/4 plate to the transparent electroconductive layer is suppressed. Therefore, it is possible to suppress the deterioration of the adhesiveness of the transparent electroconductive layer due to the bonding operation between the film sensor member and the linear polarizer, so that it is possible to produce a circularly polarizing plate including the transparent electroconductive layer having excellent adhesiveness. Further, since the λ/2 plate includes the first outer layer and the second outer layer on both sides of the intermediate layer, bleed-out of the ultraviolet absorber contained in the intermediate layer can be suppressed.

(4.1.1. Third Thermoplastic Resin Contained in Intermediate Layer, and Thickness Thereof)

The intermediate layer is formed of a third thermoplastic resin containing an ultraviolet absorber. The third thermoplastic resin usually contains a polymer and an ultraviolet absorber.

As the polymer in the third thermoplastic resin, a thermoplastic polymer is usually used. As the thermoplastic polymer, for example, a polymer in the range described as a polymer which may be contained in the λ/4 plate may be optionally used. Thereby the same advantages as those described in the description of the λ/4 plate can be obtained. Further, the glass transition temperature and the melting point of the polymer contained in the third thermoplastic resin are not limited. Therefore, examples of the polymer contained in the third thermoplastic resin may include polymers that are the same type as the polymers that may be contained in the λ/4 plate and of which the glass transition temperature or the melting point does not fall within the specific range described above. Among these, an alicyclic structure-containing polymer is preferable as the polymer because of its excellent mechanical properties, heat resistance, transparency, low hygroscopicity, size stability, and light weight properties. As the polymer contained in the third thermoplastic resin, one type thereof may be solely used, and two or more types thereof may also be used in combination at any ratio.

The glass transition temperature of the polymer contained in the third thermoplastic resin is preferably 100° C. or higher, more preferably 110° C. or higher, and particularly preferably 120° C. or higher, and is preferably 170° C. or lower, more preferably 160° C. or lower, and particularly preferably 140° C. or lower. When the glass transition temperature of the polymer is equal to or higher than the lower limit value of the aforementioned range, the durability of the λ/2 plate in a high temperature environment can be enhanced. When the glass transition temperature is equal to or lower than the upper limit value of the aforementioned range, the stretching treatment can be easily performed.

The absolute value of the photoelastic coefficient of the polymer contained in the third thermoplastic resin is preferably $10 \times 10^{-12}$ $Pa^{-1}$ or less, more preferably $7 \times 10^{-12}$ $Pa^{-1}$ or less, and particularly preferably $4 \times 10^{-12}$ $Pa^{-1}$ or less. This makes it possible to reduce fluctuation in retardation of the λ/2 plate.

The amount of the polymer in the third thermoplastic resin is preferably 80.0% by weight or more, more preferably 82.0% by weight or more, and particularly preferably 84.0% by weight or more, and is preferably 97.0% by weight or less, more preferably 96.0% by weight or less, and particularly preferably 95.0% by weight or less. When the amount of the polymer falls within the aforementioned range, the heat resistance and transparency of the λ/2 plate can be increased.

As the ultraviolet absorber, a compound capable of absorbing ultraviolet light may be used. By using an ultraviolet absorber, the ability to prevent the transmission of ultraviolet light to the intermediate layer can be imparted. As the ultraviolet absorber, an organic ultraviolet absorber is preferable, and examples thereof may include organic ultraviolet absorbers such as a triazine-based ultraviolet absorber, a benzophenone-based ultraviolet absorber, a benzotriazole-based ultraviolet absorber, an acrylonitrile-based ultraviolet absorber, a salicylate-based ultraviolet absorber, a cyanoacrylate-based ultraviolet absorber, an azomethine-based ultraviolet absorber, an indole-based ultraviolet absorber, a naphthalimide-based ultraviolet absorber, and a phthalocyanine-based ultraviolet absorber.

As the triazine-based ultraviolet absorber, for example, a compound having a 1,3,5-triazine ring is preferable. Specific examples of the triazine-based ultraviolet absorber may include 2-(4,6-diphenyl-1,3,5-triazine-2-yl)-5-[(hexyl)oxy]-phenol, and 2,4-bis(2-hydroxy-4-butoxyphenyl)-6-(2,4-dibutoxyphenyl)-1,3,5-triazine. Examples of commercially available products of such triazine-based ultraviolet absorbers may include "TINUVIN 1577" manufactured by Ciba Specialty Chemicals Inc., and "LA-F70" and "LA-46" manufactured by ADEKA Corporation.

Examples of the benzotriazole-based ultraviolet absorber may include 2,2'-methylenebis[4-(1,1,3,3-tetramethylbutyl)-6-(2H-benzotriazole-2-yl)phenol], 2-(3,5-di-tert-butyl-2-hydroxyphenyl)-5-chlorobenzotriazole, 2-(2H-benzotriazole-2-yl)-p-cresol, 2-(2H-benzotriazole-2-yl)-4,6-bis(1-methyl-1-phenylethyl)phenol, 2-benzotriazol-2-yl-4,6-di-tert-butylphenol, 2-[5-chloro(2H)-benzotriazol-2-yl)-4-methyl-6-(tert-butyl)phenol, 2-(2H-benzotriazol-2-yl)-4,6-di-tert-butylphenol, 2-(2H-benzotriazol-2-yl)-4-(1,1,3,3-tetramethylbutyl)phenol, 2-(2H-benzotriazol-2-yl)-4-methyl-6-(3,4,5,6-tetrahydrophthalimidylmethyl)phenol, reaction products of methyl 3-(3-(2H-benzotriazol-2-yl)-5-tert-butyl-4-hydroxyphenyl)propionate/polyethylene glycol 300, and 2-(2H-benzotriazol-2-yl)-6-(linear and side chain dodecyl)-4-methylphenol. Examples of commercially available products of such triazole-based ultraviolet absorbers may include "Adekastab LA-31" manufactured by ADEKA Corporation, and "TINUVIN 328" manufactured by Ciba Specialty Chemicals Inc.

Examples of the azomethine-based ultraviolet absorber may include materials described in Japanese Patent No. 3366697 B, and examples of commercially available products may include "BONASORB UA-3701" manufactured by Orient Chemical Industries Co., Ltd.

Examples of the indole-based ultraviolet absorber may include materials described in Japanese Patent No. 2846091 B, and examples of commercially available products may include "BONASORB UA-3911" and "BONASORB UA-3912" manufactured by Orient Chemical Industries Co., Ltd.

Examples of the phthalocyanine-based ultraviolet absorber may include materials described in Japanese Patents No. 4403257 B and No. 3286905 B, and examples of commercially available products may include "FDB001" and "FDB002" manufactured by Yamada Chemical Co., Ltd.

Among these, from the viewpoint of excellent ultraviolet absorption performance in a wavelength range of 380 nm to 400 nm, a triazine-based ultraviolet absorber, an azomethine-based ultraviolet absorber, and an indole-based ultraviolet absorber are preferable, and a triazine-based ultraviolet absorber is particularly preferable.

As the ultraviolet absorber, one type thereof may be solely used, and two or more types thereof may also be used in combination at any ratio.

The amount of the ultraviolet absorber in the third thermoplastic resin is preferably 3% by weight or more, more preferably 4% by weight or more, and particularly preferably 5% by weight or more, and is preferably 20% by weight or less, more preferably 18% by weight or less, and particularly preferably 16% by weight or less. When the amount of the ultraviolet absorber is equal to or more than the lower limit value of the aforementioned range, the ability of the $\lambda/2$ plate to prevent the transmission of ultraviolet light can be particularly enhanced. When the amount of the ultraviolet absorber is equal to or less than the upper limit value of the aforementioned range, the transparency of the $\lambda/2$ plate with respect to visible light can be enhanced.

The third thermoplastic resin may further contain an optional component in combination with the polymer and the ultraviolet absorber. Examples of the optional component may include the same examples as the optional components that may be contained in the first thermoplastic resin. As the optional component, one type thereof may be solely used, and two or more types thereof may also be used in combination at any ratio.

The thickness of the intermediate layer is preferably set so that the ratio represented by the "thickness of the intermediate layer"/"thickness of the $\lambda/2$ plate" falls within a specific range. The specific range is preferably $1/3$ or more, more preferably $2/4$ or more, and particularly preferably $3/5$ or more, and is preferably $80/82$ or less, more preferably $79/82$ or less, and particularly preferably $78/82$ or less. When the ratio is equal to or more than the lower limit value of the aforementioned range, the ability of the $\lambda/2$ plate to prevent transmission of ultraviolet light can be particularly enhanced. When the ratio is equal to or less than the upper limit value of the aforementioned range, the thickness of the $\lambda/2$ plate can be reduced.

(4.1.2. Second Thermoplastic Resin Contained in First Outer Layer, and Thickness Thereof)

The first outer layer is formed of a second thermoplastic resin. The second thermoplastic resin usually contains a polymer. As the polymer in the second thermoplastic resin, a thermoplastic polymer is usually used. As the thermoplastic polymer, for example, a polymer in the range described as a polymer which may be contained in the third thermoplastic resin that is contained in the intermediate layer may be optionally used. Thereby the same advantages as those described in the description of the intermediate layer can be obtained. Among these, an alicyclic structure-containing polymer is preferable as the aforementioned polymer because of its excellent mechanical properties, heat resistance, transparency, low hygroscopicity, size stability, and light weight properties. Further, as the polymer contained in the second thermoplastic resin that is contained in the first outer layer, it is preferable to use the same polymer as the polymer contained in the third thermoplastic resin that is contained in the intermediate layer. By using the same polymer, the bonding strength between the intermediate layer and the first outer layer can be easily elevated, and reflection of light at the interface between the intermediate layer and the first outer layer can be easily suppressed. As the polymer contained in the second thermoplastic resin, one type thereof may be solely used, and two or more types thereof may also be used in combination at any ratio.

The amount of the polymer in the second thermoplastic resin is preferably 90.0% by weight to 100% by weight, and more preferably 95.0% by weight to 100% by weight. When the amount of the polymer falls within the aforementioned range, the $\lambda/2$ plate can obtain sufficient heat resistance and transparency.

The second thermoplastic resin may include an ultraviolet absorber, but it is preferable that the amount of the ultraviolet absorber in the second thermoplastic resin is small, and it is more preferable that the second thermoplastic resin does not contain an ultraviolet absorber. When the second thermoplastic resin does not contain an ultraviolet absorber, bleed-out of the ultraviolet absorber can be effectively suppressed.

The second thermoplastic resin may further contain an optional component in combination with the polymer. Examples of the optional component may include the same examples as the optional components that may be contained in the first thermoplastic resin. As the optional component, one type thereof may be solely used, and two or more types thereof may also be used in combination at any ratio.

The thickness of the first outer layer is preferably set so that the ratio represented by the "thickness of the first outer layer"/"thickness of the $\lambda/2$ plate" falls within a specific range. The predetermined range is preferably $1/82$ or more, more preferably $2/82$ or more, and particularly preferably $3/82$ or more, and is preferably $1/3$ or less, more preferably $1/4$ or less, and particularly preferably $1/5$ or less. When the ratio is equal to or more than the lower limit value of the aforementioned range, bleed-out of the ultraviolet absorber contained in the intermediate layer can be effectively suppressed. When the ratio is equal to or less than the upper limit value of the aforementioned range, the thickness of the $\lambda/2$ plate can be reduced.

(4.1.3. Fourth Thermoplastic Resin Contained in Second Outer Layer, and Thickness Thereof)

The second outer layer is formed of a fourth thermoplastic resin. The fourth thermoplastic resin usually contains a polymer. As the polymer in the fourth thermoplastic resin, a thermoplastic polymer is usually used. As the thermoplastic polymer, for example, a polymer in the range described as a polymer which may be contained in the second thermoplastic resin that is contained in the first outer layer may be optionally used. Thereby the same advantages as those described in the description of the first outer layer can be obtained. Among these, an alicyclic structure-containing polymer is preferable as the polymer because of its excellent mechanical properties, heat resistance, transparency, low hygroscopicity, size stability, and light weight properties. As the polymer contained in the fourth thermoplastic resin, one type thereof may be solely used, and two or more types thereof may also be used in combination at any ratio.

The second thermoplastic resin contained in the first outer layer and the fourth thermoplastic resin contained in the second outer layer may be different resins, but are preferably the same resin. When the second thermoplastic resin and the fourth thermoplastic resin are the same resin, the production cost of the λ/2 plate can be suppressed, and curls of the λ/2 plate can be suppressed.

The thickness of the second outer layer may be any thickness selected from the range described as the range for the thickness of the first outer layer. Thereby the same advantages as described in the description of the thickness of the first outer layer can be obtained. Among these, in order to suppress curls of the λ/2 plate, it is preferable that the thickness of the second outer layer is the same as that of the first outer layer.

[4.2. Properties of λ/2 Plate]

The in-plane retardation of the λ/2 plate may be appropriately set within a range in which a broadband λ/4 plate can be achieved by the combination of the λ/2 plate and the λ/4 plate. The specific in-plane retardation of the λ/2 plate is preferably 240 nm or more, and more preferably 250 nm or more, and is preferably 300 nm or less, more preferably 280 nm or less, and particularly preferably 265 nm or less. When the λ/2 plate has such an in-plane retardation Re, the combination of the λ/2 plate and the λ/4 plate can function as a broadband λ/4 plate. Therefore, visibility when the image display device including the film sensor member is viewed with the polarized sunglasses worn can thereby be enhanced by widening the range of colors that can be visually recognized.

The NZ factor of the λ/2 plate is usually 1.1 or more, preferably 1.3 or more, and particularly preferably 1.5 or more, and is usually 3.0 or less, preferably 2.5 or less, and particularly preferably 2.0 or less. Since the λ/2 plate has the NZ factor falling within the aforementioned range, when the display surface of the image display device provided with the film sensor member is viewed in a tilt direction relative to the display surface, it is possible to suppress fluctuation in the hue and brightness of the image in all azimuth directions due to whether or not worn polarized sunglasses are present.

The λ/2 plate may have a wavelength dispersion property such as a forward wavelength dispersion property, a flat wavelength dispersion property, and a reverse wavelength dispersion property.

In general, when a multilayer film including a combination of a λ/4 plate having a slow axis which forms an angle $\theta_{\lambda/4}$ with respect to a given reference direction and a λ/2 plate having a slow axis which forms an angle $\theta_{\lambda/2}$ with respect to the given reference direction satisfies the formula (B): "$\theta_{\lambda/4}=2\theta_{\lambda/2}+45°$", this multilayer film acts as a broadband λ/4 plate which can give the light passing through the multilayer film to an in-plane retardation of substantially ¼ wavelength of the wavelength of the light in a wide wavelength range (see Japanese Patent Application Laid-Open No. 2007-004120 A). Therefore, as in the example illustrated in FIG. 2, the slow axis $D_Q$ of the λ/4 plate 120 and the slow axis DH of the λ/2 plate 130 preferably satisfy a relationship close to that represented by the formula (B), from the viewpoint of exerting the function of a broadband λ/4 plate by a combination of the λ/2 plate 130 and the λ/4 plate 120. Specifically, when the aforementioned reference direction is the direction of the polarized light absorption axis $D_P$ of the linear polarizer 210 to be bonded to the film sensor member 100 for producing a circularly polarizing plate, the slow axis $D_Q$ of the λ/4 plate 120 and the slow axis DH of the λ/2 plate 130 preferably satisfy the relationship of the aforementioned formula (B). From such a viewpoint, the intersection angle formed between the slow axis $D_Q$ of the λ/4 plate 120 and the slow axis DH of the λ/2 plate 130 is preferably 55° or more, more preferably 57° or more, and particularly preferably 59° or more, and is preferably 65° or less, more preferably 63° or less, and particularly preferably 61° or less.

Furthermore, when the film sensor member 100 has a long-length shape, the orientation angle θ2 formed by the slow axis DH of the λ/2 plate 130 with respect to the lengthwise direction MD of the film sensor member 100 is preferably set within a specific range as in the example illustrated in FIG. 2, from the viewpoint of enabling the production of a circularly polarizing plate by the bonding by a roll-to-roll method. Specifically, the orientation angle θ2 of the λ/2 plate 130 is preferably 15°±5°, more preferably 15°±3°, and particularly preferably 15°±1°. When a long-length circularly polarizing plate is produced from the long-length film sensor member 100 and the long-length linear polarizer 210, the orientation angle θ2 of the λ/2 plate 130 may usually coincide with an angle formed by the slow axis DH of the λ/2 plate 130 with respect to the polarized light absorption axis $D_P$ of the linear polarizer 210 in the circularly polarizing plate. Therefore, when the orientation angle θ2 of the λ/2 plate 130 falls within the aforementioned range, a circularly polarizing plate capable of functioning in a wide wavelength range can be produced by bonding the film sensor member 100 and the linear polarizer 210 by a roll-to-roll method.

The direction in which the slow axis DH of the λ/2 plate 130 forms the orientation angle θ2 with respect to the lengthwise direction MD of the film sensor member 100 is usually the same as the direction in which the slow axis $D_Q$ of the λ/4 plate 120 forms the orientation angle θ1 with respect to the lengthwise direction MD of the film sensor member 100. Therefore, for example, if the slow axis $D_Q$ of the λ/4 plate 120 forms the orientation angle θ1 with respect to the lengthwise direction MD of the film sensor member 100 in a clockwise direction when viewed in the thickness direction, the slow axis DH of the λ/2 plate 130 usually forms the orientation angle θ2 with respect to the lengthwise direction MD of the film sensor member 100 in a clockwise direction when viewed in the thickness direction. As another example, if the slow axis $D_Q$ of the λ/4 plate 120 forms the orientation angle θ1 with respect to the lengthwise direction MD of the film sensor member 100 in a counterclockwise direction when viewed in the thickness direction, the slow axis DH of the λ/2 plate 130 usually forms the orientation angle θ2 with respect to the lengthwise direction MD of the film sensor member 100 in a counterclockwise direction when viewed in the thickness direction.

The total light transmittance of the λ/2 plate is preferably 80% or more.

The haze of the λ/2 plate is preferably 5% or less, more preferably 3% or less, particularly preferably 1% or less, and ideally 0%.

The amount of volatile components contained in the λ/2 plate is preferably 0.1% by weight or less, more preferably 0.05% by weight or less, further preferably 0.02% by weight or less, and ideally zero. When the amount of the volatile component is reduced, the size stability of the λ/2 plate is improved, and a change in optical properties such as retardation with the lapse of time can be reduced.

The saturation water absorption ratio of the λ/2 plate is preferably 0.03% by weight or less, more preferably 0.02% by weight or less, particularly preferably 0.01% by weight or less, and ideally zero. When the saturation water absorption ratio of the λ/2 plate falls within the aforementioned range, a change in optical properties such as in-plane retardation with time can be reduced.

[4.3. Thickness of λ/2 Plate]

The thickness of the λ/2 plate is preferably 25 µm or more, more preferably 27 µm or more, and particularly preferably 30 µm or more, and is preferably 45 µm or less, more preferably 43 µm or less, and particularly preferably 40 µm or less. When the thickness of the λ/2 plate is equal to or more than the lower limit value of the aforementioned range, desired retardation can be exhibited. When the thickness is equal to or less than the upper limit value of the aforementioned range, thinning can be achieved.

[4.4. Method for Producing λ/2 Plate]

The method for producing the λ/2 plate may be any method. The λ/2 plate may be produced as an obliquely stretched film by a production method including, for example, subjecting to oblique stretching one or more times a long-length pre-stretch substrate including layers corresponding to the intermediate layer, the first outer layer, and the second outer layer. According to the production method including the oblique stretching, the λ/2 plate can be easily produced.

Further, it is preferable that the λ/2 plate is produced as a sequentially biaxially stretched film by a production method including further subjecting the substrate to longitudinal stretching after the oblique stretching. Herein, "longitudinal stretching" means stretching a long-length film in the lengthwise direction. By performing such a combination of the oblique stretching and the longitudinal stretching, a λ/2 plate which can be bonded to the λ/4 plate can be easily produced by a roll-to-roll method.

Hereinafter, an example of a preferable production method of the λ/2 plate will be described. The method for producing the λ/2 plate according to this example includes (e) a third step of preparing a long-length pre-stretch substrate including layers corresponding to the intermediate layer, the first outer layer, and the second outer layer, respectively, (f) a fourth step of stretching the long-length pre-stretch substrate in an oblique direction to obtain a long-length intermediate film, and, as necessary, (g) a fifth step of freely uniaxially stretching the intermediate film in a lengthwise direction to obtain a long-length λ/2 plate.

In the third step (e), a long-length pre-stretch substrate is prepared. The substrate before stretching may be produced by a production method including, for example, a step of molding the second thermoplastic resin for forming the first outer layer, the third thermoplastic resin for forming the intermediate layer, and the fourth thermoplastic resin for forming the second outer layer into a film shape. Examples of the molding method of the resin may include a co-extrusion method and a co-casting method. Among these molding methods, a coextrusion method is preferable because it is excellent in production efficiency and it has low tendency to leave volatile components in the film.

The production method using the coextrusion method includes a step of coextruding a resin. In the coextrusion method, the resins in a molten state are extruded into layers to form a layer of the second thermoplastic resin, a layer of the third thermoplastic resin, and a layer of the fourth thermoplastic resin. Examples of the extrusion method of the resin in this step may include a coextrusion T die method, a coextrusion inflation method, and a coextrusion lamination method. Among these, a coextrusion T die method is preferable. Examples of the coextrusion T die method may include a feed block method and a multi-manifold method, and a multi-manifold method is particularly preferable in that fluctuation in thickness can be reduced. By molding the resins into a film shape as described above, a long-length pre-stretch substrate including the layer of the second thermoplastic resin, the layer of the third thermoplastic resin, and the layer of the fourth thermoplastic resin in this order is obtained.

After the long-length pre-stretch substrate is prepared in the third step (e), the fourth step (f) is performed in which the long-length pre-stretch substrate is stretched in an oblique direction to obtain an intermediate film. In the fourth step (f), stretching is usually performed while the pre-stretch substrate is continuously conveyed in the lengthwise direction. This stretching may be performed using a tenter stretching machine.

The stretching ratio in the fourth step (f) is preferably 1.1 times or more, more preferably 1.15 times or more, and particularly preferably 1.2 times or more, and is preferably 5.0 times or less, more preferably 4.0 times or less, and particularly preferably 3.5 times or less. When the stretching ratio in the fourth step (f) is equal to or more than the lower limit value of the aforementioned range, the occurrence of wrinkles in the λ/2 plate can be suppressed, and the refractive index in the stretching direction can be increased. When the stretching ratio is equal to or less than the upper limit value of the aforementioned range, the fluctuation in the orientation angle of the λ/2 plate can be reduced, and the slow axis direction can be easily controlled.

The stretching temperature in the fourth step (f) is preferably $Tg_2-5°$ C. or higher, more preferably $Tg_2-2°$ C. or higher, and particularly preferably $Tg_2°$ C. or higher, and is preferably $Tg_2+40°$ C. or lower, more preferably $Tg_2+35°$ C. or lower, and particularly preferably $Tg_2+30°$ C. or lower. When the stretching temperature in the fourth step (f) falls within the aforementioned range, the molecules contained in the pre-stretch substrate can be reliably oriented, so that an intermediate film having desired optical properties can be easily obtained. "$Tg_2$" herein represents the highest temperature among the glass transition temperatures of the polymers contained in the second thermoplastic resin, the third thermoplastic resin, and the fourth thermoplastic resin.

By being stretched in the fourth step (f), the molecules contained in the intermediate film are oriented. Thus, the intermediate film has a slow axis. In the fourth step (f), since the stretching is performed in the oblique direction, the slow axis of the intermediate film is expressed in the oblique direction of the intermediate film. In particular, the intermediate film has a slow axis usually in the range of 5° to 85° with respect to its lengthwise direction.

It is preferable that the specific direction of the slow axis of the intermediate film is set in accordance with the direction of the slow axis of the λ/2 plate to be produced. Usually, the orientation angle formed by the slow axis of the λ/2 plate obtained by the fifth step (g) with respect to its lengthwise direction is smaller than the orientation angle formed by the slow axis of the intermediate film with respect to its lengthwise direction. Therefore, it is preferable that the orientation angle formed by the slow axis of the intermediate film with respect to its lengthwise direction is larger than the orientation angle formed by the slow axis of the λ/2 plate with respect to its lengthwise direction.

After the fourth step (f), as necessary, the fifth step (g) of freely uniaxially stretching the intermediate film in the lengthwise direction to obtain a long-length λ/2 plate is performed. In the free uniaxial stretching of the intermediate film in the lengthwise direction shown in this example, stretching in the lengthwise direction is usually performed without restraining the ends in the widthwise direction of the intermediate film. Such stretching in the fifth step (g) is usually performed using a roll stretching machine while the intermediate film is continuously conveyed in the lengthwise direction.

It is preferable that the stretching ratio in the fifth step (g) is set at a ratio that is smaller than the stretching ratio in the fourth step (f). This makes it possible to perform stretching while suppressing the occurrence of wrinkles in the λ/2 plate having the slow axis in the oblique direction. The λ/2 plate having a slow axis in a direction of a small angle with respect to the lengthwise direction can be easily produced by the combination of performing the stretching in the oblique direction and the free uniaxial stretching in the lengthwise direction in this order and making the stretching ratio in the fifth step (g) smaller than the stretching ratio in the fourth step (f).

The specific stretching ratio in the fifth step (g) is preferably 1.1 times or more, more preferably 1.15 times or more, and particularly preferably 1.2 times or more, and is preferably 3.0 times or less, more preferably 2.8 times or less, and particularly preferably 2.6 times or less. When the stretching ratio in the fifth step (g) is equal to or more than the lower limit value of the aforementioned range, wrinkles of the λ/2 plate can be suppressed. When the stretching ratio is equal to or less than the upper limit value of the aforementioned range, the direction of the slow axis can be easily controlled.

The stretching temperature T2 in the fifth step (g) is preferably higher than "T1−20° C.", more preferably "T1−18° C." or higher, and particularly preferably "T1−16° C." or higher, and is preferably lower than "T1+20° C.", more preferably "T1+18° C." or lower, and particularly preferably "T1+16° C." or lower, on the basis of the stretching temperature T1 in the fourth step (f). When the stretching temperature T2 in the fifth step (g) falls within the aforementioned range, the in-plane retardation of the λ/2 plate can be effectively adjusted.

The method for producing the λ/2 plate shown in the aforementioned example may be further changed for implementation within a range in which a desired λ/2 plate is obtained. Therefore, the method for producing the λ/2 plate may further include an optional step in combination with the above-described steps. For example, the steps that are the same as the optional steps in the method for producing the λ/4 plate may be included.

[5. Optional Layer]

The film sensor member may include an optional layer other than the elements described above.

Examples of the optional layer may include a hard coat layer. Such a hard coat layer may be provided on at least one side of the λ/4 plate. Usually, the hard coat layer is provided on the surface of the λ/4 plate on the transparent electroconductive layer side. Therefore, when the transparent electroconductive layer is provided on both sides of the λ/4 plate, the hard coat layer may also be provided on both sides of the λ/4 plate.

The hard coat layer is a layer having high hardness. The hardness of the hard coat layer may be expressed by JIS pencil hardness. The specific JIS pencil hardness of the hard coat layer is preferably B or higher, more preferably HB or higher, further preferably H or higher, and particularly preferably 2H or higher. When the JIS pencil hardness of the hard coat layer is high as described above, the scratch resistance and curl suppression performance of the λ/4 plate can be improved. The JIS pencil hardness is herein determined by scratching the surface of the layer with pencils in accordance with JIS K5600-5-4. Scratching is performed with pencils with a variety of hardness which are inclined at the angle of 45° to which 500 gram force of downward load is applied. The hardness is determined as the hardness of the pencil that begins to create scratches.

Examples of the hard coat material constituting the hard coat layer may include an organic hard coat material such as an organic silicone-based material, a melamine-based material, an epoxy-based material, a (meth)acrylic-based material, and a urethane (meth)acrylate-based material; and an inorganic hard coat material such as silicon dioxide. The (meth)acrylic or urethane (meth)acrylate-based organic hard coat material may contain a polymerizable unsaturated group. Examples of the organic hard coat material may include a material having one polymerizable unsaturated group per molecule, a material having two polymerizable unsaturated groups per molecule, and a polyfunctional material having three or more polymerizable unsaturated groups per molecule. Among these, the use of a urethane (meth)acrylate-based hard coat material and a polyfunctional (meth)acrylate hard coat material are preferable from the viewpoint of favorable adhesion and excellent productivity. As these materials, one type thereof may be solely used, and two or more types thereof may also be used in combination at any ratio. Herein, the term "(meth)acrylic" encompasses both "acrylic" and "methacrylic" and the term "(meth) acrylate" encompasses both "acrylate" and "methacrylate".

The thickness of the hard coat layer is preferably 0.3 μm or more, more preferably 0.8 μm or more, and particularly preferably 1.0 μm or more, and is preferably 20 μm or less, more preferably 10 μm or less, and particularly preferably 3 μm or less. When the thickness of the hard coat layer is equal to or more than the lower limit value of the aforementioned range, the scratch resistance can be improved. When the thickness is equal to or less than the upper limit value of the aforementioned range, the visibility can be improved.

The method of forming the hard coat layer is not particularly limited. The hard coat layer may be formed by, for example, a method in which a composition containing a hard coat material and an organic solvent is applied onto the surface of the λ/4 plate, and the organic solvent is dried under an atmosphere of air, nitrogen, or the like, and then the material is crosslinked and cured by active energy rays such as ultraviolet light or electron beams. The hard coat layer may also be formed, for example, by applying a silicone-based, melamine-based, or epoxy-based hard coat material onto the surface of the λ/4 plate and heat-curing the material. In these cases, as the coating method, a dip method, a spray method, a slide coating method, a bar coating method, a roll coater method, a die coater method, a gravure coater method, a screen printing method, or the like can be used. Since unevenness in the film thickness of the applied composition tends to occur when the organic solvent is dried, it is preferable that intake air and exhaust air are adjusted so as not to impair the appearance of the film such that they are controlled to ensure the entire surface of the film being uniform. Further, when a material to be cured by ultraviolet rays is used, the ultraviolet irradiation time for curing the hard coat material after the application is usually in the range of 0.01 second to 10 seconds, and the irradiation amount of the energy ray source is usually in the range of 40 mJ/cm$^2$ to 1000 mJ/cm$^2$ as an integrated exposure amount at an ultraviolet wavelength of 365 nm. The ultraviolet irradiation may be performed in an inert gas such as nitrogen or argon, or in air, for example. Examples of the organic solvent may include a ketone solvent such as acetone, methyl ethyl ketone, methyl isobutyl ketone, cyclopentanone, and cyclohexanone; an ester solvent such as ethyl acetate and butyl acetate; an alcohol solvent such as isopropyl alcohol and ethyl alcohol; an aromatic hydrocarbon solvent such as benzene, toluene, xylene, methoxybenzene, and 1,2-dimethoxybenzene; a phenol solvent such as phenol and parachlorophenol; and a halogenated hydrocarbon solvent such as chloroform, dichloromethane, dichloroethane, tetrachloroethane, trichloroethylene, tetrachloroethylene, and chlorobenzene. As these solvents, one type thereof may be solely used, and two or more types thereof may also be used in combination at any ratio.

In order to improve the adhesion between the $\lambda/4$ plate and the hard coat layer, the surface of the $\lambda/4$ plate may be subjected to a surface treatment before the hard coat layer is formed. Examples of the surface treatment may include a plasma treatment, a corona treatment, an alkali treatment, and a coating treatment. Especially by using the corona treatment, the adhesion between the $\lambda/4$ plate and the hard coat layer can be strengthened. The condition for the corona treatment is preferably 1 $W/m^2/min$ to 1000 $W/m^2/min$ as the irradiation dose of the corona discharge electrons. The contact angle of the surface of the $\lambda/4$ plate after the corona treatment against water is preferably 10° to 50°. In addition, the hard coat layer may be formed immediately after the corona treatment, or the hard coat layer may be formed after the electricity of the surface of the $\lambda/4$ plate is discharged. However, it is preferable to form the hard coat layer after discharged, because the appearance of the hard coat layer becomes favorable.

The haze of the hard coat layer is 0.5% or less, and preferably 0.3% or less. With such a haze value, the hard coat layer can be suitably used as a film sensor member.

The material for forming the hard coat layer may include an optional component such as organic particles, inorganic particles, a photosensitizer, a polymerization inhibitor, a polymerization initiation aid, a leveling agent, a wettability modifier, a surfactant, a plasticizer, an ultraviolet absorber, an antioxidant, an antistatic agent, and a silane coupling agent. Specific examples of the ultraviolet absorber may include the same examples as those of the ultraviolet absorber mentioned as specific examples of the ultraviolet absorber which may be contained in the intermediate layer of the $\lambda/2$ plate.

Examples of the optional layer may include an index matching layer. The index matching layer is disposed between the $\lambda/4$ plate and the transparent electroconductive layer or between the transparent electroconductive layer and the hard coat layer, in order to suppress the reflection at the layer interface due to a large refractive index difference. Examples of the index matching layer may include a layer containing a plurality of high-refractive index films and a plurality of low-refractive index films which are alternately disposed. Examples of the low-refractive index films may include a film of an inorganic oxide such as $SiO_2$, $TiO_2$, NaF, $ZrO_2$, ZnO, and hollow silica, and a film of a mixture of the inorganic oxide and an organic matter such as a siloxane-based polymer. Further examples of the index matching layer may include a resin layer containing metal such as zirconia. The index matching layer can suppress the interfacial reflection due to a refractive index difference, even when the refractive indices significantly differs between the $\lambda/4$ plate and the transparent electroconductive layer or between the transparent electroconductive layer and the hard coat layer.

Examples of the optional layer may include an adhesive layer for bonding the $\lambda/4$ plate and the $\lambda/2$ plate. The adhesive layer is a layer for bonding the $\lambda/4$ plate and the $\lambda/2$ plate, and is usually formed of an adhesive or a cured product of the adhesive.

Examples of the adhesive may include an aqueous adhesive, a solvent-based adhesive, a two-component curable adhesive, a photocurable adhesive, and a pressure-sensitive adhesive. Among these, a photocurable adhesive is preferable. As the adhesive, one type thereof may be solely used, and two or more types thereof may also be used in combination at any ratio.

Examples of the photocurable adhesive used may include acrylate-based adhesives containing urethane (meth)acrylate, hydroxyalkyl (meth)acrylate, and an acrylamide derivative. These adhesives may be ultraviolet curable adhesives. By using an ultraviolet curable adhesive, coating and curing can be performed more quickly and high productivity can be obtained as compared with the case where other types of adhesive are used.

The urethane (meth)acrylate may be obtained as an oligomer containing a radically polymerizable unsaturated group, for example, by reacting a polyisocyanate and a polyol, followed by further reacting a hydroxyl group-containing (meth)acrylic compound and, as necessary, a hydroxyl group-containing allyl ether compound. The urethane (meth)acrylate may also be obtained, for example, by reacting a hydroxyl group-containing (meth)acrylic compound with a polyol, followed by further reacting a polyisocyanate.

As the urethane (meth)acrylate, it is preferable to use urethane (meth)acrylate having two to three double bonds per one molecule and having a number-average molecular weight of 500 to 3000 per double bond because the bonding strength, flexibility, photocurability, viscosity, and the like are easily balanced.

The amount of urethane (meth)acrylate in the photocurable adhesive is usually 30% by weight to 50% by weight. When the amount of urethane (meth)acrylate is equal to or more than the lower limit value of the aforementioned range, the adhesive layer can be prevented from becoming brittle. When the amount is equal to or less than the upper limit value, the viscosity of the adhesive can be lowered and the adhesive strength can be increased.

Examples of the hydroxyalkyl (meth)acrylate may include hydroxyethyl (meth)acrylate, hydroxypropyl (meth)acrylate, and hydroxybutyl (meth)acrylate. Among these, hydroxyethyl methacrylate is particularly preferable.

The amount of hydroxyalkyl (meth)acrylate in the photocurable adhesive is usually 13% by weight to 40% by weight. When the amount of the hydroxyalkyl (meth)acrylate is equal to or more than the lower limit value of the aforementioned range, the hydrophilicity of the entire adhesive can be set to an appropriate range. When the amount is equal to or less than the upper limit value, the adhesive layer can be prevented from becoming brittle and the photocurability of the adhesive can be increased.

Examples of acrylamide derivatives may include N,N-dimethylacrylamide, N,N-diethylacrylamide, N,N-dimethylaminoethylacrylamide, N,N-dimethylaminopropylacrylamide, N-isopropylacrylamide, N,N-dimethylaminopropylacrylamide, and N-hydroxyethylacrylamide. Among these, N,N-diethylacrylamide, N-isopropylacrylamide, N,N-dimethylaminopropylacrylamide, and N-hydroxyethylacrylamide are particularly preferable.

The amount of acrylamide in the photocurable adhesive is usually 0 to 30% by weight, and preferably 1% by weight to 30% by weight.

The photocurable adhesive preferably contains 30% by weight to 40% by weight of isobornyl (meth)acrylate in addition to the above-mentioned components. The inclusion of isobornyl (meth)acrylate imparts heat resistance to the adhesive layer. In addition, viscosity adjustment for improving coating performance can be easily performed without lowering adhesion performance.

The photocurable adhesive preferably contains a photopolymerization initiator. Examples of the photopolymerization initiator may include 1-hydroxycyclohexyl phenyl ketone, 2,2-dimethoxy-2-phenylacetophenone, xanthone, fluorenone, benzaldehyde, fluorene, anthraquinone, triphenylamine, carbazole, 3-methylacetophenone, 4-chlorobenzophenone, 4,4'-dimethoxybenzophenone, 4,4'-diaminobenzophenone, a Michler's ketone, benzoin propyl ether, benzoin ethyl ether, benzyl dimethyl ketal, 1-(4-isopropylphenyl)-2-hydroxy-2-methylpropan-1-one, 2-hydroxy-2-methyl-1-phenylpropan-1-one, thioxanthone, diethyl thioxanthone, 2-isopropyl thioxanthone, 2-chlorothioxanthone, 2-methyl-1-[4-(methylthio)phenyl]-2-morpholino-propan-1-one, and 2,4,6-trimethylbenzoyldiphenylphosphine oxide. As the photopolymerization initiator, one type thereof may be solely used, and two or more types thereof may also be used in combination at any ratio. The amount of the photopolymerization initiator in the photocurable adhesive is usually 2% by weight to 10% by weight.

Specific examples of the adhesive may include SVR series (manufactured by Dexerials Corporation), TE-9000 series (manufactured by Hitachi Chemical Corporation), ThreeBond 1500 series and 1600 series (manufactured by Three Bond Holdings Co., Ltd.), and Word Rock HRJ series (manufactured by Kyoritsu Chemical & Co., Ltd.).

The viscosity of the adhesive at 23° C. is preferably 20 mPa·s or more, more preferably 30 mPa·s or more, and particularly preferably 50 mPa·s or more, and is preferably 5,000 mPa·s or less, more preferably 3,000 mPa·s or less, and particularly preferably 1,500 mPa·s or less.

The thickness of the adhesive layer is preferably 0.1 μm or more, and more preferably 0.3 μm or more, and is preferably 50 μm or less, and more preferably 30 μm or less.

Examples of the optional layer may include an optical compensation layer such as a positive C plate for suppressing the retardation change caused when the film sensor member is observed in a tilt direction. The positive C plate is a plate having a retardation being 0 in the front direction although the retardation changes with the inclination in the tilt direction such that the retardation change of the λ/4 plate is canceled, and having refractive indices that satisfy the relationship of nx=ny<nz.

[6. Properties of Film Sensor Member]

Since the film sensor member includes the λ/4 plate and the λ/2 plate as previously described, it can function as a broadband λ/4 plate to convert linearly polarized light into circularly polarized light in a wide wavelength band. Therefore, by bonding this film sensor member to the linear polarizer, a broadband circularly polarizing plate can be obtained.

Since the film sensor member includes the λ/4 plate having excellent heat resistance, the film sensor member itself also has excellent heat resistance. Therefore, the occurrence of deformation such as wrinkles and curls due to heat can be suppressed. Furthermore, the occurrence of color change due to heat can be suppressed. Particularly when an alicyclic structure-containing polymer is used, the excellent moisture resistance of the alicyclic structure-containing polymer can be utilized, thereby to improve the moisture resistance of the film sensor member. Therefore, the occurrence of deformation and color change due to humidity can be suppressed.

Since the film sensor member includes the λ/2 plate having the intermediate layer containing an ultraviolet absorber, the transmission of ultraviolet light can be suppressed. Specifically, the light transmittance of the film sensor member at a wavelength of 380 nm is preferably 5% or less, more preferably 3% or less, and particularly preferably 1% or less. When the light transmittance of the film sensor member at a wavelength of 380 nm is low as previously described, the film sensor member can have improved light resistance. Therefore, the film sensor member has low tendency to cause coloration even when irradiated with light. Furthermore, since the film sensor member can exert the function of suppressing the transmission of ultraviolet light in this manner, the linear polarizer and the image display element can be protected from ultraviolet light by this film sensor member. Thus, the deterioration due to ultraviolet light, such as ultraviolet light used for irradiation during the production of an image display device and ultraviolet light contained in external light in the use environment, can be suppressed to improve the durability of the circularly polarizing plate and the image display device. Particularly in an organic EL display element including an organic light emitting layer susceptible to the deterioration due to ultraviolet light, the light transmittance of the film sensor member at a measurement wavelength of 390 nm is preferably 5% or less, more preferably 3% or less, particularly preferably 1% or less, and further preferably 0.5% or less, in order to further improve the durability to light at a wavelength of 390 nm. The aforementioned light transmittance at a measurement wavelength of 390 nm can be achieved by, for example, increasing the concentration of an ultraviolet absorber, or thickening the intermediate layer, containing an ultraviolet absorber, of the λ/2 plate.

The film sensor member usually has high transparency. Specifically, the total light transmittance of the film sensor member is preferably 80% or more, more preferably 85% or more, and particularly preferably 90% or more. The haze of the film sensor member is preferably 5% or less, more preferably 3% or less, and particularly preferably 1% or less.

The film sensor member preferably has a small saturation water absorption rate. Specifically, the saturation water absorption rate of the film sensor member is preferably 0.1% by weight or less, further preferably 0.05% by weight or less, particularly preferably 0.01% by weight or less, and ideally 0. When the saturation water absorption rate of the film sensor member falls within the aforementioned range, the time-dependent change of optical properties such as in-plane retardation can be reduced.

The film sensor member preferably has low moisture permeability. Specifically, the moisture permeability of the film sensor member is preferably 1.5 $g/m^2 \cdot 24$ h or less, more preferably 1.0 $g/m^2 \cdot 24$ h or less, and particularly preferably 0.5 $g/m^2 \cdot 24$ h or less. When the moisture permeability of the film sensor member is low as previously described, the linear polarizer and the image display element can be protected from moisture in the image display device including the film sensor member. Consequently, durability of the image display device can be improved.

The moisture permeability may be measured in accordance with JIS 20208 under the conditions of a measurement temperature of 50° C. and a relative humidity of 90% by a water vapor permeation analyzer (L80-5000 manufactured by Lyssy Co., Ltd.).

The film sensor member may have a long-length shape or a sheet piece shape. The film sensor member is usually produced as a member having a long-length shape. The long-length film sensor member is bonded to the linear polarizer to obtain the circularly polarizing plate. Then, the circularly polarizing plate is cut out such that it has a sheet piece shape.

The thickness of the film sensor member is not particularly limited, but is preferably 20 µm or more, more preferably 30 µm or more, and particularly preferably 40 µm or more, and is preferably 120 µm or less, more preferably 100 µm or less, particularly preferably 80 µm or less.

[7. Method for Producing Film Sensor Member]

The film sensor member may be produced by, for example, a production method including: a step of forming a transparent electroconductive layer on one side of a λ/4 plate; and bonding a λ/2 plate on the other side of the λ/4 plate with a UV curable adhesive. Such a production method is preferably performed by a roll-to-roll method. According to the roll-to-roll method, the long-length film sensor member can be produced with favorable productivity.

In the aforementioned production method, any of the step of forming a transparent electroconductive layer on one side of a λ/4 plate and the step of bonding a λ/2 plate on the other side of the λ/4 plate may be performed first. However, from the viewpoint of suppressing the occurrence of curls due to the thermal deformation of the λ/2 plate in forming the transparent electroconductive layer, it is preferable to firstly perform the step of forming a transparent electroconductive layer on one side of a λ/4 plate, and after that, the step of bonding a λ/2 plate on the other side of the λ/4 plate.

As the method for forming a transparent electroconductive layer on one side of a λ/4 plate, the methods described in the section of the transparent electroconductive layer may be used. In the formation procedure, the transparent electroconductive layer may be directly formed on one side of the λ/4 plate without another layer interposed therebetween. Alternatively, the transparent electroconductive layer may be formed on one side of the λ/4 plate via an optional layer such as the hard coat layer or the index matching layer.

As the UV curable adhesive in the step of bonding a λ/2 plate on the other side of the λ/4 plate, a UV curable adhesive among the aforementioned light curable adhesives may be used. When such a UV curable adhesive is used for bonding, the occurrence of air gaps and cracks can be suppressed.

A step of curing the UV curable adhesive is usually performed after the step of bonding the λ/4 plate and the λ/2 plate. The curing of the UV curable adhesive is performed by irradiation with ultraviolet light. Since the λ/2 plate has low tendency to transmit ultraviolet light, the irradiation of ultraviolet light is preferably performed through the λ/4 plate.

The method for producing the film sensor member may further include a step other than the aforementioned steps. For example, the method for producing the film sensor member may include a step of forming a hard coat layer on the surface of the λ/4 plate.

[8. Circularly Polarizing Plate]

[8.1. Summary of Circularly Polarizing Plate]

Figure 3:
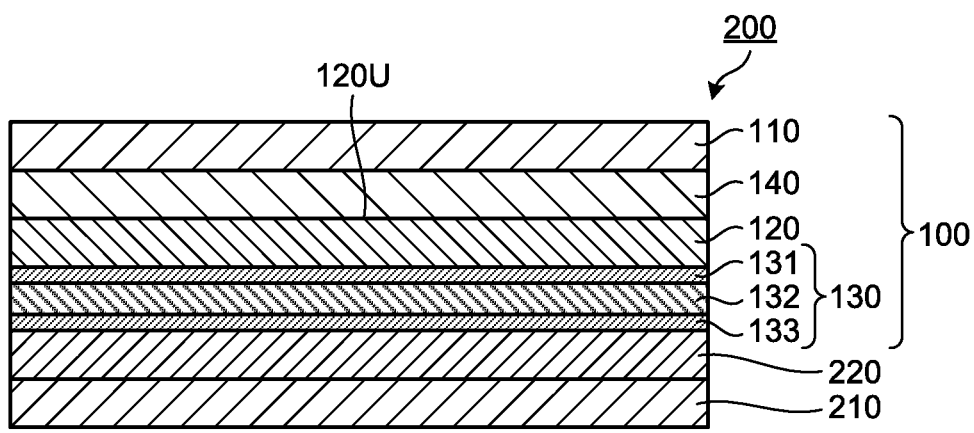
FIG. 3 is a cross-sectional view schematically illustrating a circularly polarizing plate according to an embodiment of the present invention.

FIG. 3 is a cross-sectional view schematically illustrating a circularly polarizing plate 200 according to an embodiment of the present invention.

As illustrated in FIG. 3, the circularly polarizing plate 200 according to an embodiment of the present invention includes a linear polarizer 210 and a film sensor member 100. The film sensor member 100 includes a λ/2 plate 130, a λ/4 plate 120, and a transparent electroconductive layer 110 in this order from the linear polarizer 210 side. The circularly polarizing plate 200 usually further includes an adhesive layer 220 for bonding the linear polarizer 210 and the film sensor member 100. The circularly polarizing plate 200 may further include, on a side of the linear polarizer 210 that is opposite to the side of the film sensor member 100, an optional film layer (not illustrated) such as a protective film, an optical compensation film for liquid crystal cells, and an antireflective film for organic EL display devices. Examples of the protective film may include a transparent material, such as an alicyclic structure-containing polymer, and a cellulose resin such as triacetyl cellulose. Examples of the optical compensation film for liquid crystal cells may include optical films described in Japanese Patent Application Laid-Open No. 2008-517344 A, Japanese Patent Application Laid-Open No. 2006-285208 A, Japanese Patent Application Laid-Open No. Hei. 11-133408 A, and the like. Examples of the antireflective film for organic EL display devices may include broadband λ/4 plates described in the aforementioned Patent Literatures 4 to 6 and the like.

In the circularly polarizing plate 200, an angle formed by the slow axis $D_Q$ of the λ/4 plate 120 with respect to the polarized light absorption axis of the linear polarizer 210 preferably falls within the same range as that of the aforementioned orientation angle θ1. In the circularly polarizing plate 200, an angle formed by the slow axis DH of the λ/2 plate 130 with respect to the polarized light absorption axis of the linear polarizer 210 preferably falls within the same range as that of the aforementioned orientation angle θ2 (see FIG. 2). By having such features, the linearly polarized light having passed through the linear polarizer 210 can be converted into circularly polarized light by the film sensor member 100 in a wide wavelength range. Consequently, the circularly polarizing plate 200 capable of functioning in a wade wavelength range can be easily obtained.

Since the circularly polarizing plate 200 includes the aforementioned film sensor member 100, it is excellent in heat resistance, and furthermore, usually excellent also in moisture resistance.

In addition, since the circularly polarizing plate 200 includes the λ/2 plate 130 having an intermediate layer 132 containing an ultraviolet absorber, the transmission of ultraviolet light can be suppressed. Accordingly, the deterioration of the linear polarizer 210 due to ultraviolet light can be suppressed. Consequently, since the circularly polarizing plate 200 has high light resistance, the plate has low tendency to cause coloration even when irradiated with light.

Moreover, since the transparent electroconductive layer 110 is not likely to be deteriorated in producing the circularly polarizing plate 200, the adhesiveness of the transparent electroconductive layer 110 is favorable.

<8.2. Method for Producing Circularly Polarizing Plate>

The circularly polarizing plate may be produced by a production method including: a step of bonding a linear polarizer and a film sensor member with a UV curable adhesive; and a step of irradiating the UV curable adhesive with ultraviolet light through the linear polarizer. Such a production method is preferably performed by a roll-to-roll method. According to the roll-to-roll method, the long-length circularly polarizing plate can be produced with favorable productivity.

The UV curable adhesive to be used may be the same UV curable adhesive as those used for bonding the λ/4 plate and the λ/2 plate. By such bonding via a UV curable adhesive, the occurrence of air gaps and cracks can be suppressed. Consequently, the moisture permeability of the circularly polarizing plate can be effectively reduced.

In the step of irradiating the UV curable adhesive with ultraviolet light after having bonded the linear polarizer and the film sensor member, irradiation with ultraviolet light is performed from the linear polarizer side. Accordingly, ultraviolet light passes through the linear polarizer and enters the UV curable adhesive, causing the UV curable adhesive to be cured. Thus, a circularly polarizing plate is obtained. In this operation, ultraviolet light is blocked by the λ/2 plate, because the λ/2 plate has the intermediate layer containing an ultraviolet absorber. Therefore, ultraviolet light having large energy does not enter the layer portion from the λ/4 plate to the transparent electroconductive layer, thereby suppressing the reduction in adhesiveness of the transparent electroconductive layer due to ultraviolet light. As a result, a circularly polarizing plate in which the transparent electroconductive layer 110 has favorable adhesiveness can be obtained.

<8.3. Linear Polarizer>

The linear polarizer is an optical member having a polarized light transmission axis and a polarized light absorption axis, and can absorb linearly polarized light having a vibration direction parallel to the polarized light absorption axis and allow to pass therethrough linearly polarized light having a vibration direction parallel to the polarized light transmission axis. In the image display device including the circularly polarizing plate, the linearly polarized light having passing through this linear polarizer further passes through the film sensor member functioning as a broadband λ/4 plate to become circularly polarized light, and the circularly polarized light exits the image display device to be visually recognized as light for displaying an image by an observer.

Examples of the linear polarizer to be used may include a film obtained by performing appropriate treatment such as dyeing treatment with a dichroic substance such as iodine and a dichroic dye, stretching treatment, and crosslinking treatment to a film of an appropriate vinyl alcohol-based polymer such as polyvinyl alcohol and partially formalized polyvinyl alcohol in an appropriate order and method. Since the film is usually stretched in the lengthwise direction in the stretching treatment for producing the linear polarizer, a polarized light absorption axis parallel to the lengthwise direction of the linear polarizer and a polarized light transmission axis parallel to the widthwise direction of the linear polarizer can be expressed in the obtained linear polarizer. This linear polarizer is preferably excellent in polarization degree. The thickness of the linear polarizer is generally 5 μm to 80 μm, although the thickness is not limited thereto.

The linear polarizer is usually produced as a long-length film. In producing the long-length linear polarizer, the polarized light absorption axis of the linear polarizer is preferably parallel to the lengthwise direction of the linear polarizer. By having such a feature, in bonding the linear polarizer to the long-length film sensor member to produce the circularly polarizing plate, their optical axes can be matched by aligning their lengthwise directions in parallel. Accordingly, the long-length linear polarizer and the long-length film sensor member can be easily bonded by a roll-to-roll method.

The bonding by a roll-to-roll method refers to bonding in a manner of performing a step of unrolling a film from a roll of a long-length film, conveying the unrolled film, bonding the unrolled film to another film on the conveyance line, and further winding the resulting bonded product on a roll. In the bonding by a roll-to-roll method, a complicated step of aligning optical axes is not required, unlike in the bonding of films in a sheet piece shape. Therefore, efficient bonding can be performed.

[9. Image Display Device]

The image display device includes an image display element and the aforementioned circularly polarizing plate disposed on the visual recognition side of the image display element. In the image display device, the circularly polarizing plate is disposed such that the film sensor member is positioned on the visual recognition side of the linear polarizer. In such an image display device, an image can be displayed by circularly polarized light in a wide wavelength range due to the action of the film sensor member that functions as a broadband λ/4 plate. Therefore, the visual recognizability of an image through polarized sunglasses can become favorable.

Further, since the λ/2 plate included in the film sensor member has an NZ factor falling within a specific range, the visual recognizability of images in all azimuth directions when the display surface of the image display device is viewed in the tilt direction through polarized sunglasses can become favorable. Details thereof are as follows.

In general, the polarization state of the light for displaying an image may vary depending on the azimuth of the display surface. Accordingly, when the display surface is viewed through polarized sunglasses worn, coloring of an image sometimes differed depending on the azimuth. Therefore, the color tone of an image sometimes fluctuated in all azimuth directions in the prior art. However, the image display device including the film sensor member that includes the λ/2 plate having an NZ factor falling within the aforementioned specific range can suppress the coloring of the color tone of an image viewed through polarized sunglasses so that the color tone becomes closer to that of an image viewed without polarized sunglasses. This can suppress the fluctuation in the color tone of an image depending on the azimuth in which the display surface is viewed. Consequently, the fluctuation in the color tone of an image in all azimuth directions due to whether or not worn polarized sunglasses are present when the display surface is viewed in a tilt direction can be suppressed to enhance the uniformity in the color tone of an image.

Furthermore, when the display surface of the image display device is viewed with polarized sunglasses worn, the brightness of the image is generally lower than that in a case where polarized sunglasses are not worn. In the prior art, the degree of the decrease in brightness differed depending on the azimuth in which the display surface is viewed with polarized sunglasses worn. Accordingly, the brightness of an image sometimes fluctuated in all azimuth directions. However, the image display device including the film sensor member that includes the λ/2 plate having an NZ factor falling within the aforementioned specific range can suppress the aforementioned fluctuation in brightness caused by wearing polarized sunglasses. Therefore, the fluctuation in the brightness of an image in all azimuth directions due to whether or not worn polarized sunglasses are present when the display surface is viewed in a tilt direction can be suppressed to enhance the uniformity in the brightness of an image.

Also, the transparent electroconductive layer of the film sensor member disposed in the image display device is usually used as an electroconductive layer of a touch panel that the image display device includes. The film sensor member includes, as a substrate, the λ/4 plate formed of the first thermoplastic resin. Since the film sensor member including as a substrate such a resin-made λ/4 plate does not easily break compared to a sensor member for touch panels containing a glass substrate, a touch panel having excellent mechanical durability can be achieved. Furthermore, since the film sensor member including as a substrate the resin-made λ/4 plate has excellent flexibility, a touch panel enabling smooth input by a finger can be achieved. In this case, the film sensor member including the transparent electroconductive layer on both sides of the λ/4 plate is preferable from the viewpoint of reducing the thickness. Alternatively, a combination of the film sensor member including the transparent electroconductive layer on one side and a member including the transparent electroconductive layer on another substrate (for example, an isotropic substrate or glass) may be provided to a touch panel.

As previously described, the film sensor member is excellent in heat resistance and light resistance, and furthermore, usually excellent in moisture resistance. Moreover, the transparent electroconductive layer has favorable adhesiveness. Therefore, the image display device including the film sensor member can have excellent durability, thereby usually achieving long life.

There are various image display devices depending on the types of the image display element. Typical examples of the image display device may include: a liquid crystal display device including a liquid crystal cell as an image display element; and an organic EL display device including an organic electroluminescent element (hereinafter, sometimes appropriately referred to as an "organic EL element") as an image display element.

Figure 4:
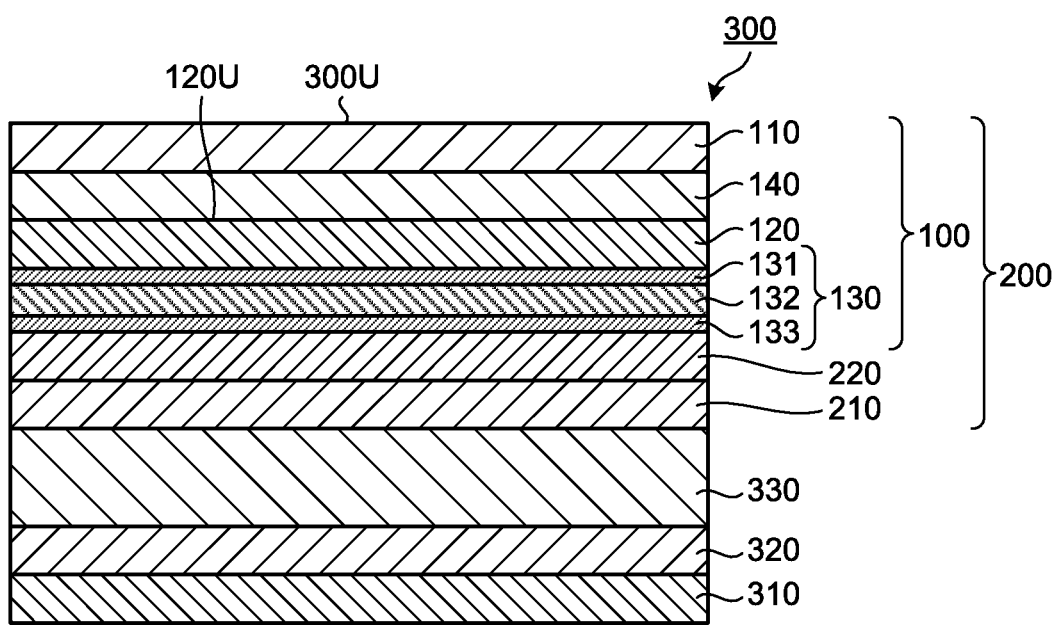
FIG. 4 is a cross-sectional view schematically illustrating an example of a liquid crystal display device as an image display device according to an embodiment of the present invention.

FIG. 4 is a cross-sectional view schematically illustrating an example of a liquid crystal display device 300 as an image display device according to an embodiment of the present invention.

As illustrated in FIG. 4, the liquid crystal display device 300 includes: a light source 310; a light source-side linear polarizer 320; a liquid crystal cell 330 as an image display element; and the circularly polarizing plate 200, in this order. In this liquid crystal display device 300, the circularly polarizing plate 200 includes the film sensor member 100 on the visual recognition side of the linear polarizer 210. Thus, the liquid crystal display device 300 includes the transparent electroconductive layer 110, the λ/4 plate 120, the λ/2 plate 130, the linear polarizer 210, the liquid crystal cell 330, the light source-side linear polarizer 320, and the light source 310, in this order from the visual recognition side.

In the liquid crystal display device 300, an image is displayed by the light which has been emitted from the light source 310, and passed through the light source-side linear polarizer 320, the liquid crystal cell 330, the linear polarizer 210, and the film sensor member 100 capable of functioning as a broadband λ/4 plate. The light for displaying an image is linearly polarized light when having passed through the linear polarizer 210, but is converted into circularly polarized light by passing through the film sensor member 100. Therefore, in the liquid crystal display device 300, an image is displayed by circularly polarized light, so that an image can be visually recognized when viewed through polarized sunglasses. In particular, since the λ/2 plate 130 included in the film sensor member 100 has an NZ factor falling within a specific range, the fluctuation in the color tone and brightness of an image in all azimuth directions due to whether or not worn polarized sunglasses are present when viewed in a tilt direction relative to a display surface 300U of the liquid crystal display device 300 can be suppressed.

In this liquid crystal display device 300, the transparent electrode layer 110 of the film sensor member 100 may be used as an electroconductive layer for touch panels. Therefore, the liquid crystal display device 300 including a touch panel can be achieved.

As the liquid crystal cell 330, a liquid crystal cell of any mode may be used, and examples thereof may include an in-plane switching (IPS) mode, a vertical alignment (VA) mode, a multi-domain vertical alignment (MVA) mode, a continuous pinwheel alignment (CPA) mode, a hybrid alignment nematic (HAN) mode, a twisted nematic (TN) mode, a super-twisted nematic (STN) mode, and an optical compensated bend (OCB) mode.

Figure 5:
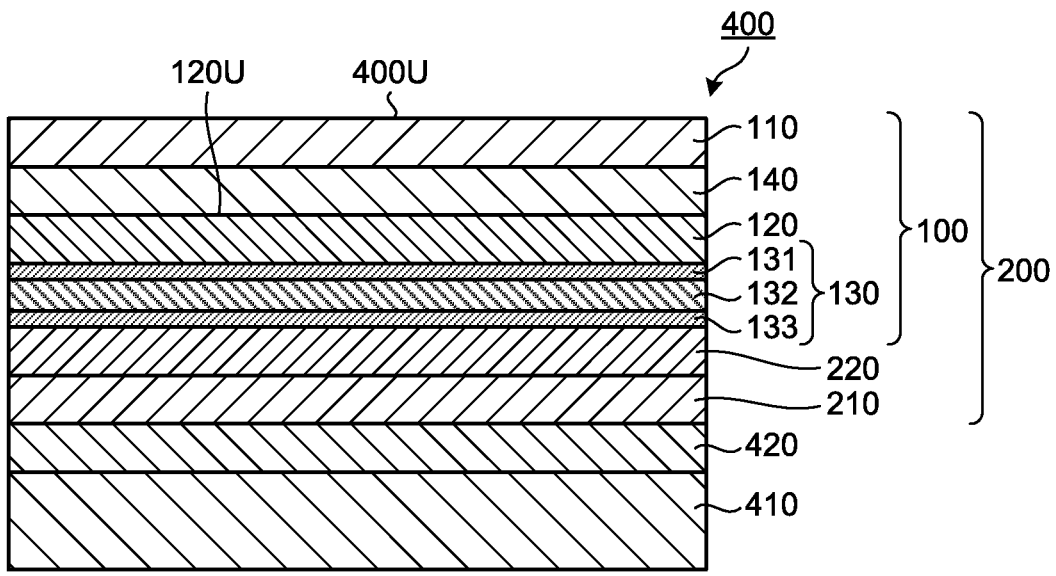
FIG. 5 is a cross-sectional view schematically illustrating an example of an organic EL display device as an image display device according to an embodiment of the present invention.

FIG. 5 is a cross-sectional view schematically illustrating an example of an organic EL display device 400 as an image display device according to an embodiment of the present invention.

As illustrated in FIG. 5, the organic EL display device 400 includes an organic EL element 410 as an image display element, a λ/4 plate 420, and the circularly polarizing plate 200, in this order. In this organic EL display device 400, the circularly polarizing plate 200 includes the film sensor member 100 on the visual recognition side of the linear polarizer 210. Thus, the organic EL display device 400 includes the transparent electroconductive layer 110, the λ/4 plate 120, the λ/2 plate 130, the linear polarizer 210, the λ/4 plate 420, and the organic EL element 410, in this order from the visual recognition side.

In the organic EL display device 400, the λ/4 plate 420 is usually provided to suppress the glare of a display surface 400U due to the reflection of external light by a combination with the linear polarizer 210. Specifically, only linearly polarized light which is part of the light having entered from the outside of the device passes through the linear polarizer 210, and subsequently passes through the λ/4 plate 420 to become circularly polarized light. The circularly polarized light reflects off a constituent (such as a reflective electrode (not illustrated) in the organic EL element 410) which reflects the light within the display device, and passes through the λ/4 plate 420 again to become linearly polarized light having a vibration direction orthogonal to the vibration direction of the incident linearly polarized light. Thus, the linearly polarized light does not pass through the linear polarizer 210. Consequently, the antireflection function is achieved (for the principle of antireflection in an organic EL display device, see Japanese Patent Application Laid-Open No. Hei. 9-127885 A). In the example illustrated in FIG. 5, the organic EL display device 400 includes a single member as the λ/4 plate 420. However, as the λ/4 plate 420, the broadband λ/4 plate including a combination of the λ/2 plate and the λ/4 plate may be used.

In the organic EL display device 400, an image is displayed by the light which has been emitted from the organic EL element 410 and passed through the λ/4 plate 420, the linear polarizer 210, and the film sensor member 100 capable of functioning as a broadband λ/4 plate. The light for displaying an image is linearly polarized light when having passed through the linear polarizer 210, but is converted into circularly polarized light by passing through the film sensor member 100. Thus, in the organic EL display device 400, an image is displayed by circularly polarized light, so that an image can be visually recognized when viewed through polarized sunglasses. In particular, since the λ/2 plate 130 provided to the film sensor member 100 has an NZ factor falling within a specific range, the fluctuation in the color tone and brightness of an image in all azimuth directions due to whether or not worn polarized sunglasses are present when viewed in a tilt direction relative to the display surface 400U of the organic EL display device 400 can be suppressed.

In this organic EL display device 400, the transparent electrode layer 110 of the film sensor member 100 may be used as an electrode layer for touch panels. Therefore, the organic EL display device 400 including a touch panel can be achieved.

The organic EL element 410 includes a transparent electrode layer, a light-emitting layer, and an electrode layer in this order. The light-emitting layer can generate light when voltages are applied from the transparent electrode layer and the electrode layer. Examples of a material constituting an organic light-emitting layer may include a polyparaphenylenevinylen-based material, a polyfluorene-based material, and a polyvinylcarbazole-based material. The light-emitting layer may have a layered body including a plurality of layers having different emission colors or a mixed layer in which a different dye is doped in a layer of a certain dye. The organic EL element 410 may further include a functional layer such as a barrier layer, a hole injection layer, a hole transport layer, an electron injection layer, an electron transport layer, an equipotential surface forming layer, and a charge generating layer.

Figure 6:
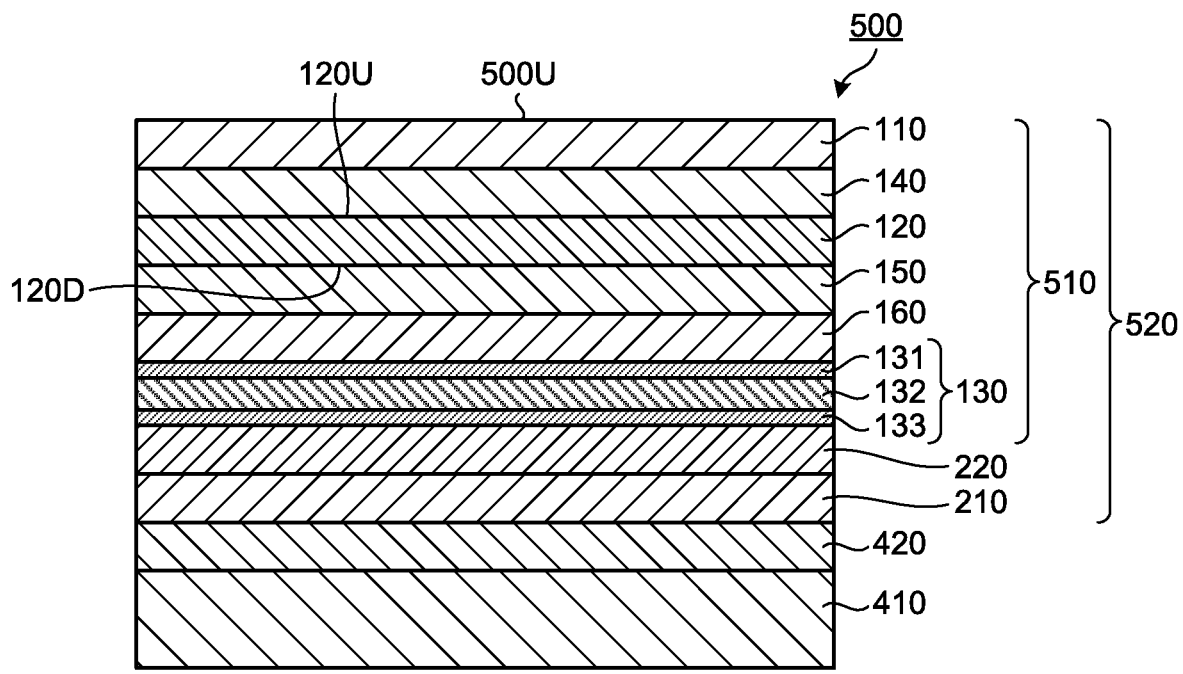
FIG. 6 is a cross-sectional view schematically illustrating an example of an organic EL display device as an image display device according to an embodiment of the present invention.

FIG. 6 is a cross-sectional view schematically illustrating an example of an organic EL display device 500 as an image display device according to an embodiment of the present invention.

As illustrated in FIG. 6, the organic EL display device 500 is configured in the same manner as the organic EL display device 400 illustrated in FIG. 5, except that a circularly polarizing plate 520 is included instead of the circularly polarizing plate 200. The circularly polarizing plate 520 includes, instead of the film sensor member 100, a film sensor member 510 which contains hard coat layers 140 and 150 and transparent electroconductive layers 110 and 160 on, not only one surface 120U, but both surfaces 120U and 120D, of the λ/4 plate 120. Thus, the organic EL display device 500 includes the organic EL element 410, the λ/4 plate 420, the linear polarizer 210, the adhesive layer 220, the λ/2 plate 130, the transparent electroconductive layer 160, the hard coat layer 150, the λ/4 plate 120, the hard coat layer 140, and the transparent electroconductive layer 110, in this order. In FIG. 6, reference numeral 500U represents the display surface of the organic EL display device 500.

The organic EL display device 500 including the film sensor member 510 containing the transparent electroconductive layers 110 and 160 on both surfaces 120U and 120D of the λ/4 plate 120 in this manner can also achieve the same advantages as those of the organic EL display device 400 having been described with reference to FIG. 5.

The film sensor member 510 including the transparent electroconductive layers 110 and 160 on respective surfaces 120U and 120D of the λ/4 plate 120 may be disposed to the liquid crystal display device having been described with reference to FIG. 4.

EXAMPLE

Hereinafter, the present invention will be specifically described by illustrating Examples. However, the present invention is not limited to the Examples described below. The present invention may be optionally modified for implementation without departing from the scope of claims of the present invention and the scope of their equivalents. In the following description, "%" and "part" representing quantity are on the basis of weight, unless otherwise specified. The operation described below was performed under the conditions of normal temperature and normal pressure in the atmospheric air, unless otherwise specified.

[Evaluation Method]

<Method for Measuring Slow Axis Direction, Retardation, and NZ Factor of Film>

The slow axis direction, retardation, and NZ factor of the film were measured using a phase difference meter ("KOBRA-21ADH" manufactured by Oji Scientific Instruments, Co. Ltd.).

<Method for Measuring Thickness of Each Layer Contained in λ/2 Plate>

The thickness of the entire λ/2 plate was measured with a snap gauge.

The thickness of the intermediate layer contained in the λ/2 plate was obtained by measuring the light transmittance of the λ/2 plate at a wavelength of 390 nm using an ultraviolet-visible-near-infrared spectrophotometer ("V-7200" manufactured by JASCO Corporation) and calculating the thickness from the obtained light transmittance. Furthermore, since the first outer layer and the second outer layer were formed as layers having the same thickness in the following Examples and Comparative Examples, the thicknesses of the first outer layer and the second outer layer were calculated by subtracting the thickness of the intermediate layer from the thickness of the entire λ/2 plate and dividing the obtained value by 2. When the first outer layer and the second outer layer are formed as layers having different thickness, the thicknesses of the first outer layer and the second outer layer may be measured by observing the cross section of the λ/2 plate with a scanning electron microscope (SEM).

<Method for Measuring Photoelastic Coefficient of Film>

The in-plane retardation of the film was measured, while a load in a range of 50 g to 150 g was applied to the film, using a retardation measuring device ("KOBRA-21ADH" manufactured by Oji Scientific Instruments). The measured in-plane retardation was divided by the thickness of the film to obtain a birefringence value Δn. The birefringence values Δn were measured while the load was varied. From the obtained results, a load-Δn curve was created. From the slope of this load-Δn curve, the photoelastic coefficient was obtained.

<Method for Measuring Thermal Size Change Ratio of Film>

The film was cut out under the environment of a room temperature of 23° C. to obtain a sample film of 150 mm×150 mm size square. This sample film was heated in an oven at 150° C. for 60 minutes, and cooled to 23° C. (room temperature).

After that, the lengths of the four edges and two diagonals of the sample film were measured.

On the basis of each of the measured lengths of the four edges, the thermal size change ratio was calculated according to the following formula (I). In the formula (I), LA indicates the length [mm] of an edge of the sample film after heating.

$$\text{Thermal size change ratio (\%)}=[(LA-150)/150]\times 100 \quad (I)$$

Further, on the basis of the measured lengths of the two diagonals, the thermal size change ratio was calculated according to the following formula (II). In the formula (II), LD indicates the length [mm] of a diagonal of the sample film after heating.

$$\text{Thermal size change ratio (\%)}=[(LD-212.13)/212.13]\times 100 \quad (II)$$

The maximum value among the absolute values of the six calculated values of the thermal size change ratio was adopted as the thermal size change ratio of the film.

<Method for Measuring Water Absorption Rate of Film>

The water absorption rate of the film was measured by immersing the film at 23° C. for 24 hours and measuring an increased weight in accordance with ASTM D570.

<Method for Measuring Resistance Value of Surface of Transparent Electroconductive Layer>

The film sensor member was cut out to obtain a sample film of 10 cm×10 cm square. The sample film was measured for the sheet resistance by a four-terminal four-probe method using a resistivity meter ("Loresta (registered trademark) GP" manufactured by Mitsubishi Chemical Corporation), in accordance with JIS K 7194.

<Method for Evaluating Curl Amount of Film Sensor Member>

The film sensor member obtained in each of Examples and Comparative Examples was cut to obtain a 5 cm×5 cm rectangular sample. This sample was placed on a flat stage with the transparent electroconductive layer side facing downward. The four corners of the film sensor member which had lifted from the stage were measured for the height from the stage. The average of the measured height values was adopted as a curl amount. When the sample had been curled up, the height was unmeasurable. Therefore, such a case was simply evaluated as "failure".

After that, the sample was subjected to a moisture resistance test in which it was stored under the environment of a temperature of 65° C. and a humidity of 93% for 1000 hours. The curl amount of the sample after the moisture resistance test was measured by the aforementioned method.

Separately, a sample having not been subjected to the moisture resistance test was subjected to a heat resistance test in which it was stored under the environment of a temperature of 95° C. for 1000 hours. The curl amount of the sample after the heat resistance test was measured by the aforementioned method.

<Method for Evaluating Color Change of Film Sensor Member>

The film sensor member obtained in each of Examples and Comparative Examples was cut to obtain a 5 cm×5 cm rectangular sample. The sample was subjected to a moisture resistance test in which it was stored under the environment of a temperature of 65° C. and a humidity of 95% for 1000 hours. The sample after the moisture resistance test was visually observed to evaluate the color change. When no color change was recognized, the sample was judged as "A"; when little color change was recognized, the sample was judged as "B"; and when color change to yellow was recognized, the sample was judged as "C".

Separately, a sample having not been subjected to the moisture resistance test was subjected to a heat resistance test in which it was stored under the environment of a temperature of 95° C. for 1000 hours. The sample after the heat resistance test was visually observed to evaluate the color change in the same manner as that previously described.

<Method for Measuring Light Transmittance of Film Sensor Member at Wavelength of 380 nm>

The light transmittance of the film sensor member obtained in each of Examples and Comparative Examples at a measurement wavelength of 380 nm was measured using an ultraviolet-visible-near-infrared spectrophotometer ("V-7200" manufactured by Jasco Corporation).

<Method for Evaluating Light Resistance of Circularly Polarizing Plate>

The circularly polarizing plate obtained in each of Examples and Comparative Examples was irradiated with light from a xenon lamp on the transparent electroconductive layer side under the conditions of an irradiance of 60 W/m$^2$ and an irradiation time of 500 hours. After that, the circularly polarizing plate was visually observed to judge whether it has been colored. When no coloring was recognized, the sample was judged to be "good", and when coloring was recognized, the sample was judged "failure".

<Method for Evaluating Adhesiveness of Transparent Electroconductive Layer in Circularly Polarizing Plate>

The transparent electroconductive layer of the circularly polarizing plate obtained in each of Examples and Comparative Examples was subjected to a cross-cut test of 100 1 mm-squares in accordance with JIS K5400 to check the peeling state of the transparent electroconductive layer by a cellophane tape (specified in JIS Z1522). In the test, the cellophane tape adhering to the transparent electroconductive layer was peeled, and the number of squares of the transparent electroconductive layer which were not peeled was counted. Larger number of squares of the transparent electroconductive layer which were not peeled is indicative of the better adhesiveness of the transparent electroconductive layer.

<Method for Visual Evaluation of Fluctuation in Color Tone and Brightness of Image Display Device>

Figure 7:
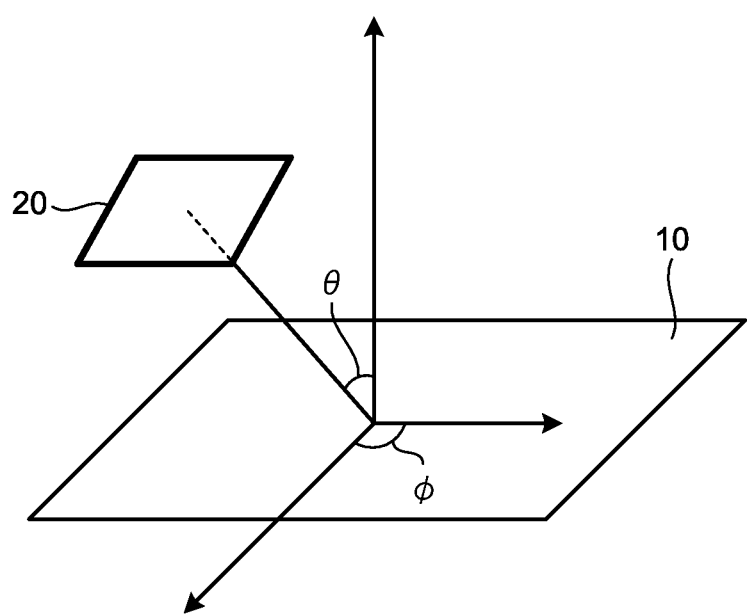
FIG. 7 is a perspective view schematically illustrating visual evaluation performed in Examples and Comparative Examples.

FIG. 7 is a perspective view schematically illustrating visual evaluation performed in Examples and Comparative Examples.

As illustrated in FIG. 7, while a white image was displayed on the image display device obtained in each of Examples and Comparative Examples, visual observation was performed in a tilt direction at a polar angle of θ=45° with respect to a display surface 10 without wearing polarized sunglasses. This observation was performed in all azimuth directions of azimuth angle φ=0° to 360°. After that, with polarized sunglasses 20 worn, visual observation was performed in a tilt direction at a polar angle θ=45° with respect to the display surface 10 in all azimuth directions of azimuth angle φ=0° to 360°, in the same manner as that previously described. Then, the image viewed through the worn polarized sunglasses 20 was compared to the image viewed without wearing the polarized sunglasses 20, to qualitatively evaluate whether the fluctuation in color tone and brightness in all azimuth directions is larger or smaller.

The aforementioned visual evaluation was performed by ten observers. Smaller fluctuation in the color tone and brightness of the image viewed through the worn polarized sunglasses 20, compared to the image viewed without wearing the polarized sunglasses 20, is indicative of a better result. From the observation results by the ten observers, the fluctuation in color tone and brightness was evaluated on the basis of the following criteria.

"Excellent": Nine to ten observers felt that the fluctuation in color tone and brightness were small.

"Good": Five to eight observers felt that the fluctuation in color tone and brightness were small.

"Failure": Four or fewer observers felt that the change in color tone and brightness were large.

Production Example 1

(Production of Pre-Stretch Substrate)

Pellets of a thermoplastic resin formed of an amorphous norbornene-based polymer (manufactured by ZEON Corporation, glass transition temperature Tg=163° C.) were dried at 100° C. for 5 hours. The dried pellets were supplied to an extruder, and the thermoplastic resin was melted in the extruder. After that, the melted thermoplastic resin was passed through a polymer pipe and a polymer filter and extruded from a T die onto a casting drum in a sheet shape, and cooled. Thus, a pre-stretch substrate having a thickness of 145 μm was obtained. This pre-stretch substrate was wound up while being attached to a masking film ("FF1025" manufactured by Tredegar Corporation) for protection. Thus, a roll of the pre-stretch substrate was obtained.

(Production of λ/4 Plate)

The pre-stretch substrate was unwound from the roll. The masking film was continuously peeled off and the substrate was supplied to a tenter stretching machine. Then, oblique stretching was performed using the tenter stretching machine to obtain a long-length λ/4 plate. In the oblique stretching, the stretching ratio was 4.0 times, and the stretching temperature was 180° C. The orientation angle formed by the slow axis of the resulting λ/4 plate with respect to the film lengthwise direction was 75°; the in-plane retardation Re was 125 nm; the NZ factor was 1.18; and the thickness was 35 μm. This λ/4 plate was wound up while being attached to another masking film ("FF1025" manufactured by Tredegar Corporation) for protection. Thus, a roll of the λ/4 plate was obtained.

Production Example 2

(Preparation of Thermoplastic Resin)

Pellets of an amorphous norbornene-based polymer (manufactured by ZEON Corporation, glass transition temperature Tg=126° C.) were dried at 100° C. for 5 hours. By a twin-screw extruder, 100 parts of the dried pellets and 5.5 parts of a benzotriazole-based ultraviolet absorber ("LA-31" manufactured by ADEKA Corporation) were mixed. The resulting mixture was charged in a hopper connected to a single screw extruder, and melt extruded from the single screw extruder. Thus, a thermoplastic resin (J1) was obtained. The content of the ultraviolet absorber in this thermoplastic resin (J1) was 5.2% by weight.

(Production of Pre-Stretch Substrate)

A double flight-type single screw extruder (screw diameter: D=50 mm, ratio L/D between screw effective length L and screw diameter D=32) equipped with a leaf disc-shape polymer filter having openings of 3 μm was prepared. Into this single screw extruder, the thermoplastic resin (J1) was introduced as a resin for forming the intermediate layer, and melted. The melted resin was supplied to a multi-manifold die having a die lip surface roughness Ra of 0.1 μm under the conditions of an extruder outlet temperature of 280° C. and an extruder gear pump rotation speed of 10 rpm.

Meanwhile, a single screw extruder (screw diameter: D=50 mm, ratio L/D between screw effective length L and screw diameter D=32) equipped with a leaf disc-shape polymer filter having openings of 3 μm was prepared. Into this single screw extruder, pellets of an amorphous norbornene-based polymer (manufactured by ZEON Corporation, glass transition temperature Tg=126° C.) which are the same as those used for the preparation of the thermoplastic resin (J1) were introduced as a thermoplastic resin (J2) for forming the first outer layer and the second outer layer. The introduced thermoplastic resin (J2) was supplied to the aforementioned multi-manifold die under the conditions of an extruder outlet temperature of 285° C. and an extruder gear pump rotation speed of 4 rpm.

Subsequently, the thermoplastic resins (J1) and (J2) were co-extruded from the multi-manifold die at 280° C. so as to be discharged in a film shape containing three layers: a layer of the resin for forming the first outer layer, a layer of the resin for forming the intermediate layer, and a layer of the resin for forming the second outer layer. The discharged thermoplastic resins (J1) and (J2) were cast on a cooling roll adjusted at a temperature of 150° C. to obtain a pre-stretch substrate with a width of 1400 mm and a thickness of 70 μm including three layers: the first outer layer (thickness: 15 μm) formed of the thermoplastic resin (J2)/the intermediate layer (thickness: 40 μm) formed of the thermoplastic resin (J1)/the second outer layer (thickness: 15 μm) formed of the thermoplastic resin (J2). During the aforementioned co-extrusion, the air gap amount was 50 mm. As the method for casting the film-shape resin in a melted state onto the cooling roll, edge pinning was adopted. The pre-stretch substrate obtained in this manner was wound up to obtain a roll of the pre-stretch substrate.

(Production of λ/2 Plate)

The pre-stretch substrate was unwound from the roll, continuously conveyed in the lengthwise direction, and supplied to a tenter stretching machine. Then, oblique stretching was performed using the tenter stretching machine to obtain a long-length intermediate film. In the oblique stretching, the stretching ratio was 1.67 times, and the stretching temperature was 140° C. The resulting intermediate film had a multilayer structure including three layers: the first outer layer (thickness: 8 μm) formed of the thermoplastic resin (J2)/the intermediate layer (thickness: 26 μm) formed of the thermoplastic resin (J1)/the second outer layer (thickness: 8 μm) formed of the thermoplastic resin (J2). As to this intermediate film, the orientation angle formed by the slow axis with respect to the film lengthwise direction was 45°; the in-plane retardation Re was 220 nm; the width was 1330 mm; and the thickness was 42 μm.

Subsequently, the intermediate film was subjected to free uniaxial stretching in the film lengthwise direction while being continuously conveyed in the lengthwise direction. Thus, a long-length λ/2 plate was obtained. In the free uniaxial stretching, the stretching ratio was 1.50 times, and the stretching temperature was 135° C. The resulting λ/2 plate had a multilayer structure including three layers: the first outer layer (thickness: 5 μm) formed of the thermoplastic resin (J2)/the intermediate layer (thickness: 20 μm) formed of the thermoplastic resin (J1)/the second outer layer (thickness: 5 μm) formed of the thermoplastic resin (J2). As to this λ/2 plate, the orientation angle formed by the slow axis with respect to the film lengthwise direction was 15°; the in-plane retardation Re was 245 nm; the NZ factor was 1.5; the thickness was 30 μm; and the light transmittance at a wavelength of 380 nm was 0.15%. The resulting λ/2 plate was wound up to obtain a roll of the λ/2 plate.

Production Example 3

The stretching conditions in the first stretching step of obtaining the intermediate film by stretching the pre-stretch substrate and the stretching conditions in the second stretching step of obtaining the λ/2 plate by stretching the intermediate film were changed as shown in Table 1. A λ/2 plate having a multilayer structure including three layers: the first outer layer (thickness: 6 μm) formed of the thermoplastic resin (J2)/the intermediate layer (thickness: 18 μm) formed of the thermoplastic resin (J1)/the second outer layer (thickness: 6 μm) formed of the thermoplastic resin (J2) was produced in the same manner as that in Production Example 2 except for the above-described matters. As to the resulting λ/2 plate, the orientation angle formed by the slow axis with respect to the film lengthwise direction was 15°; the in-plane retardation Re was 245 nm; the NZ factor was 2.0; and the thickness was 30 μm.

Production Example 4

The stretching conditions in the first stretching step of obtaining the intermediate film by stretching the pre-stretch substrate and the stretching conditions in the second stretching step of obtaining the λ/2 plate by stretching the intermediate film were changed as shown in Table 1. A λ/2 plate having a multilayer structure including three layers: the first outer layer (thickness: 4 μm) formed of the thermoplastic resin (J2)/the intermediate layer (thickness: 14 μm) formed of the thermoplastic resin (J1)/the second outer layer (thickness: 4 μm) formed of the thermoplastic resin (J2) was produced in the same manner as that in Production Example 2 except for the above-described matters. As to the resulting λ/2 plate, the orientation angle formed by the slow axis with respect to the film lengthwise direction was 15°; the in-plane retardation Re was 245 nm; the NZ factor was 2.5; and the thickness was 22 μm.

Production Example 5

The stretching conditions in the first stretching step of obtaining the intermediate film by stretching the pre-stretch substrate and the stretching conditions in the second stretching step of obtaining the λ/2 plate by stretching the intermediate film were changed as shown in Table 1. A λ/2 plate having a multilayer structure including three layers: the first outer layer (thickness: 3 μm) formed of the thermoplastic resin (J2)/the intermediate layer (thickness: 11 μm) formed of the thermoplastic resin (J1)/the second outer layer (thickness: 3 μm) formed of the thermoplastic resin (J2) was produced in the same manner as that in Production Example 2 except for the above-described matters. As to the resulting λ/2 plate, the orientation angle formed by the slow axis with respect to the film lengthwise direction was 15°; the in-plane retardation Re was 245 nm; the NZ factor was 3.0; and the thickness was 17 μm.

Production Example 6

(Production of Crystallizable Polymer)

A metal pressure resistant reaction vessel was sufficiently dried. After that, the atmosphere in the vessel was substituted with nitrogen. Into this metal pressure resistant reaction vessel, 154.5 parts of cyclohexane, 42.8 parts (30 parts as the amount of dicyclopentadiene) of a 70% cyclohexane solution of dicyclopentadiene (endo-isomer content: 99% or more), and 1.9 parts of 1-hexene were charged. The mixture was warmed to 53° C.

A solution in which 0.014 part of a tetrachlorotungsten phenylimide (tetrahydrofuran) complex dissolved in 0.70 part of toluene was prepared. Into this solution, 0.061 part of a diethylaluminum ethoxide/n-hexane solution at a concentration of 19% was added. The resultant solution was stirred for 10 minutes to prepare a catalyst solution.

This catalyst solution was added into the pressure resistant reaction vessel to initiate a ring-opening polymerization reaction. After that, the reaction continued for 4 hours while the temperature was maintained at 53° C. Thus, a solution containing a ring-opening polymer of dicyclopentadiene was obtained.

The number-average molecular weight (Mn) and the weight-average molecular weight (Mw) of the resulting ring-opening polymer of dicyclopentadiene were 8,750 and 28,100 respectively. The molecular weight distribution (Mw/Mn) calculated from these values was 3.21.

To 200 parts of the resulting solution of the ring-opening polymer of dicyclopentadiene, 0.037 part of 1,2-ethanediol was added as a terminator. The obtained product was warmed to 60° C. and stirred for 1 hour to terminate the reaction. To this product, 1 part of a hydrotalcite-like compound ("Kyoward (registered trademark) 2000" manufactured by Kyowa Chemical Industry Co., Ltd.) was added. The mixture was warmed to 60° C. and stirred for 1 hour. After that, 0.4 part of a filter aid ("Radiolite (registered trademark) #1500" manufactured by Showa Chemical Industry Co., Ltd.) was added thereto, and separation of the adsorbent off the solution was performed by filtering through a PP pleated cartridge filter ("TCP-HX" manufactured by Advantec Toyo Kaisha Ltd.).

To 200 parts (polymer amount: 30 parts) of the solution containing the ring-opening polymer of dicyclopentadiene after filtering, 100 parts of cyclohexane was added. Then, 0.0043 part of chlorohydridocarbonyl tris(triphenylphosphine) ruthenium was further added thereto, and a hydrogenation reaction was performed at a hydrogen pressure of 6 MPa and a temperature of 180° C. for 4 hours. Accordingly, a reaction liquid containing a hydrogenated product of the ring-opening polymer of dicyclopentadiene was obtained. In this reaction liquid, the hydrogenated product had been deposited. As a result, the reaction solution had become a slurry solution.

The hydrogenated product and the solution contained in the reaction liquid was separated using a centrifugal separator. The hydrogenated product was dried at 60° C. under reduced pressure for 24 hours to obtain 28.5 parts of a hydrogenated product of the ring-opening polymer of dicyclopentadiene having crystallizability. As to this hydrogenated product, the hydrogenation rate was 99% or more; the glass transition temperature Tg was 93° C.; the melting point (Tm) was 262° C.; and the ratio of racemo diad was 89%.

(Production of Pre-Stretch Substrate)

To 100 parts of the hydrogenated product of the ring-opening polymer of dicyclopentadiene, 1.1 parts of an antioxidant (tetrakis[methylene-3-(3',5'-di-t-butyl-4'-hydroxyphenyl)propionate]methane; "Irganox (registered trademark) 1010" manufactured by BASF Japan Ltd.) was mixed. Thus, a thermoplastic resin to serve as a material of the λ/4 plate was obtained.

The aforementioned thermoplastic resin was charged in a twin-screw extruder including four die holes each having an inner diameter of 3 mmφ ("TEM-37B" manufactured by Toshiba Machine Co. Ltd.). By the twin screw extruder, the thermoplastic resin was subjected to hot melt extrusion molding to form a molded article in a strand shape. This molded article was shredded with a strand cutter to obtain pellets of the thermoplastic resin. The operation conditions of the twin screw extruder are as follows.

Barrel set temperature: 270° C. to 280° C.
Die set temperature: 250° C.
Screw rotation speed: 145 rpm
Feeder rotation speed: 50 rpm Subsequently, the resulting pellets were supplied to a hot-melt extrusion film molder including a T die. Using this film molder, the thermoplastic resin was molded by a method of winding up the thermoplastic resin on a roll at a speed of 26.45 m/min. Accordingly, a long-length pre-stretch substrate (thickness: 70 μm, width: 750 mm) was obtained. The operation conditions of the film molder are as follows.

Barrel set temperature: 280° C. to 290° C.
Die temperature: 270° C.
Screw rotation speed: 30 rpm (Production of λ/4 Plate)

The aforementioned pre-stretch substrate was unwound from the roll, and supplied to a tenter stretching machine including clips. Two edges on the ends in the widthwise direction of the pre-stretch substrate were gripped by the clips of the tenter stretching machine, and oblique stretching was performed in an oblique direction at a stretching ratio of 2.0 times, a stretching temperature of 130° C., and a stretching speed of 5 m/min, such that the orientation angle with respect to the widthwise direction became 15°.

After the oblique stretching, the film was conveyed by the clips of the tenter stretching machine while the width size of the film at the end of the stretching was maintained, so that the film maintained its strained state. In this state, the film was subjected to a heating treatment in an oven at 200° C. for 30 seconds to perform a crystallization promoting step of promoting the crystallization of the hydrogenated product of the ring-opening polymer of dicyclopentadiene contained in the film. Thus, a long-length λ/4 plate was obtained. As to the resulting λ/4 plate, the orientation angle formed by the slow axis with respect to the film lengthwise direction was 75°; the in-plane retardation Re was 141 nm; the NZ factor was 1.15; the thickness was 30 μm; the photoelastic coefficient at 23° C. was $4 \times 10^{-12}$ $Pa^{-1}$; the birefringence value Δn was 0.0047; the crystallization degree was 20%; the thermal size change ratio at 150° C. was 0.3%; and the water absorption rate was 0.009%. This λ/4 plate was wound up to obtain a roll of the λ/4 plate.

Production Example 7

The pellets of the thermoplastic resin were changed to pellets of a thermoplastic resin formed of an amorphous norbornene-based polymer (ZEON Corporation, glass transition temperature Tg=126° C.). In addition, the stretching conditions in the step of obtaining the λ/4 plate by stretching the pre-stretch substrate were changed as shown in Table 1. A λ/4 plate was produced in the same manner as that in Production Example 1 except for the above-described matters. As to the resulting λ/4 plate, the orientation angle formed by the slow axis with respect to the film lengthwise direction was 75°; the in-plane retardation Re was 140 nm; the NZ factor was 1.23; and the thickness was 34 μm.

Production Example 8

The thermoplastic resin (J2) containing no ultraviolet absorber was used instead of the thermoplastic resin (J1) containing an ultraviolet absorber, and the layer structure of the pre-stretch substrate was changed to a single layer structure having only a layer formed of the thermoplastic resin (J2). In addition, the stretching conditions in the first stretching step of obtaining the intermediate film by stretching the pre-stretch substrate and the stretching conditions in the second stretching step of obtaining the λ/2 plate by stretching the intermediate film were changed as shown in Table 1. A λ/2 plate having the single layer structure formed of the layer of the thermoplastic resin (J2) was produced in the same manner as that in Production Example 2 except for the above-described matters. As to the resulting λ/2 plate, the orientation angle formed by the slow axis with respect to the film lengthwise direction was 15°; the in-plane retardation Re was 245 nm; the NZ factor was 1.5; and the thickness was 35 μm.

Production Example 9

The long-length pre-stretch substrate produced in Production Example 2 was prepared. A long-length λ/2 plate was obtained by performing free uniaxial stretching of the pre-stretch substrate in the film lengthwise direction while the pre-stretch substrate was continuously conveyed in the lengthwise direction. The stretching ratio and the stretching temperature in the free uniaxial stretching were as shown in Table 1. The resulting λ/2 plate had a multilayer structure including three layers: the first outer layer (thickness: 4 μm) formed of the thermoplastic resin (J2)/the intermediate layer (thickness: 14 μm) formed of the thermoplastic resin (J1)/the second outer layer (thickness: 4 μm) formed of the thermoplastic resin (J2). As to this λ/2 plate, the slow axis was parallel to the film lengthwise direction; the in-plane retardation Re was 245 nm; the NZ factor was 1.0; and the thickness was 35 μm. The resulting λ/2 plate was wound up to obtain a roll of the λ/2 plate.

Production Example 10

The stretching conditions in the first stretching step of obtaining the intermediate film by stretching the pre-stretch substrate and the stretching conditions in the second stretching step of obtaining the λ/2 plate by stretching the intermediate film were changed as shown in Table 1. A λ/2 plate having a multilayer structure including three layers: the first outer layer (thickness: 5 μm) formed of the thermoplastic resin (J2)/the intermediate layer (thickness: 10 μm) formed of the thermoplastic resin (J1)/the second outer layer (thickness: 5 μm) formed of the thermoplastic resin (J2) was produced in the same manner as that in Production Example 2 except for the above-described matters. As to the resulting λ/2 plate, the orientation angle formed by the slow axis with respect to the film lengthwise direction was 15°; the in-plane retardation Re was 245 nm; the NZ factor was 3.1; and the thickness was 20 μm.

[Summary of Production Examples]

The production conditions in Production Examples 1 to 10 and the optical properties of the produced λ/4 plate and λ/2 plate are shown in the following Table 1. In the following Tables, meanings of the abbreviations are as follows.

Amorphous COP: a resin containing an amorphous alicyclic structure-containing polymer Crystallizable COP: a resin containing a crystallizable alicyclic structure-containing polymer COP multilayer: a multilayer structure film including the first outer layer, the intermediate layer, and the second outer layer, the film being formed of a resin containing an amorphous alicyclic structure-containing polymer COP single-layer: a single-layer structure film which is formed of a resin containing an amorphous alicyclic structure-containing polymer Tg: a glass transition temperature of an amorphous polymer Tm: a melting point of a crystallizable polymer Oblique: stretching in a film oblique direction Length: stretching in a film lengthwise direction Re: in-plane retardation

TABLE 1

[Production conditions and optical properties of λ/4 plate and λ/2 plate]

| | Production Example No. | | | | | | | | | |
|---|---|---|---|---|---|---|---|---|---|---|
| | 1 | 2 | 3 | 4 | 5 | 6 | 7 | 8 | 9 | 10 |
| Resin | Amorphous COP | COP multilayer | COP multilayer | COP multilayer | COP multilayer | Crystallizable COP | Amorphous COP | COP single-layer | COP multilayer | COP multilayer |
| Tg (° C.) | 163 | 126 | 126 | 126 | 126 | — | 126 | 126 | 126 | 126 |
| Tm (° C.) | — | — | — | — | — | 262 | — | — | — | — |
| First stretch | | | | | | | | | | |
| Stretch direction | Oblique | Oblique | Oblique | Oblique | Oblique | Oblique | Oblique | Oblique | Length | Oblique |
| Stretch ratio (times) | 4.0 | 1.67 | 2.0 | 2.5 | 3.0 | 2.0 | 4.3 | 1.65 | 2.0 | 3.0 |
| Stretch temperature (° C.) | 180 | 140 | 136 | 130 | 131 | 130 | 142 | 140 | 135 | 131 |
| Re (nm) | 125 | 220 | 450 | 400 | 300 | 141 | 140 | 230 | 245 | 305 |
| Orientation angle (°) | 75 | 45 | 60 | 70 | 75 | 75 | 75 | 40 | 0 | 78 |
| NZ factor | 1.18 | — | — | — | — | 1.15 | 1.23 | — | 1.0 | — |
| Thickness (μm) | 35 | 42 | 35 | 28 | 24 | 30 | 34 | 51 | 35 | 25 |
| Second stretch | | | | | | | | | | |
| Stretch direction | — | Length | Length | Length | Length | — | — | Length | — | Length |
| Stretch ratio (times) | — | 1.5 | 1.2 | 1.3 | 1.4 | — | — | 1.45 | — | 1.3 |
| Stretch temperature (° C.) | — | 135 | 132 | 130 | 129 | — | — | 135 | — | 130 |
| Re (nm) | — | 245 | 245 | 245 | 245 | — | — | 245 | — | 245 |
| Orientation angle (°) | — | 15 | 15 | 15 | 15 | — | — | 15 | — | 15 |
| NZ factor | — | 1.5 | 2.0 | 2.5 | 3.0 | — | — | 1.5 | — | 3.1 |
| Thickness (μm) | — | 30 | 30 | 22 | 17 | — | — | 35 | — | 20 |

Example 1

(Production of Film Sensor Member)

To 100 parts of an acryloyl group-containing urethane acrylate oligomer having six or more functional groups ("UV-7640B" manufactured by The Nippon Synthetic Chemical Industry Co., Ltd.), 40 parts of silica particles (manufactured by CIK Nanotek Corporation, number-average particle diameter: 30 nm), and 6 parts of a photopolymerization initiator ("IRGACURE 184" manufactured by Ciba Specialty Chemicals Corporation) were added. The mixture was stirred with a stirrer at 2000 rpm for 5 minutes to obtain a composition for forming a hard coat layer.

The λ/4 plate was unwound from the roll of the λ/4 plate produced in Production Example 1, and the masking film was peeled off. One surface of this λ/4 plate was coated with the composition for forming the hard coat layer. The coat was irradiated with ultraviolet light so that it was cured. Thus, a hard coat layer having a thickness of 6 μm was formed. The pencil hardness of the surface of this hard coat layer was measured, and the result was "B".

On the surface of this hard coat layer, a layer of ITO was formed as the transparent electroconductive layer by a sputtering method. The sputtering was performed over 1 hour by disposing an ITO sintered body target to a cathode while the film temperature was maintained at 150° C. under an environment at a vacuum degree of $5\times10^{-1}$ Pa in which a mixed gas of 94% argon gas and 6% oxygen gas was introduced. The surface resistance value of the formed transparent electroconductive layer was 105Ω/square.

One surface of the λ/2 plate produced in Production Example 2 was subjected to a corona treatment. The surface of the λ/4 plate opposite to the transparent electroconductive layer and the surface of the λ/2 plate having been subjected to a corona treatment were bonded via a UV curable adhesive ("LE-3000 series" manufactured by Hitachi Chemical Co., Ltd.). The bonding was performed with the lengthwise direction of the λ/4 plate and the lengthwise direction of the λ/2 plate aligned in parallel, such that the intersection angle between the slow axis of the λ/4 plate and the slow axis of the λ/2 plate became 60°. After that, the adhesive was irradiated with ultraviolet light from the transparent electroconductive layer side for curing the adhesive, thereby to obtain a film sensor member including the transparent electroconductive layer, the hard coat layer, the λ/4 plate, the adhesive layer, and the λ/2 plate, in this order.

The resulting film sensor member was evaluated for the curl amount, color change, and light transmittance at a wavelength of 380 nm by the aforementioned methods.

(Production of Circularly Polarizing Plate)

The surface of the film sensor member on the λ/2 plate side was subjected to a corona treatment. The surface of the film sensor member having been subjected to a corona treatment and one surface of a polarizing film ("HLC2-5618S" manufactured by Sanritz Corporation, thickness: 180 μm, having a polarized light absorption axis parallel to a lengthwise direction and a polarized light transmission axis parallel to a widthwise direction) as the linear polarizer were bonded via a UV curable adhesive ("LE-3000 series" manufactured by Hitachi Chemical Co., Ltd.). The bonding was performed such that the intersection angle between the slow axis of the λ/2 plate of the film sensor member and the polarized light absorption axis of the polarizing film became 15°. After that, the adhesive was irradiated with ultraviolet light from the polarizing film side for curing the adhesive, thereby to obtain a circularly polarizing plate including the transparent electroconductive layer, the hard coat layer, the λ/4 plate, the adhesive layer, the λ/2 plate, the adhesive layer, and the linear polarizer in this order.

The resulting circularly polarizing plate was evaluated for the light resistance and the adhesiveness of the transparent electroconductive layer by the aforementioned methods.

(Production of Image Display Device)

A commercially available liquid crystal display device ("iPad" (registered trademark) manufactured by Apple Inc.) including a light source, a light source-side linear polarizing plate, a liquid crystal cell, and a visual recognition-side linear polarizing plate in this order was prepared. The display surface portion of this liquid crystal display device was disassembled, and the visual recognition-side linear polarizing plate of the liquid crystal display device was peeled off. Then, the aforementioned circularly polarizing plate was mounted instead, thereby to obtain an image display device including the transparent electroconductive layer, the hard coat layer, the λ/4 plate, the adhesive layer, the λ/2 plate, the adhesive layer, the linear polarizer, and the liquid crystal cell as the image display element, in this order from the visual recognition side.

The resulting image display device was evaluated for the fluctuation in color tone and brightness by the aforementioned method.

Example 2

The λ/2 plate produced in Production Example 3 was used instead of the λ/2 plate produced in Production Example 2. A film sensor member, a circularly polarizing plate, and an image display device were produced and evaluated in the same manner as those in Example 1 except for the aforementioned matter.

Example 3

The λ/2 plate produced in Production Example 4 was used instead of the λ/2 plate produced in Production Example 2. A film sensor member, a circularly polarizing plate, and an image display device were produced and evaluated in the same manner as those in Example 1 except for the aforementioned matter.

Example 4

The λ/2 plate produced in Production Example 5 was used instead of the λ/2 plate produced in Production Example 2. Furthermore, formation of the hard coat layer on the surface of the λ/4 plate was not performed. A film sensor member, a circularly polarizing plate, and an image display device were produced and evaluated in the same manner as those in Example 1 except for the aforementioned matters.

Example 5

The λ/4 plate produced in Production Example 6 was used instead of the λ/4 plate produced in Production Example 1. The λ/2 plate produced in Production Example 3 was used instead of the λ/2 plate produced in Production Example 2. A film sensor member, a circularly polarizing plate, and an image display device were produced and evaluated in the same manner as those in Example 1 except for the aforementioned matters.

Comparative Example 1

The λ/4 plate produced in Production Example 7 was used instead of the λ/4 plate produced in Production Example 1. The λ/2 plate produced in Production Example 3 was used instead of the λ/2 plate produced in Production Example 2. A film sensor member, a circularly polarizing plate, and an image display device were produced and evaluated in the same manner as those in Example 1 except for the aforementioned matters.

Comparative Example 2

The λ/2 plate produced in Production Example 8 was used instead of the λ/2 plate produced in Production Example 2. A film sensor member, a circularly polarizing plate, and an image display device were produced and evaluated in the same manner as those in Example 1 except for the aforementioned matter.

Comparative Example 3

The λ/2 plate produced in Production Example 9 was used instead of the λ/2 plate produced in Production Example 2. Further, the bonding of the λ/2 plate and the λ/4 plate was performed, not by the bonging the long-length λ/2 plate and the long-length λ/4 plate, but by the bonding a film piece in a sheet piece shape cut out from the long-length λ/2 plate and a film piece having a sheet piece shape cut out from the long-length λ/4 plate. A film sensor member, a circularly polarizing plate, and an image display device were produced and evaluated in the same manner as those in Example 1 except for the aforementioned matters.

Comparative Example 4

The λ/2 plate produced in Production Example 10 was used instead of the λ/2 plate produced in Production Example 2. A film sensor member, a circularly polarizing plate, and an image display device were produced and evaluated in the same manner as those in Example 1 except for the aforementioned matter.

[Results]

The results of the aforementioned Examples and Comparative Examples are shown in the following Table 2 to Table 4. In the following Tables, meanings of the abbreviations are as follows.

Amorphous COP: a resin containing an amorphous alicyclic structure-containing polymer Crystallizable COP: a resin containing a crystallizable alicyclic structure-containing polymer COP multilayer: a multilayer structure film including the first outer layer, the intermediate layer, and the second outer layer, the film being formed of a resin containing an amorphous alicyclic structure-containing polymer COP single-layer: a single-layer structure film which is formed of a resin containing an amorphous alicyclic structure-containing polymer Tg: a glass transition temperature of an amorphous polymer Tm: a melting point of a crystallizable polymer Oblique: stretching in a film oblique direction Length: stretching in a film lengthwise direction Re: in-plane retardation Intersection angle: an intersection angle between the slow axis of the λ/4 plate and the slow axis of the λ/2 plate UV transmittance: a light transmittance of the film sensor member at a wavelength of 380 nm

TABLE 2

[Results of Examples 1-3]

| | Ex. 1 | | Ex. 2 | | Ex. 3 | |
|---|---|---|---|---|---|---|
| | Production Example No. | | | | | |
| | Prod. Ex. 2 | Prod. Ex. 1 | Prod. Ex. 3 | Prod. Ex. 1 | Prod. Ex. 4 | Prod. Ex. 1 |
| Material | COP multilayer | Amorphous COP | COP multilayer | Amorphous COP | COP multilayer | Amorphous COP |
| Tg (° C.) | 126 | 163 | 126 | 163 | 126 | 163 |
| Tm (° C.) | — | — | — | — | — | — |
| First stretch | | | | | | |
| Stretch direction | Oblique | Oblique | Oblique | Oblique | Oblique | Oblique |
| Stretch ratio (times) | 1.67 | 4.0 | 2.0 | 4.0 | 2.5 | 4.0 |
| Stretch temperature (° C.) | 140 | 180 | 136 | 180 | 130 | 180 |
| Re (nm) | 220 | 125 | 450 | 125 | 400 | 125 |
| Orientation angle (°) | 45 | 75 | 60 | 75 | 70 | 75 |
| NZ factor | — | 1.18 | — | 1.18 | — | 1.18 |
| Thickness (μm) | 42 | 35 | 35 | 35 | 28 | 35 |
| Second stretch | | | | | | |
| Stretch direction | Length | — | Length | — | Length | — |
| Stretch ratio (times) | 1.5 | — | 1.2 | — | 1.3 | — |
| Stretch temperature (° C.) | 135 | — | 132 | — | 130 | — |
| Re (nm) | 245 | — | 245 | — | 245 | — |
| Orientation angle (°) | 15 | — | 15 | — | 15 | — |
| NZ factor | 1.5 | — | 2.0 | — | 2.5 | — |
| Thickness (μm) | 30 | — | 30 | — | 22 | — |
| Intersection angle (°) | 60 | | 60 | | 60 | |
| Hard coat layer | Yes | | Yes | | Yes | |
| Curl amount (mm) | | | | | | |
| Before test | 8 | | 7 | | 8 | |
| After moisture resistance test | 12 | | 15 | | 13 | |
| After heat resistance test | 12 | | 16 | | 12 | |
| Color change | | | | | | |
| After moisture resistance test | A | | A | | A | |
| After heat resistance test | A | | A | | A | |
| UV transmittance (%) | 0.05 | | 0.05 | | 0.05 | |
| Light resistance | Good | | Good | | Good | |
| Adhesiveness | 100/100 | | 100/100 | | 100/100 | |
| Visual evaluation | Excellent | | Excellent | | Excellent | |

TABLE 3

[Results of Examples 4-5 and Comparative Example 1]

|  | Ex. 4 | | Ex. 5 | | Comp. Ex. 1 | |
|---|---|---|---|---|---|---|
|  | Production Example No. | | | | | |
|  | Prod. Ex. 5 | Prod. Ex. 1 | Prod. Ex. 3 | Prod. Ex. 6 | Prod. Ex. 3 | Prod. Ex. 7 |
| Material | COP multilayer | Amorphous COP | COP multilayer | Crystallizable COP | COP multilayer | Amorphous COP |
| Tg (° C.) | 126 | 163 | 126 | — | 126 | 126 |
| Tm (° C.) | — | — | — | 262 | — | — |
| First stretch | | | | | | |
| Stretch direction | Oblique | Oblique | Oblique | Oblique | Oblique | Oblique |
| Stretch ratio (times) | 3.0 | 4.0 | 2.0 | 2.0 | 2.0 | 4.3 |
| Stretch temperature (° C.) | 131 | 180 | 136 | 130 | 136 | 142 |
| Re (nm) | 300 | 125 | 450 | 141 | 450 | 140 |
| Orientation angle (°) | 75 | 75 | 60 | 75 | 60 | 75 |
| NZ factor | — | 1.18 | — | 1.15 | — | 1.23 |
| Thickness (μm) | 24 | 35 | 35 | 30 | 35 | 34 |
| Second stretch | | | | | | |
| Stretch direction | Length | — | Length | — | Length | — |
| Stretch ratio (times) | 1.4 | — | 1.2 | — | 1.2 | — |
| Stretch temperature (° C.) | 129 | — | 132 | — | 132 | — |
| Re (nm) | 245 | — | 245 | — | 245 | — |
| Orientation angle (°) | 15 | — | 15 | — | 15 | — |
| NZ factor | 3.0 | — | 2.0 | — | 2.0 | — |
| Thickness (μm) | 17 | — | 30 | — | 30 | — |
| Intersection angle (°) | 60 | | 60 | | 60 | |
| Hard coat layer | No | | Yes | | Yes | |
| Curl amount (mm) | | | | | | |
| Before test | 10 | | 5 | | 24 | |
| After moisture resistance test | 16 | | 8 | | Failure | |
| After heat resistance test | 18 | | 8 | | Failure | |
| Color change | | | | | | |
| After moisture resistance test | A | | A | | B | |
| After heat resistance test | A | | A | | C | |
| UV transmittance (%) | 0.05 | | 0.05 | | 0.05 | |
| Light resistance | Good | | Good | | Good | |
| Adhesiveness | 100/100 | | 100/100 | | 80/100 | |
| Visual evaluation | Good | | Excellent | | Excellent | |

TABLE 4

[Results of Comparative Examples 2-4]

|  | Comp. Ex. 2 | | Comp. Ex. 3 | | Comp. Ex. 4 | |
|---|---|---|---|---|---|---|
|  | Production Example No. | | | | | |
|  | Prod. Ex. 8 | Prod. Ex. 1 | Prod. Ex. 9 | Prod. Ex. 1 | Prod. Ex. 10 | Prod. Ex. 1 |
| Material | COP single-layer | Amorphous COP | COP multilayer | Amorphous COP | COP multilayer | Amorphous COP |
| Tg (° C.) | 126 | 163 | 126 | 163 | 126 | 163 |
| Tm (° C.) | — | — | — | — | — | — |

TABLE 4-continued

[Results of Comparative Examples 2-4]

|  | Comp. Ex. 2 | | Comp. Ex. 3 | | Comp. Ex. 4 | |
| --- | --- | --- | --- | --- | --- | --- |
|  | Production Example No. | | | | | |
|  | Prod. Ex. 8 | Prod. Ex. 1 | Prod. Ex. 9 | Prod. Ex. 1 | Prod. Ex. 10 | Prod. Ex. 1 |
| First stretch | | | | | | |
| Stretch direction | Oblique | Oblique | Length | Oblique | Oblique | Oblique |
| Stretch ratio (times) | 1.65 | 4.0 | 2.0 | 4.0 | 3.0 | 4.0 |
| Stretch temperature (° C.) | 140 | 180 | 135 | 180 | 131 | 180 |
| Re (nm) | 230 | 125 | 245 | 125 | 305 | 125 |
| Orientation angle (°) | 40 | 75 | 0 | 75 | 78 | 75 |
| NZ factor | — | 1.18 | 1.0 | 1.18 | — | 1.18 |
| Thickness (μm) | 51 | 35 | 35 | 35 | 25 | 35 |
| Second stretch | | | | | | |
| Stretch direction | Length | — | — | — | Length | — |
| Stretch ratio (times) | 1.45 | — | — | — | 1.3 | — |
| Stretch temperature (° C.) | 135 | — | — | — | 130 | — |
| Re (nm) | 245 | — | — | — | 245 | — |
| Orientation angle (°) | 15 | — | — | — | 15 | — |
| NZ factor | 1.5 | — | — | — | 3.1 | — |
| Thickness (μm) | 35 | — | — | — | 20 | — |
| Intersection angle (°) | 60 | | 60 | | 60 | |
| Hard coat layer | Yes | | Yes | | Yes | |
| Curl amount (mm) | | | | | | |
| Before test | 13 | | 11 | | 10 | |
| After moisture resistance test | 25 | | 18 | | 16 | |
| After heat resistance test | 23 | | 26 | | 24 | |
| Color change | | | | | | |
| After moisture resistance test | A | | A | | A | |
| After heat resistance test | B | | A | | B | |
| UV transmittance (%) | 88 | | 0.05 | | 0.05 | |
| Light resistance | Failure | | Good | | Good | |
| Adhesiveness | 10/100 | | 100/100 | | 100/100 | |
| Visual evaluation | Excellent | | Failure | | Failure | |

REFERENCE SIGN LIST

100 film sensor member
110 transparent electroconductive layer
120 λ/4 plate
130 λ/2 plate
131 first outer layer
132 intermediate layer
133 second outer layer
140 hard coat layer
150 hard coat layer
160 transparent electroconductive layer
200 circularly polarizing plate
210 linear polarizer
220 adhesive layer
300 liquid crystal display device
310 light source
320 light source-side linear polarizer
330 liquid crystal cell
400 organic EL display device
410 organic EL element
420 λ/4 plate
500 organic EL display device

The invention claimed is:

1. A film sensor member for disposing on a visually recognizing side of a linear polarizer in an image display device including the linear polarizer, the member comprising a transparent electroconductive layer, a λ/4 plate, and a λ/2 plate in this order from the visually recognizing side, wherein
the λ/4 plate is formed of a first thermoplastic resin containing an amorphous polymer having a glass transition temperature of 150° C. or higher or a crystallizable polymer having a melting point of 250° C. or higher, the λ/2 plate includes, in this order, a first outer layer formed of a second thermoplastic resin, an intermediate layer formed of a third thermoplastic resin containing an ultraviolet absorber, and a second outer layer formed of a fourth thermoplastic resin, and the λ/2 plate has an NZ factor of 1.1 to 3.0.

2. The film sensor member according to claim 1, wherein the film sensor member has a long-length shape, an angle formed by a slow axis of the λ/4 plate with respect to a lengthwise direction of the film sensor member is 75°±5°, an angle formed by a slow axis of the λ/2 plate with respect to the lengthwise direction of the film sensor member is 15°±5°, an intersection angle formed between the slow axis of the λ/4 plate and the slow axis of the λ/2 plate is 55° to 65°.

3. The film sensor member according to claim 1, wherein a light transmittance of the film sensor member at a wavelength of 380 nm is 5% or less.

4. The film sensor member according to claim 1, wherein a ratio of "thickness of the intermediate layer"/"thickness of the λ/2 plate" is ⅓ to 80/82.

5. The film sensor member according to claim 1, wherein the first thermoplastic resin, the second thermoplastic resin, the third thermoplastic resin, and the fourth thermoplastic resin contain an alicyclic structure-containing polymer.

6. The film sensor member according to claim 1, comprising a hard coat layer disposed on at least one surface of the λ/4 plate.

7. The film sensor member according to claim 1, wherein the λ/4 plate and the λ/2 plate are an obliquely stretched film.

8. The film sensor member according to claim 1, wherein the λ/2 plate is a sequentially biaxially stretched film.

9. A method for producing the film sensor member according to claim 1, comprising the steps of:

forming the transparent electroconductive layer on one side of the λ/4 plate; and bonding the λ/2 plate on the other side of the λ/4 plate with a UV curable adhesive.

10. A circularly polarizing plate comprising a linear polarizer and a film sensor member, wherein the film sensor member includes a λ/2 plate, a λ/4 plate, and a transparent electroconductive layer in this order from the linear polarizer side, the λ/4 plate is formed of a first thermoplastic resin containing an amorphous polymer having a glass transition temperature of 150° C. or higher or a crystallizable polymer having a melting point of 250° C. or higher, the λ/2 plate includes, in this order, a first outer layer formed of a second thermoplastic resin, an intermediate layer formed of a third thermoplastic resin containing an ultraviolet absorber, and a second outer layer formed of a fourth thermoplastic resin, and the λ/2 plate has an NZ factor of 1.1 to 3.0.

11. A method for producing the circularly polarizing plate according to claim 10, comprising the steps of:

bonding the linear polarizer and the film sensor member with a UV curable adhesive; and irradiating the UV curable adhesive with ultraviolet light through the linear polarizer.

12. An image display device comprising an image display element, and the circularly polarizing plate according to claim 10 disposed on a visually recognizing side of the image display element.

13. The image display device according to claim 12, wherein the image display element is a liquid crystal cell or an organic electroluminescent element.

* * * * *